US006731007B1

(12) United States Patent
Saito et al.

(10) Patent No.: US 6,731,007 B1
(45) Date of Patent: May 4, 2004

(54) SEMICONDUCTOR INTEGRATED CIRCUIT DEVICE WITH VERTICALLY STACKED CONDUCTOR INTERCONNECTIONS

(75) Inventors: Tatsuyuki Saito, Ome (JP); Junji Noguchi, Ome (JP); Hizuru Yamaguchi, Akishima (JP); Nobuo Owada, Ome (JP)

(73) Assignee: Hitachi, Ltd., Tokyo (JP)

( * ) Notice: Subject to any disclaimer, the term of this patent is extended or adjusted under 35 U.S.C. 154(b) by 34 days.

(21) Appl. No.: 09/613,138

(22) Filed: Jul. 10, 2000

Related U.S. Application Data

(63) Continuation of application No. 09/139,410, filed on Aug. 25, 1998, now abandoned.

(30) Foreign Application Priority Data

Aug. 29, 1997 (JP) .............................................. 9-234236
Jun. 29, 1998 (JP) ........................................... 10-182813

(51) Int. Cl.[7] .......................... H01L 23/48; H01L 23/52; H01L 29/40
(52) U.S. Cl. ....................................... 257/762; 257/763
(58) Field of Search ................................ 257/762, 763, 257/765, 784

(56) References Cited

U.S. PATENT DOCUMENTS

| 4,107,726 A | | 8/1978 | Schilling | 257/763 |
|---|---|---|---|---|
| 4,907,066 A | * | 3/1990 | Thomas et al. | 257/741 |
| 4,984,061 A | * | 1/1991 | Matsumoto | 257/776 |
| 5,394,013 A | * | 2/1995 | Oku et al. | 257/786 |
| 5,463,255 A | * | 10/1995 | Isono | 257/773 |
| 5,565,707 A | * | 10/1996 | Colgan et al. | 257/762 |
| 5,659,201 A | * | 8/1997 | Wollesen | 257/758 |
| 5,691,572 A | | 11/1997 | Chung | 257/751 |
| 5,739,579 A | * | 4/1998 | Chiang et al. | 257/635 |
| 5,786,637 A | | 7/1998 | Tabara | 257/758 |
| 5,856,707 A | | 1/1999 | Sardella | 257/758 |
| 6,181,012 B1 | * | 1/2001 | Edelstein et al. | 257/762 |
| 6,188,135 B1 | * | 2/2001 | Chan et al. | 257/751 |
| 6,265,779 B1 | * | 7/2001 | Grill et al. | 257/759 |
| 6,291,885 B1 | * | 9/2001 | Cabral, Jr. et al. | 257/751 |

FOREIGN PATENT DOCUMENTS

| JP | A-8-78410 | 3/1996 |
|---|---|---|
| JP | A-8-148560 | 6/1996 |

OTHER PUBLICATIONS

K. Maeda, "Semiconductor Manufacturing Equipment Corresponding to the Introduction of New Processes and Materials," Electron Materials, Mar. 1996, pp. 22–27.
Bai et al., "Copper Interconnection Deposition Techniques and Integration," 1996 Symposium on VLSI Technology Digest of Technical Papers, pp. 48–49.
Licata et al., "Interconnect Fabrication Processes and the Development of Low–Cost Wiring for CMOS Products," IBM J. Res. Develop, vol. 39, No. 4, Jul. 1995, pp. 419–435.

* cited by examiner

Primary Examiner—Phat X. Cao
(74) Attorney, Agent, or Firm—Antonelli, Terry, Stout & Kraus, LLP

(57) ABSTRACT

In a semiconductor integrated circuit device, upon connection of an interconnection made of aluminum or aluminum alloy and another interconnection made of Cu or Cu alloy, a barrier conductor film or plug is disposed at the joint portion between these interconnections. Among the interconnection layers, the uppermost one is made of a wiring material such as aluminum or aluminum alloy, while the lower one is made of Cu or Cu alloy. The lowest interconnection is made of a conductive material other than Cu or Cu alloy. For example, the conductive material which permits minute processing and has both low resistance and high EM resistance such as tungsten is employed.

50 Claims, 40 Drawing Sheets

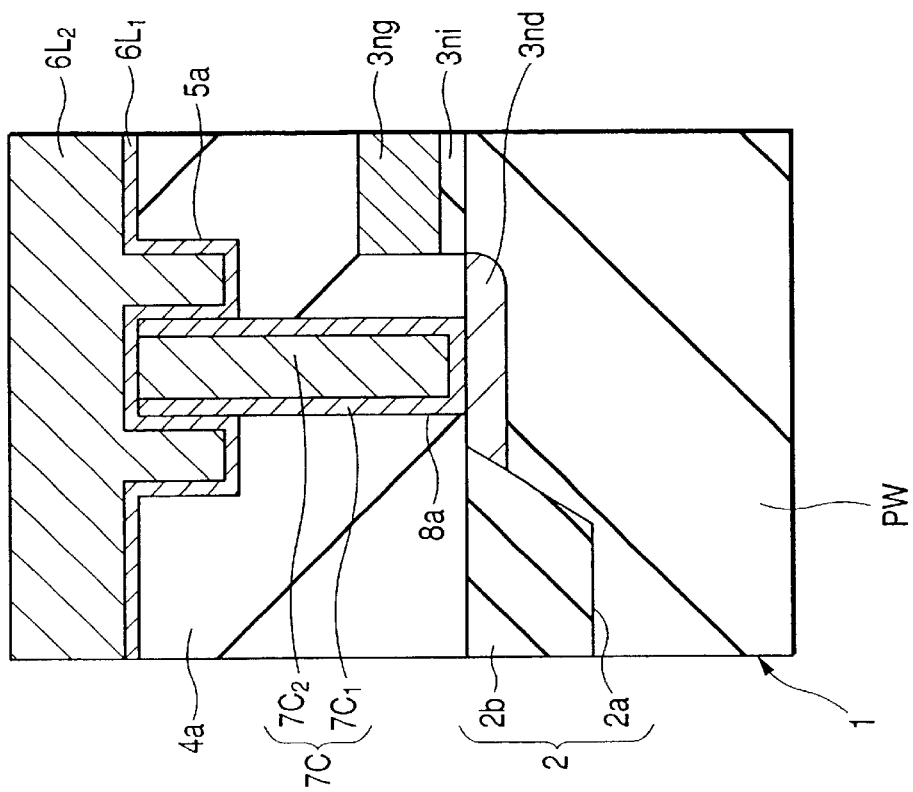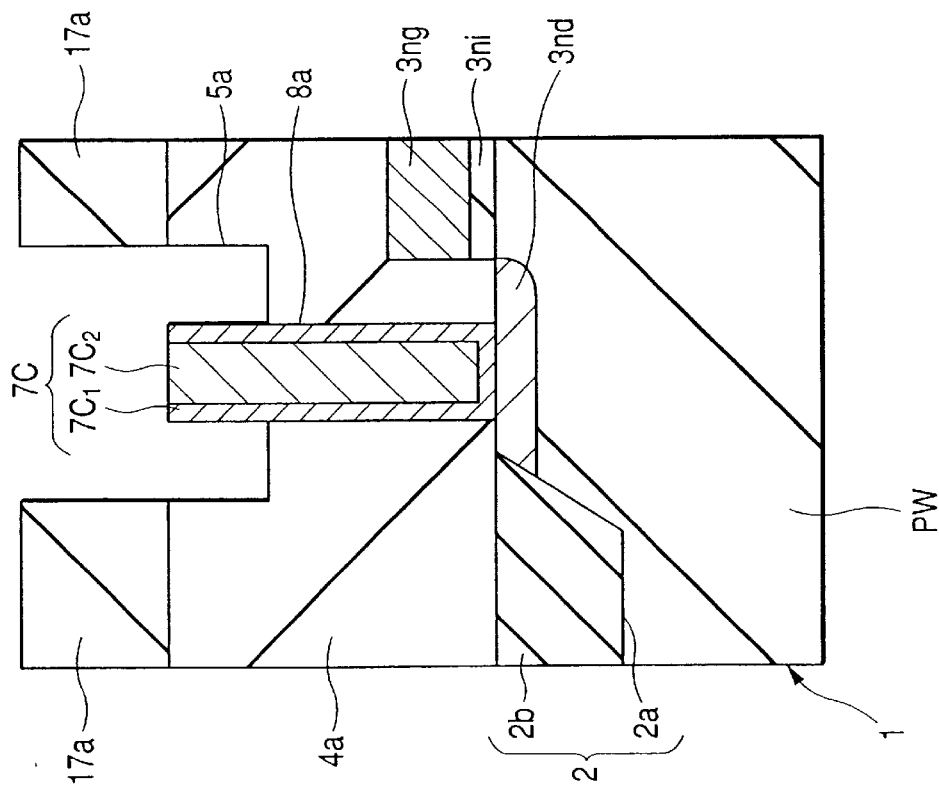

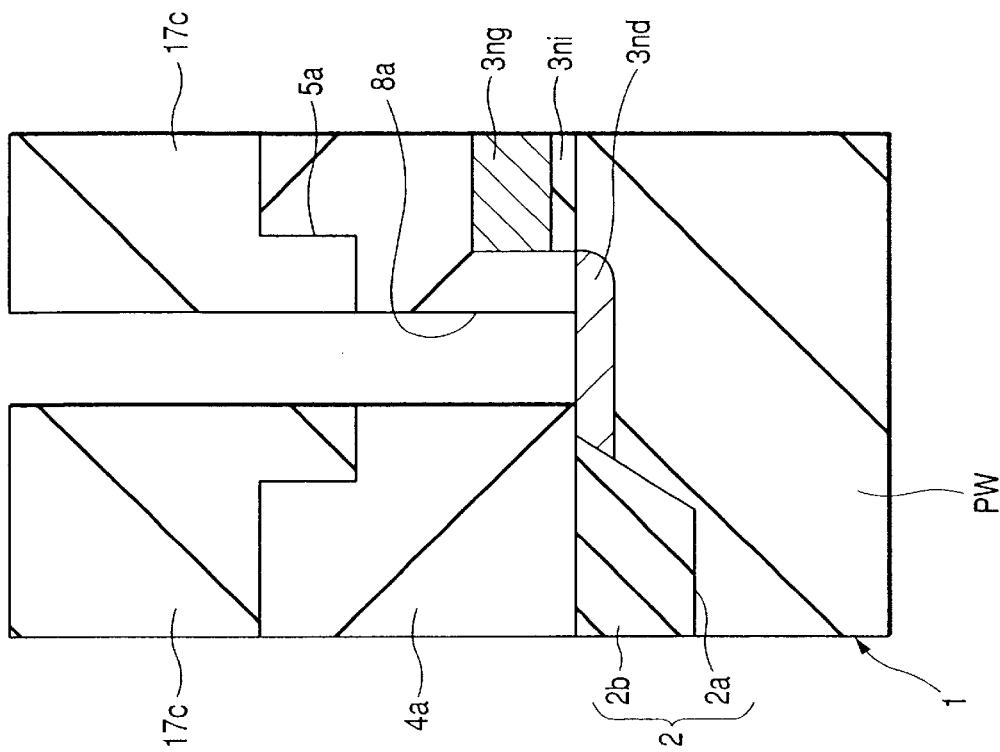
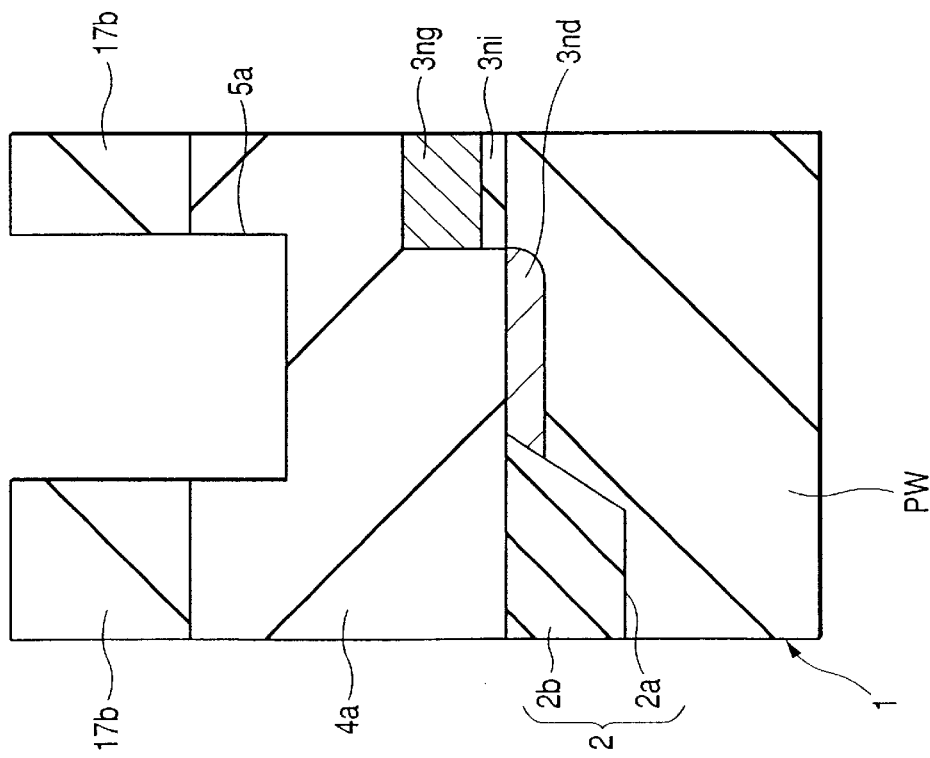

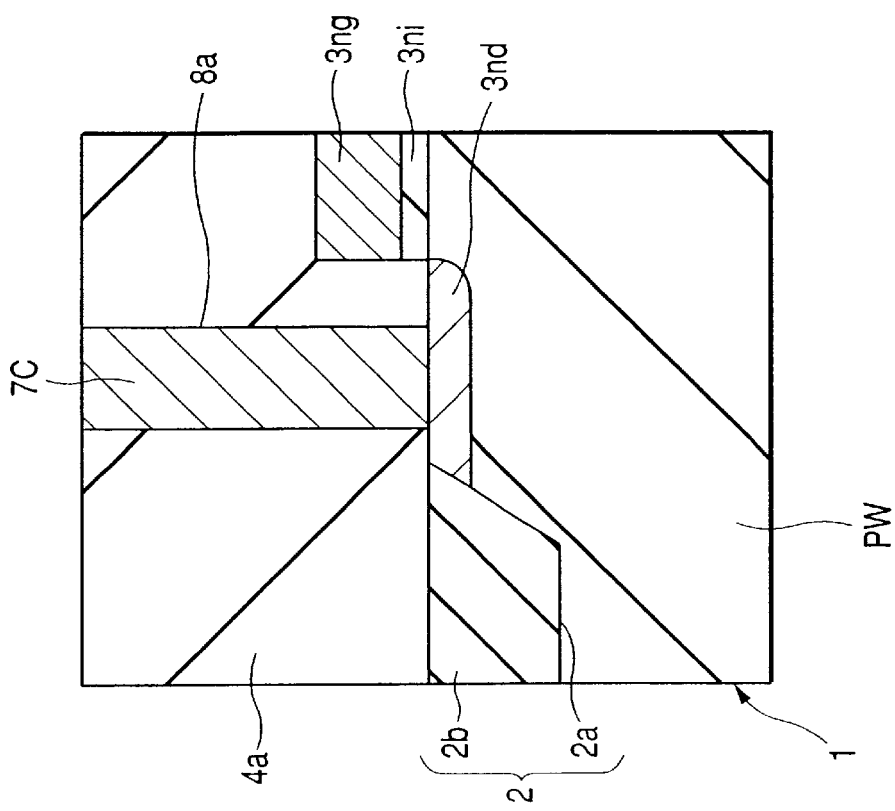
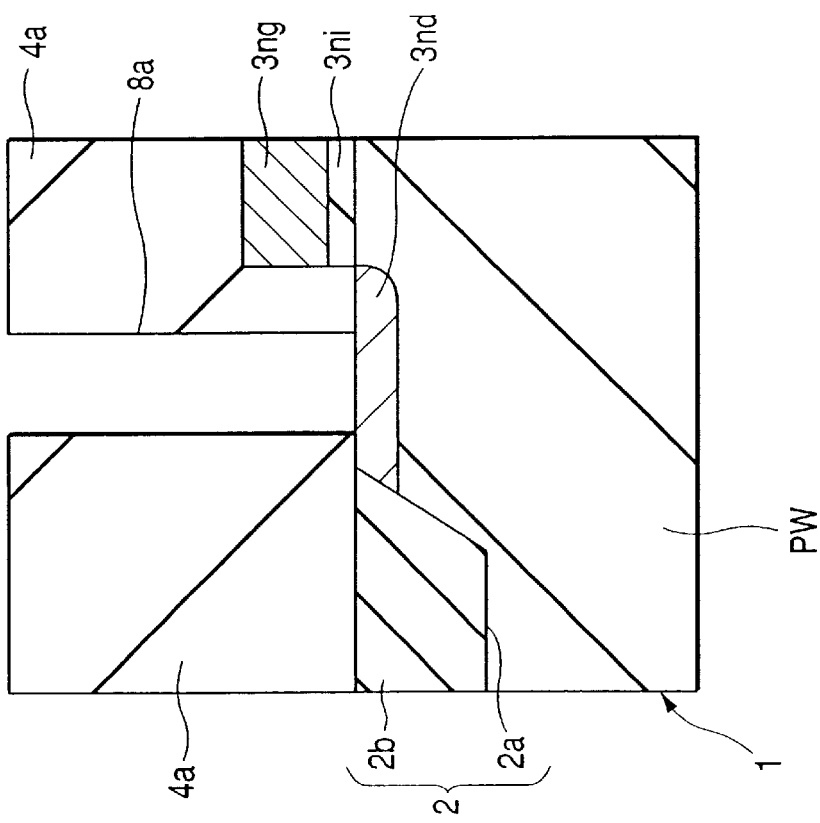

SEMICONDUCTOR INTEGRATED CIRCUIT DEVICE WITH VERTICALLY STACKED CONDUCTOR INTERCONNECTIONS

This is a continuation of U.S. application Ser. No. 09/139,410 filed Aug. 25, 1998, now abandoned the entire disclosure of which is incorporated herein by reference.

BACKGROUND OF THE INVENTION

This invention relates to a semiconductor integrated circuit device and a technique for fabrication thereof, particularly to a technique which is effective when applied to an interconnection-forming technique for a semiconductor circuit As an interconnection forming process for a semiconductor integrated circuit, there is a process, for example, called a Damascene process. In this process, a buried interconnection is formed in an interconnection-forming groove by making an interconnection-forming groove in an insulating film, depositing an interconnection-forming conductor film all over the surface of the semiconductor substrate and then removing the conductor film at portions other than the groove by a chemical mechanical polishing method (CMP). This process is under investigation as a process for forming a buried interconnection composed of a copper base (copper or copper alloy) conductor material, on which it has been difficult to perform minute etching.

There also exists a Dual-Damascene process, which is an application of the above-described damascene process, in which a buried interconnection is formed in an interconnection-forming groove and a plug is formed in a connecting hole by making, in an insulating film, an interconnection-forming groove and a hole for connecting with a lower interconnection, depositing an interconnection-forming conductor film all over the surface of a semiconductor substrate and then removing the conductor film at portions other than the grooves by CMP. Particularly, in a semiconductor integrated circuit device having a multi-layered structure, the above process makes it possible to reduce the number of steps and, therefore, to decrease the interconnection cost.

The above-mentioned interconnection forming technique is described, for example, in Japanese Patent Application Laid-Open No. HEI 8-78410, "1996 Symp. VLSI Tech. Digest pp.48–49", "Electron materials, March issue, 22–27 (1996)", Japanese Patent Application Laid-Open No. HEI 8-148560 or "IBM. J. Res. Develop. Vol. 39(4), 419–435 (July, 1995)".

SUMMARY OF THE INVENTION

The present-inventors have found that the above-described technique for the formation of a buried interconnection has the following inherent problem.

More specifically, the problem is that no total image including the structure and fabrication has yet been established completely in the case where the technique for forming a buried interconnection is applied to a semiconductor integrated circuit device Particularly, in the dual damascene method, an interconnection-forming groove and connecting hole are buried with the same conductor film at the same time. Owing to the miniaturization of the interconnection or connecting hole, however, it becomes difficult to bury the connecting hole, which is more minute than the interconnection-forming groove, simultaneously with the interconnection-forming groove, while maintaining good electrical properties sufficiently. When copper is employed as a wiring material, it is difficult to bury copper in the connecting hole by the sputtering method. The plating method, on the other hand, has a higher burying capacity, but the crystal grains immediately after the film formation of copper are small, and so sufficient electrical properties are sometimes not available. In addition, the burying capacity of the plating method is not freely high, and the burying of a minute connecting hole having a high aspect ratio is difficult to achieve. Such a problem also appears when interconnection grooves with different aspect ratios exist in the same interconnection film to be buried.

An object of the present invention is therefore to provide, in a semiconductor integrated circuit device having a buried interconnection structure, a technique for favorably burying a conductor film for buried interconnection without using a highly-advanced technique.

Another object of the present invention is to provide, in a semiconductor integrated circuit device having a buried interconnection structure, a technique for promoting miniaturization of an interconnection groove and/or a connecting hole.

A further object of the present invention is to provide a technique for improving the reliability of a buried interconnection.

A still further object of the present invention is to provide a technique for introducing a copper-conductor material-buried interconnection in the whole structure of a semiconductor integrated circuit device without causing any inconvenience.

The above-described and other objects and novel features of the present invention will become apparent from the description herein and the accompanying drawings.

Among the features disclosed by the present application, typical ones will next be summarized briefly.

In one aspect of the present invention, there is provided a process for the fabrication of a semiconductor integrated circuit device having a buried interconnection over a semiconductor substrate, which comprises:

(a) making a connecting hole in an insulating film over said semiconductor substrate, (b) forming, over said insulating film, a connecting conductor film to bury said connecting hole therewith, (c) subjecting the thus-formed film to planarizing treatment after the formation of the connecting conductor film, thereby removing said conductor film at portions other than said connecting hole and forming a connecting conductor portion in said connecting hole, (d) forming an interconnection groove in an interconnection forming region of said insulating film in which said connecting conductor portion has been formed, (e) forming, on said insulating film, an interconnection conductor film to bury said interconnection groove therewith, and (f) subjecting said interconnection conductor film to planarizing treatment after the formation of the interconnection conductor film, thereby removing said interconnection conductor film at portions other than the interconnection groove and forming a buried interconnection in said interconnection groove.

In another aspect of the present invention, there is also provided a process for the fabrication of a semiconductor integrated circuit device, which further comprises the step of thermal treatment subsequent to the planarizing treatment step of said interconnection conductor film, when said interconnection conductor film is made of copper or copper alloy and it has been formed by the sputtering method In a further aspect of the present invention, there is also provided a process for the fabrication of a semiconductor integrated circuit having buried interconnection in plural interconnection layers disposed over a semiconductor substrate, wherein, upon formation of interconnection grooves of different size in the same buried interconnection layer, conductor films are buried in said interconnection grooves separately.

In a still further aspect of the present invention, there is also provided a process for the fabrication of a semiconductor integrated circuit device having a buried interconnection in an interconnection layer over a semiconductor substrate, comprising the steps of:

(a) making an interconnection groove and a connecting hole in an insulating film over said semiconductor substrate;

(b) forming, over said insulating film, a conductor film made of copper or copper alloy by the sputtering method so as to bury said interconnection groove and connecting hole with said conductor film;

(c) planarizing said conductor film made of copper or copper alloy to remove said conductor film at portions other than said interconnection groove and connecting hole, thereby burying said conductor film in said interconnection groove and connecting hole; and (d) carrying out thermal treatment subsequent to the step of planarizing the conductor film made of copper or copper alloy.

In a still further aspect of the present invention, there is also provided a semiconductor integrated circuit device having a buried interconnection in an interconnection layer over a semiconductor substrate, wherein a portion at which said buried interconnection is brought into contact with said semiconductor substrate is composed of at least one wiring material selected from the group consisting of tungsten, tungsten alloy, titanium, titanium nitride, aluminum and aluminum alloy and said buried interconnection in the interconnection layer over the portion is composed of a copper base conductor material.

In a still further aspect of the present invention, there is also provided a semiconductor integrated circuit device having a buried interconnection in at least one interconnection layer over a semiconductor substrate, wherein an uppermost interconnection is made of aluminum or aluminum alloy and a lowest interconnection is made of copper or copper alloy.

In a still further aspect of the present invention, there is also provided a semiconductor integrated circuit device having a buried interconnection in interconnection layers over a semiconductor substrate, wherein an interconnection made of aluminum or aluminum alloy is connected with another interconnection made of copper or copper alloy, and a barrier conductor film is interspersed at a joint portion thereof.

In a still further aspect of the present invention, there is also provided a semiconductor integrated circuit device having a buried interconnection in plural interconnection layers over a semiconductor substrate, wherein upon electrical connection of interconnections over and under an interconnection layer of a predetermined embedded interconnection, a connecting conductor portion, which is disposed in a connecting hole extending from said upper interconnection toward said interconnection layer of a predetermined buried interconnection, and another connecting portion, which is disposed in a connecting hole extending from said lower interconnection toward said interconnection layer of a predetermined buried interconnection, are electrically connected through a connecting conductor portion for a relay which is disposed in a connecting groove of said interconnection layer of a predetermined buried interconnection; and said connecting conductor portion for relay is formed so that at least the length in the interconnection extending direction of a predetermined embedded interconnection is longer than the length of said connecting hole in said extending direction.

BRIEF DESCRIPTION OF THE DRAWINGS

FIG. 11 is a fragmentary cross-sectional view illustrating the semiconductor integrated circuit device of FIG. 1 during its fabrication step;

FIG. 12 is a fragmentary cross-sectional view illustrating the semiconductor integrated circuit device of FIG. 1 during its fabrication step;

FIG. 19 is a fragmentary cross-sectional view illustrating a semiconductor integrated circuit device according to another embodiment of the present invention during its fabrication step;

FIG. 20 is a fragmentary cross-sectional view illustrating the semiconductor integrated circuit device during its fabrication step subsequent to the step of FIG. 19;

FIG. 29 is a fragmentary cross-sectional view illustrating a semiconductor integrated circuit device according to another embodiment of the present invention during its fabrication step;

FIG. 30 is a fragmentary cross-sectional view illustrating the semiconductor integrated circuit device during its fabrication step subsequent to the step of FIG. 29;

DESCRIPTION OF PREFERRED EMBODIMENTS

Figure 1:
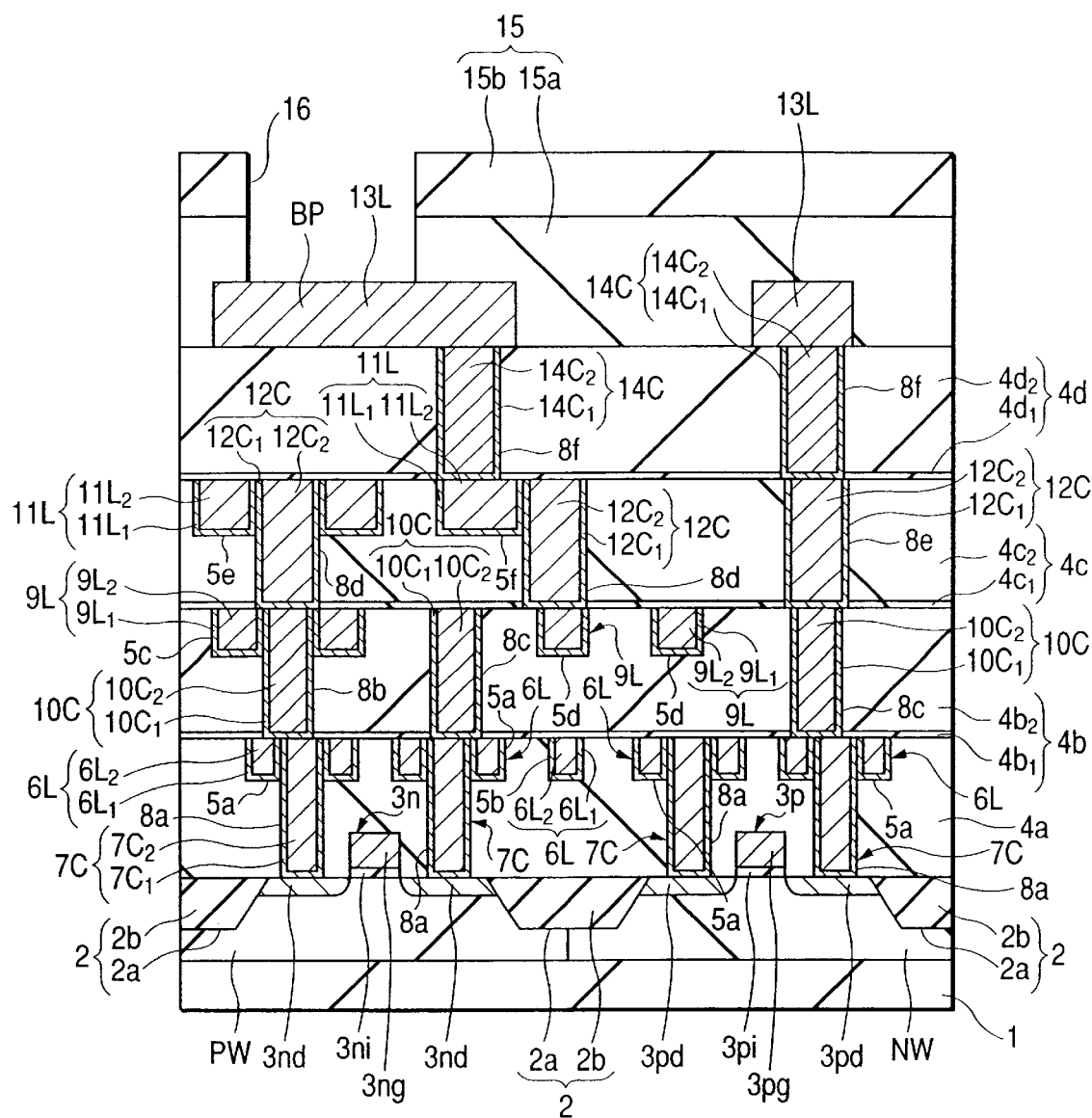
FIG. 1. is a fragmentary cross-sectional view illustrating a semiconductor integrated circuit device according to one embodiment of the present invention.

Embodiments of the present invention will be described specifically hereinafter with reference to the accompanying drawings. Incidentally, in all of the drawings for illustrating the various embodiments, like members will be identified by like reference numerals and overlapping descriptions will be omitted.

(FIRST EMBODIMENT)

Figure 2:
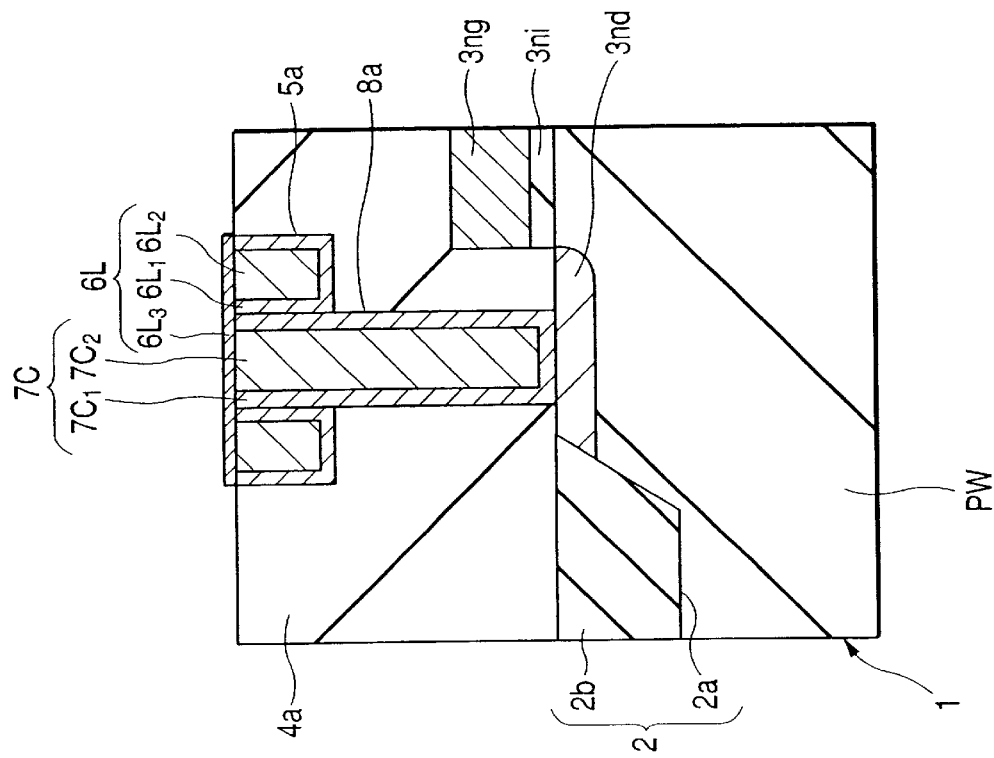
FIG. 2 is a fragmentary cross-sectional view illustrating a first-layer interconnection of the semiconductor integrated circuit device of FIG. 1.
Figure 3:
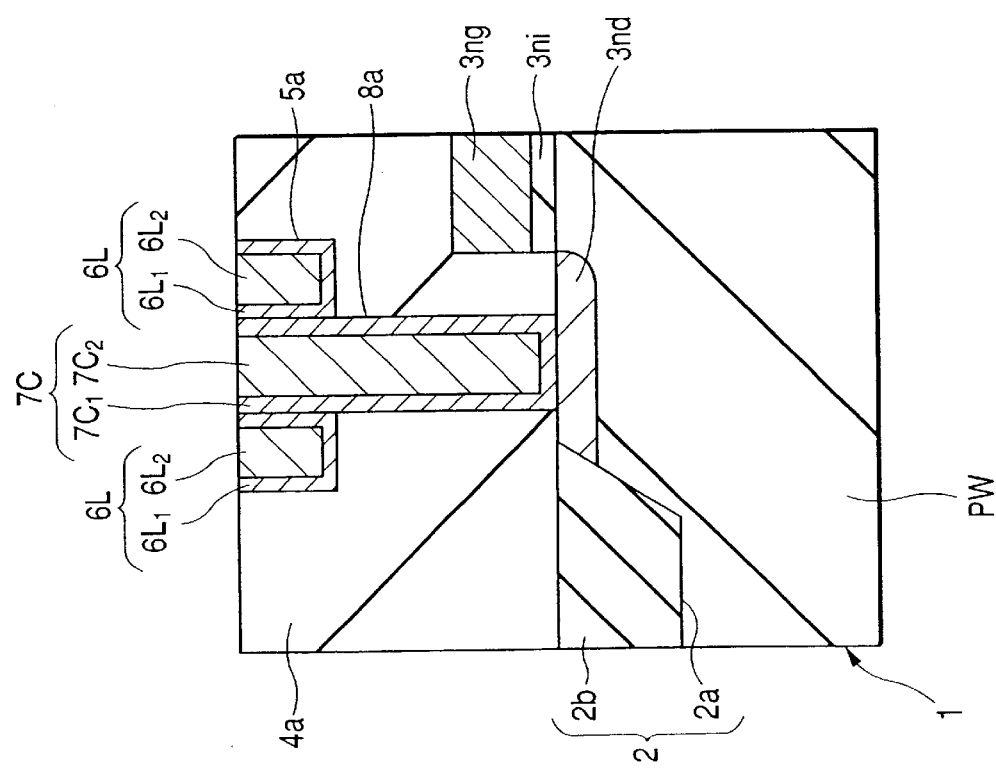
FIG. 3 is a cross-sectional view illustrating an example of a modification of the inter-connection structure of FIG. 2.
Figure 4:
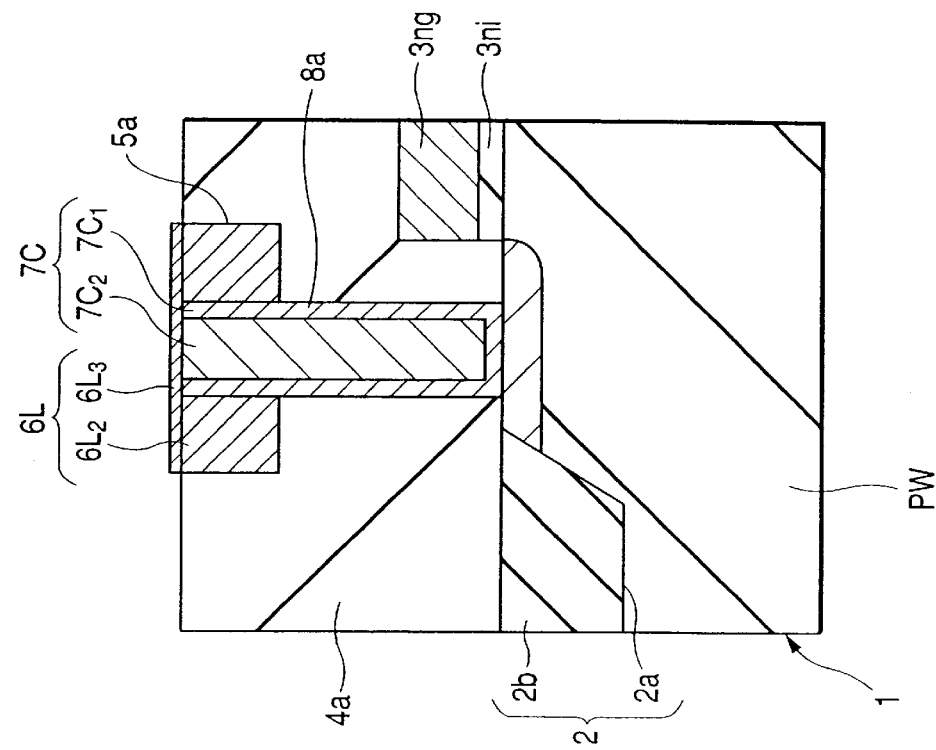
FIG. 4 is a cross-sectional view illustrating an example of a modification of the inter-connection structure of FIG. 2.
Figure 5:
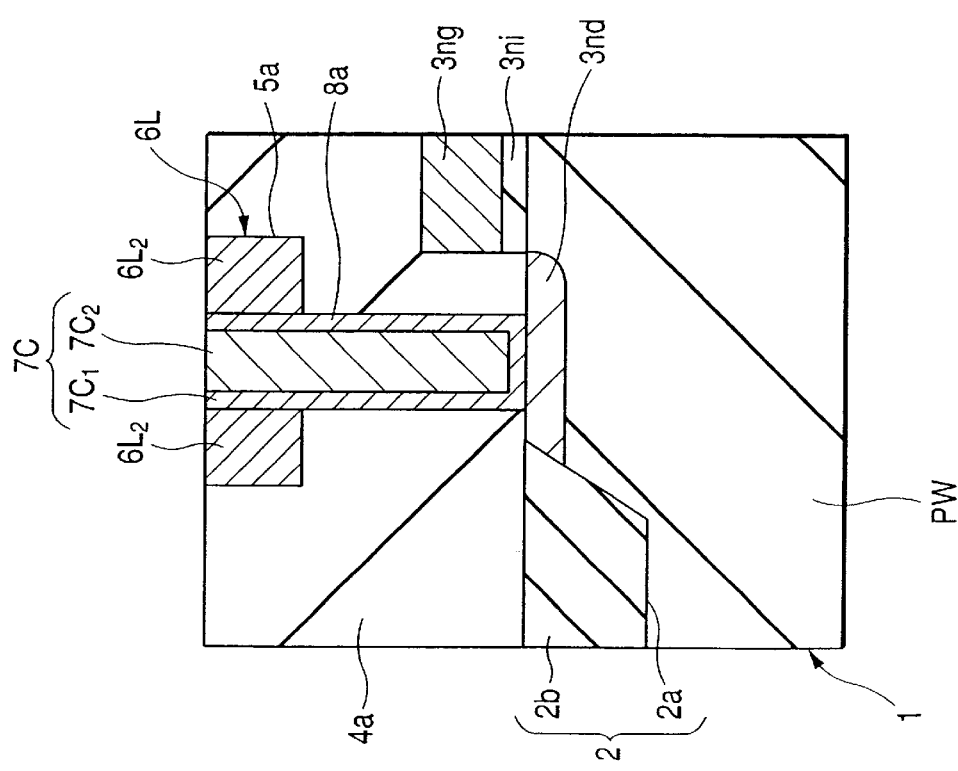
FIG. 5 is a cross-sectional view illustrating an example of a modification of the inter-connection structure of FIG. 2.
Figure 6:
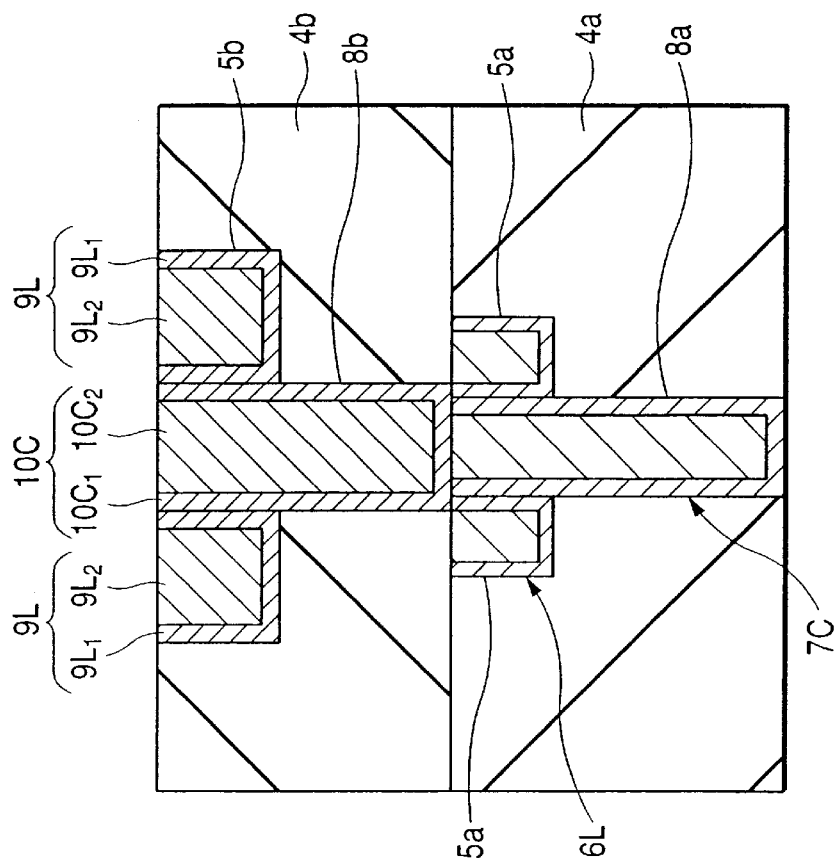
FIG. 6 is a fragmentary cross-sectional view illustrating the second-layer interconnection of the semiconductor integrated circuit device of FIG. 1.
Figure 7:
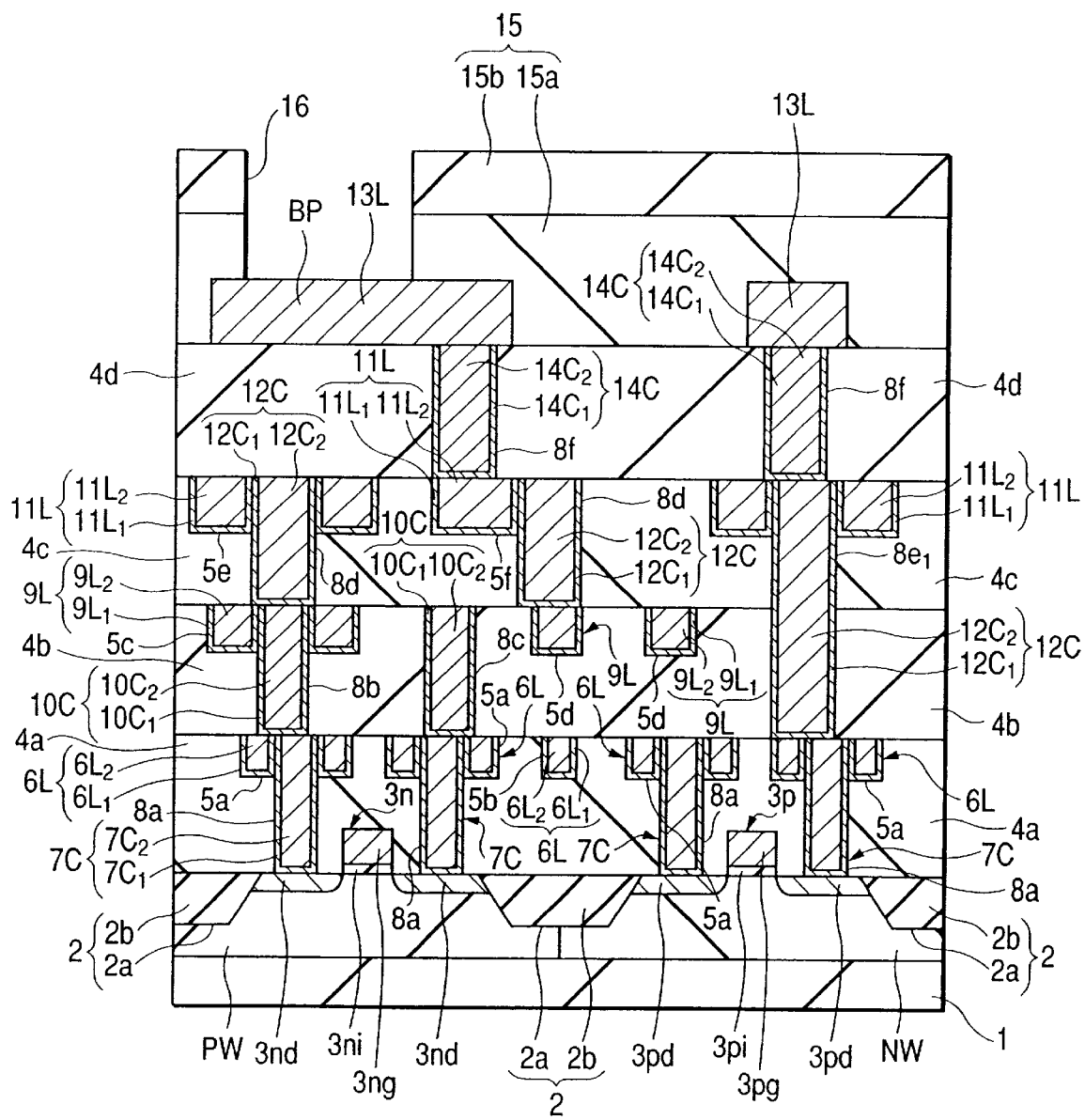
FIG. 7 is a fragmentary cross-sectional view illustrating an example of a modification of the connection between interconnection layers of the semiconductor integrated circuit device of FIG. 1.

FIG. 1 is a fragmentary cross-sectional view of the semiconductor integrated circuit according to the first embodiment of the present invention; FIG. 2 is a fragmentary cross-sectional view illustrating the first-layer interconnection of the semiconductor integrated circuit device of FIG. 1; FIGS. 3 through 5 are cross-sectional views illustrating a modification of the interconnection structure of FIG. 2; FIG. 6 is a fragmentary cross-sectional view illustrating the second-layer interconnection of the semiconductor integrated circuit device of FIG. 1; FIG. 7 is a fragmentary cross-sectional view illustrating a modification of the connection between interconnection layers of the semiconductor integrated circuit device of FIG. 1; FIGS. 8 through 12 are fragmentary cross-sectional views of the semiconductor integrated circuit device of FIG. 1 during its fabrication process; and FIGS. 13 through 18 are fragmentary, partially-cutaway, perspective view of the semiconductor integrated circuit device of FIG. 1 during its fabrication process.

First, the structure of the semiconductor integrated circuit device according to the first embodiment will be described using FIGS. 1 to 7. On a semiconductor substrate 1 made of, for example, p-type silicon (Si) single crystals, a p well PW and n well NW are formed. The p well PW contains, for example, boron (B) as p-type impurities, while the n well NW contains, for example, phosphorus (P) or arsenic (As) as n-type impurities.

Over the semiconductor substrate 1, an element isolation region 2 is formed. This element isolation region 2 is formed with an isolating insulating film 2b made of, for example, silicon oxide buried in an isolating groove 2a made over the semiconductor substrate 1. The upper surface of the element isolation region 2 is planarized so as to coincide with the principal surface of the semiconductor substrate 1.

In the p-well PW and n-well NW regions surrounded by the element isolation regions 2, an n-channel type MOS-FET (Metal-Oxide Semiconductor Field Effect Transistor which will hereinafter be abbreviated as "nMOS", simply) 3n and a p-channel type MOS-FET (which will hereinafter be abbreviated as "pMOS", simple) 3p are formed. The nMOS 3n and pMOS 3p constitute a CMOS (Complimentary MOS) device. The integrated circuit device formed on the semiconductor substrate 1 is, however, not limited to MOS-FET or MIS-FET (Metal-Insulator-Semiconductor) devices, but various integrated circuit devices can be used instead; for example, a bipolar transistor, diode or resistor device, or a structure having such integrated circuit devices formed on the same semiconductor substrate, may be employed.

The nMOS 3n has a pair of semiconductor regions 3nd formed apart from each other in the upper part of the p well PW, a gate insulating film 3ni formed over the semiconductor substrate 1 and a gate electrode 3ng formed thereon. The channel region of the nMOS 3n is formed between the pair of semiconductor regions 3nd in the p well PW.

The semiconductor region 3nd is a region for the formation of a source-drain region of the nMOS 3n and contains n-type impurities, for example, phosphorus or As. It is also possible to form the semiconductor region 3nd as a structure having a semiconductor region of a relatively low concentration disposed on the channel region side and a semiconductor region of a relatively high concentration disposed outside the channel region.

The gate insulating film 3ni is made of, for example, silicon oxide. The gate electrode 3ng formed thereon is made of, for example, a single film of low-resistance polysilicon. The gate electrode 3ng is not, however, limited to the single film of low-resistance polysilicon, but may have a so-called polycide structure obtained by forming a silicide film such as tungsten silicide on a single film of low-resistance polysilicon or a so-called polymetal structure obtained by forming a metal film such as tungsten on the single film of low-resistance polysilicon through a barrier metal film such as titanium nitride.

The pMOS 3p, on the other hand, has a pair of semiconductor regions 3pd formed apart from each other in the upper part of the n well NW, a gate insulating film 3pi formed over the semiconductor substrate 1 and a gate electrode 3pg formed thereon. Incidentally, the channel region of the pMOS 3p is formed between the pair of semiconductor regions 3pd in the n well NW.

This semiconductor region 3pd is a region for the formation of a source-drain region of the pMOS 3p and contains, for example, p-type impurities such as boron. It is also possible to form the semiconductor region 3pd as a structure having a semiconductor region of a relatively low concentration disposed on the channel region side and a semiconductor region of a relatively high concentration disposed outside the channel region.

The gate insulating film 3pi is made, for example, of silicon oxide. The gate electrode 3pg formed thereon is made of, for example, a single film of low-resistance polysilicon. The gate electrode 3pg is not, however, limited to the single film of low-resistance polysilicon, but may have a so-called polycide structure obtained by forming a silicide film such as tungsten suicide on the single film of low-resistance polysilicon or a so-called polymetal structure obtained by forming a metal film such as tungsten on the single film of low-resistance polysilicon through a barrier metal film such as titanium nitride.

Over such a semiconductor substrate 1, an interlayer insulating film 4a, which is made of, for example, silicon oxide and has a surface planarized by, for example, the CMP method, is formed, with which the nMOS 3n and the pMOS 3p are covered. In the upper part of this interlayer insulating film 4a, inter-connection grooves 5a and 5b of different width or length are formed. The interconnection grooves 5a and 5b have the same depth which is, for example, about 0.3 to 1.0 μm, preferably about 0.5 μm. The aspect ratio of the interconnection groove 5a is about 0.1 to 1.0 and in consideration of the favorably burying of an interconnection conductor film, less than 0.7 is preferred. The aspect ration of the interconnection groove 5b, on the other hand, is about 0.5 to 2.5 and, in consideration of the burying of an interconnection conductor film, that less than 1.5 is preferred.

As illustrated in FIGS. 1 and 2, a first-layer interconnection 6L (or first level layer wiring line) is formed in a buried state in the interconnection grooves 5a and 5b. The first-layer interconnection 6L is composed of a relatively thin conductor film 6L1 at its bottom and sides and a relatively thick conductor film 6L2 surrounded by the thin conductor film 6L1.

The thin conductor film 6L1 is made of a material having a function of improving the adhesion between the first-layer interconnection 6L and the interlayer insulating film 4a and also a function of suppressing the diffusion of component atoms of the thick conductor film 6L2. Examples of the material include tungsten (W), titanium nitride (TiN), titanium (Ti), tantalum (Ta), tungsten-nitride (WN), tungsten silicide nitride (WSiN), titanium silicide nitride (TiSiN), tantalum nitride (TaN) and tantalum silicide nitride (TaSiN).

When the thin conductor flim 6L1 is made of tungsten, it becomes possible to lower the interconnection reistance compared with the case where it is made of TiN, Ti, Ta, WN, WSiN, TiSiN, TaN, TaSiN or the like. Although there is no particular limitation, the thin conductor film 6L1 is made of, for example, TiN in this first embodiment.

The thick conductor film 6L2 is a member constituting the main body of the first-layer interconnection 6L and is made of a low-resistance material such as aluminum (Al), Al alloy, tungsten, tungsten alloy, copper (Cu) or Cu alloy. Examples of the Al alloy include those obtained by adding one or more elements selected from Si, Cu, Ge and the like to a conductor film mad e of aluminum (Al). Examples of the Cu alloy include those obtained by adding one or more elements selected from magnesium (Mg), Si, Ti and the like to a conductor film made of Cu. Examples of the tungsten alloy include those obtained by adding one or more elements selected from Si, N and the like to a conductor film made of tungsten. Incidentally, those materials exemplified above will be equally applied to an Al alloy, tungsten alloy and Cu alloy, respectively, in the following description. The thick conductor film 6L2 composed of Cu or Cu alloy is able to have a largely reduced interconnection resistance compared with that composed of Al or tungsten and also permits an improvement in the electro-migration (EM) resistance of the first-layer interconnection 6L compared with that composed of Al or Al alloy. Although there is no particular limitation, the thick conductor film 6L2 is composed of, for example, Cu in this first embodiment.

The structure of the first-layer interconnection 6L is not limited to that shown in FIGS. 1 and 2, but it includes various modifications. The structures as illustrated in FIGS. 3 to 5 can also be employed. FIG. 3 illustrates a structure wherein a cap conductor film 6L3 is disposed so as to cover therewith the thin conductor film 6L1 and the thick conductor film 6L2. The cap conductor film 6L3 is made of, for example, tungsten, TiN, Ti, Ta, WN, WSIN, TiSiN, TaN or TaSiN. Particularly when the thick conductor film 6L2 is formed of Cu or Cu alloy, the above-described structure becomes more effective for suppressing the diffusion of Cu atoms, thereby making it possible to improve the reliability of the semiconductor integrated circuit device. Although there is no particular limitation, the above-described structure is suited for the case where an alloy with high specific resistance is inevitably formed by the direct contact of the wiring material on the thick conductor film 6L2 with the thick conductor film 6L2. It is also possible to dispose the cap conductor film only on the upper surface of the thick conductor film 6L2 so as to have the upper surface of the cap conductor film substantially coincide with that of the interlayer insulating film 4a.

FIG. 4 illustrates a structure wherein the first-layer interconnection 6L is formed of the thick conductor film 6L2 alone, in other words, it is formed without a thin conductor film. FIG. 5 illustrates a structure similar to that of FIG. 4 except that the cap conductor film 6L3 is disposed on the upper surface of the thick conductor film 6L2. Although there is no particular limitation, this structure is suited for the case where an alloy with a high specific resistance is inevitably formed by the direct contact of the thick conductor film 6L2 with the wiring material thereon.

The first-layer interconnection 6L in the interconnection groove 5a is electrically connected with the semiconductor region 3nd of the nMOS 3n or the semiconductor region 3pd of PMOS 3p through a connecting conductor portion 7C. Most portions of the connecting conductor portion 7C are buried in a connecting hole 8a which has been perforated in the interlayer insulating film 4a from the bottom surface of the interconnection groove 5a toward the upper surface of the semiconductor substrate 1, and the upper portion of the connecting conductor portion 7C protrudes in the first-layer interconnection 6L so as to pass through the upper and lower surfaces of the first-layer interconnection 6L. The connecting hole 8a has a diameter of, for example, about 0.2 to 1.0 μm, and preferably is about 0.4 μm. The aspect ratio of the connecting hole 8a is about 2 to 6 and is preferably less than 4 in consideration of the favorable burying of the connecting conductor portion. Incidentally, the upper surface height of the connecting conductor portion 7C is substantially equal to that of the first-layer interconnection 6L.

The connecting conductor portion 7C is composed of a relatively thin conductor film 7C1 at its bottom and sides and a relatively thick conductor film 7C2 surrounded by the thin conductor film 7C1. The thin conductor film 7C1 is made of a material having a function of improving the adhesion between the connecting conductor portion 7C and the interlayer insulating film 4a and also a function of suppressing, as a barrier, the diffusion of component atoms of the thick conductor film 7C2. Examples of the material include tungsten, TiN, Ti, Ta, WN, WSiN, TiSiN, TaN and TaSiN.

When the thin conductor film 7C1 is made of tungsten or the like, it becomes possible to reduce the interconnection resistance compared with the case where the film is made of TiN, Ti, Ta, WN, WSiN, TiSiN, TaN, TaSiN or the like. Although there is no particular limitation, the thin conductor film 7C1 is made of, for example, tungsten in this first embodiment.

The thick conductor film 7C2 is a member which constitutes the main body of the connecting conductor portion 7C and is made of a low resistance material such as Al, Al alloy, tungsten or tungsten alloy. Cu or Cu alloy is not used as the material for constituting the thick conductor film 7C2. Described specifically, in this first embodiment, even if Cu or Cu alloy is used as the material for constituting the buried conductor film 6L2 of the first-layer interconnection 6L, it is not used as the material for constituting the connecting conductor portion 7C which is in direct contact with the semiconductor substrate 1. This makes it possible to suppress a connection failure attributable to the diffusion of Cu atoms toward the semiconductor substrate 1 while reducing the interconnection resistance of the first-layer interconnection 6L.

The use of Al or Al alloy for forming the thick conductor film 7C2 makes it possible to reduce the resistance of the connecting conductor portion 7C compared with the use of tungsten or tungsten alloy. The use of tungsten or tungsten alloy for constituting the buried conductor film 7C2 makes it possible to improve the EM resistance and SM resistance of the connecting conductor portion 7C compared with the use of Al or Al alloy. Although there is no particular limitation, the thick conductor film 7C2 is made of, for example, tungsten in this first embodiment. Accordingly, in this first embodiment, different conductor films (Cu or the like for the formation of the first-layer interconnection 6L and tungsten or the like for the connecting conductor portion 7C) exist in the same plane at the height of the first-layer interconnection 6L. Incidentally, the connecting conductor portion also forms a part of the interconnection.

In the above description, the first-layer interconnections 6L in the interconnection grooves 5a and 5b are formed of the same material, but the present invention is not limited thereto. It is also possible to use, as the materials for constituting the thick conductor film 6L2 and thin conductor film 6L1 to be buried in the interconnection groove 5b, different conductor materials from the materials for constituting the thick conductor film 6L2 and thin conductor film 6L1 buried in the interconnection groove 5a, respectively. It is sometimes impossible to bury Cu or the like in the narrower interconnection groove 5b sufficiently when the simultaneous burying of the wider interconnection groove 5a and narrower interconnection groove 5b is tried. In such a case, the above-described structure, more specifically, the structure in which Cu is buried in the wider interconnection groove 5a and tungsten or the like is buried in the narrower interconnection groove 5b by the CVD method or the like is adopted. The fabrication process of such a structure will be described later.

On the interlayer insulating film 4a there is formed an interlayer insulating film 4b, which is composed of a silicon nitride film 4b1 and a silicon oxide film 4b2 formed thereon and which is thicker than the silicon nitride film 4b1. The silicon nitride film 4b1 serves as a barrier film for preventing the diffusion of Cu when the thick conductor film 6L2 or buried conductor film 7C2 is formed of a Cu base conductor material. In addition, when a connecting hole 8a, which will be described later, is formed, the silicon oxide film 4b2 is etched with this silicon nitride film 4b1 as an etching stopper and then the silicon nitride film 4b2 is removed by etching. When the thick conductor film 6L2 or buried conductor film 7C2 is composed of a conductor material other than a Cu base material, the silicon nitride film 4b1 is not necessary. In the upper part of the interlayer insulating film 4b, interconnection grooves 5c and 5d of different width are formed. These grooves 5c and 5d have the same depth and the depth is, for example, about 0.3 to 1.0 μm, and preferably is about 0.6 μm. The aspect ratio of the interconnection groove 5c is, for example, about 0.1 to 1.0 and is preferably less than 0.7 in consideration of the favorable burying of the interconnection conductor film. The aspect ratio of the interconnection groove 5d is, for example, about 0.5 to 2.5 and is preferably less than 1.5 in consideration of the favorable burying of the interconnection conductor film. The silicon oxide film 4b2 is made of, for example, a TEOS film formed by the CVD method or an SOG (Spin on Glass) film. The use of the SOG film having a low dielectric constant makes it possible to reduce the capacity between interconnections, thereby improving the operation rate of the circuit.

As illustrated in FIGS. 1 and 6, a second-layer interconnection 9L (or second level layer wiring line) is formed by being buried in each of the interconnection grooves 5c and 5d. The second-layer interconnection 9L is composed of a relatively thin conductor film 9L1 at its bottom and sides and a relatively thick conductor film 9L2 surrounded by the thin conductor film 9L1.

The thin conductor film 9L1 is made of a material having a function of improving the adhesion between the second-layer interconnection 9L and the interlayer insulating film 4b and also a function of suppressing, as a barrier, the diffusion of component atoms of the thick conductor film 9L2. Examples of the material include tungsten, TiN, Ti, Ta, WN, WSiN, TiSiN, TaN and TaSiN.

When the thin conductor film 9L1 is made of tungsten or the like, it becomes possible to reduce the interconnection resistance compared with the case where the film is made of TiN, Ti, Ta, WN, WSiN, TiSiN, TaN or TaSiN. Although there is no particular limitation, the thin conductor film 9L1 is made of, for example, TiN in this first embodiment.

The thick conductor film 9L2 is a member which constitutes the main body of the second-layer interconnection 9L and is made of, for example, a low resistance material such as Al, Al alloy, tungsten, tungsten alloy, Cu or Cu alloy. The use of Cu or Cu alloy as the material for constituting the thick conductor film 9L2 makes it possible to bring about a drastic decrease in the interconnection resistance compared with the use of Al or tungsten. In addition, the EM resistance of the second-layer interconnection 9L can be improved compared with the use of Al or Al alloy for the thick conductor film 9L2. Although there is no particular limitation, the thick conductor film 9L2 is made of, for example, Cu in this first embodiment.

The structure of the second-layer interconnection 9L is not limited to that shown in FIGS. 1 and 6, but it includes various modifications. The structures as illustrated in FIGS. 3 to 5 which were described above with regards to the first-layer interconnection 6L can also be employed. Described specifically, a structure having a cap conductor film disposed on the upper surfaces of the thick conductor film 9L2 and thin conductor film 9L1 can also be adopted. The cap conductor film is made of, for example, a low-resistance material such as tungsten or a material equipped with a barrier function such as TiN, Ti, Ta, WN, WSiN, TiSiN, TaN or TaSiN. Particularly when the thick conductor film 9L2 is formed of Cu or Cu alloy, the above-describe structure is effective for suppressing the diffusion of Cu atoms, which makes it possible to improve the reliability of the semiconductor integrated circuit device. Although there is no particular limitation, this structure is suited for the case where an alloy with high specific resistance is inevitably formed by the direct contact of the thick conductor film 9L2 with the wiring material thereon. It is also possible to dispose the cap conductor film only on the upper surface of the thick conductor film 9L2 so as to have the upper surface of the cap conductor film substantially coincide with that of the interlayer insulating film 4a.

Instead, a structure in which the second-layer interconnection 9L is formed only of the thick conductor film 9L2, that is, a structure without a thin conductor film can be adopted. Or, a structure similar to the above one except that the cap conductor film is disposed on the upper surface of the thick conductor film 9L2 can be adopted. Although there is no particular limitation, this structure is suited for the case where an alloy with a high intrinsic resistance is inevitably formed by the direct contact of the thick conductor film 9L2 with the wiring material thereon.

The second-layer interconnection 9L formed in the interconnection groove 5c is electrically connected with the first-layer interconnection 6L through the connecting conductor portion 10C. Most portions of the connecting conductor portion 10C are buried in a connecting hole 8b which has been perforated in the interlayer insulating film 4b from the bottom surface of the interconnection groove 5c toward the upper surface of the first-layer interconnection 6L, and the upper portion of the connecting conductor portion 10C protrudes in the second-layer interconnection 9L so that the connecting conductor portion 10C passes through the upper and lower surfaces of the second-layer interconnection 9L.

The connecting hole 8b has a diameter of, for example, about 0.2 to 1.2 μm, preferably about 0.4 μm. The aspect ratio of the connecting hole 8b is about 2 to 6 and is preferably less than 4 in consideration of the favorable burying of the connecting conductor portion. Incidentally, the upper surface height of the connecting conductor portion 10C is substantially equal to that of the second-layer interconnection 9L, that is, the upper surface height of the interlayer insulating film 4b.

The connecting conductor portion 10C is composed of a relatively thin conductor film 10C1 at its bottom and sides and a relatively thick conductor film 10C2 surrounded by the thin conductor film 10C1. The thin conductor film 10C1 is made of a material having the function of improving the adhesion between the connecting conductor portion 10C and the interlayer insulating film 4b and also the function of suppressing, as a barrier, the diffusion of component atoms of the thick conductor film 10C2. Examples of the material include tungsten, TiN, Ti, Ta, WN, WSiN, TiSiN, TaN and TaSiN.

When the thin conductor film 10C1 is made of tungsten or the like, it becomes possible to reduce the interconnection resistance compared with the case where the film is made of TiN, Ti, Ta, WN, WSiN, TiSiN, TaN or TaSiN. Although there is no particular limitation, the thin conductor film 10C1 is made of, for example, tungsten in this first embodiment.

The thick conductor film 10C2 is a member constituting the main body of the connecting conductor portion 10C and is composed of a low-resistance material such as Al, Al alloy, tungsten, tungsten alloy, Cu or Cu alloy. The use of Cu or Cu alloy for forming the thick conductor film 10C2 makes it possible to reduce the resistance of the connecting conductor portion 10C and to improve the EM resistance of the connecting conductor portion 10C compared with the use of Al, Al alloy, tungsten or tungsten alloy. The use of Al or Al alloy for forming the thick conductor film 10C2 makes it possible to reduce the resistance of the connecting conductor portion 10C compared with the use of tungsten or tungsten alloy is. The use of tungsten or tungsten alloy for constituting the buried conductor film 10C2 makes it possible to improve the EM resistance and SM resistance of the connecting conductor portion 10C compared with the use of Al or Al alloy. Although there is no particular limitation, the thick conductor film 10C2 is made of, for example, tungsten in this first embodiment.

In the interlayer insulating film 4b, a connecting hole 8c is perforated from the upper surface of the insulating film toward the upper surface of the first-layer interconnection 6L so as to expose a part of the first-layer interconnection 6L. A connecting conductor portion 10C is formed by being buried in the connecting hole 8c. The connecting hole 8c has a diameter of, for example, about 0.2 to 1.2 μm, and preferably is about 0.4 μm. The aspect ratio of the connecting hole 8c is about 2 to 6 and is preferably less than 4 in consideration of the favorable burying of the connecting conductor portion. This connecting conductor portion 10C has a structure similar to that of the above-described one. In FIG. 1, however, the connecting conductor portion 10C is not directly connected with the second-layer interconnection 9L. As the materials for constituting the thick conductor film 10C2 and the thin conductor film 10C1 of the connecting conductor portion 10C to be buried in the connecting hole 8c, conductor materials different from those of the thick conductor film 10C2 and thin conductor film 10C1 of the connecting conductor portion 10C buried in the connecting hole 8b may be used.

In the above description, the structure wherein the second-layer interconnections 9L in the interconnection grooves 5c and 5d are composed of the same material was referred to. It is however to be noted that the present invention is not limited to such a structure. For example, it is possible to use, as the materials for constituting the thick conductor film 9L2 and thin conductor film 9L1 to be buried in the interconnection groove 5d, conductor materials different from those for constituting the thick conductor film 9L2 and thin conductor film 9L1. buried in the interconnection groove 5c, respectively. It is sometimes impossible to bury Cu or the like in the narrower interconnection groove 5d sufficiently when simultaneous burying of the wider interconnection groove 5c and narrower interconnection groove 5d is tried. To such a case, the above-described structure, more specifically, the structure in which Cu is buried in the wider interconnection groove 5c and tungsten or the like is buried in the narrower interconnection groove 5d by the CVD method or the like is applied. The fabrication process of such a structure will be described later.

On the interlayer insulating film 4b, an interlayer insulating film 4c is formed, which is composed, similarly to the interlayer insulating film 4b, of a silicon nitride film 4c1 and a silicon oxide film 4c2 formed thereon. In the upper portion of this interlayer insulating film 4c, interconnection grooves 5e and 5f of different width are formed. These grooves 5e and 5f have the same depth and the depth is, for example, about 0.3 to 1.0 μm, and preferably is about 0.6 μm. The aspect ratio of the interconnection groove 5e is, for example, about 0.1 to 1.0 and is preferably less than 0.7 in consideration of the favorable burying of the interconnection conductor film. The aspect ratio of the interconnection groove 5f is, for example, about 0.5 to 2.5 and is preferably less than 1.5 in consideration of the favorable burying of the interconnection conductor film.

As illustrated in FIG. 1, a third-layer interconnection 11L (or third level layer wiring line) is formed by being buried in the interconnection grooves 5e and 5f. The third-layer interconnection 11L is composed of a relatively thin conductor film 11L1 at its bottom and sides and a relatively thick conductor film 11L2 surrounded by the thin conductor film 11L1.

The thin conductor film 11L1 is made of a material having a function of improving the adhesion between the third-layer-interconnection 11L and the interlayer insulating film 4c and also a function of suppressing, as a barrier, the diffusion of component atoms of the thick conductor film 11L2. Examples of the material include tungsten, TiN, Ti, Ta, WN, WSiN, TiSiN, TaN and TaSiN.

When the thin conductor film 11L1 is made of tungsten or the like, it becomes possible to reduce the interconnection resistance compared with the case where the film is made of TiN, Ti, Ta, WN, WSiN, TiSiN, TaN or TaSiN. When the thin conductor film 11L1 is formed of TiN, Ti, Ta, WN, WSIN, TiSiN, TaN, TaSiN or the like, it is possible to improve the adhesion particularly with the interlayer insulating film 4c. Although there is no particular limitation, the thin conductor film 11L1 is made of, for example, TiN in this first embodiment.

The thick conductor film 11L2 is a member which constitutes the main body of the third-layer interconnection 11L and is made of a low resistance material such as Al, Al alloy, tungsten, tungsten alloy, Cu or Cu alloy. The use of Cu or Cu alloy as the material for constituting the thick conductor film 11L2 makes it possible to bring about a drastic decrease in the interconnection resistance compared with the use of Al or tungsten. In addition, the EM resistance of the third-layer interconnection 11L can be improved compared with the use of Al or Al alloy for the thick conductor film 11L2. Although there is no particular limitation, the thick conductor film 11L2 is composed of, for example, Cu in this first embodiment.

The structure of the third-layer interconnection 11L is not limited to that shown in FIG. 1, but it includes various modifications. The structures as illustrated in FIGS. 3 to 5 which were described above in the first-layer interconnection 6L can also be employed. More specifically, the structure wherein a cap conductor film is disposed on the upper surfaces of the thick conductor film 11L2 and thin conductor film 11L1 may be adopted. The cap conductor film is made of, for example, a low-resistance material such as tungsten or a material equipped with a barrier function such as TiN, Ti, Ta, WN, WSiN, TiSiN, TaN or TaSiN. Particularly when the thick conductor film 11L2 is formed of Cu or Cu alloy, this structure is effective for suppressing the diffusion of Cu atoms, which makes it possible to improve the reliability of the semiconductor integrated circuit device. Although there is no particular limitation, this structure is suited for the case where an alloy with high specific resistance is inevitably formed by the direct contact of the thick conductor film 11L2 with the wiring material thereon. It is also possible to dispose the cap conductor film only on the upper portion of the thick conductor film 11L2 so as to have the upper surface of the cap conductor film substantially coincide with that of the interlayer insulating film 4c.

Instead, a structure in which the third-layer interconnection 11L is formed only of the thick conductor film 11L2, that is, a structure without a thin conductor film can be adopted. Or, a structure similar to the above one except that the cap conductor film is disposed on the upper surface of the interconnection groove 5a can be adopted. Although there is no particular limitation, this structure is suited for the case where an alloy with a high intrinsic resistance is inevitably formed by the direct contact of the thick conductor film 11L2 with the upper wiring material thereon.

The third-layer interconnection 11L formed in each of the interconnection grooves 5e and 5f is electrically connected with the second-layer interconnection 9L via the connecting conductor portion 12C. Most portions of the connecting conductor portion 12C are buried in a connecting hole 8d which has been perforated in the interlayer insulating film 4c from the bottom surface of each of the interconnection grooves 5e and 5f toward the upper surface of the second-layer interconnection 9L, and the upper portion of the connecting conductor portion 12C protrudes in the third-layer interconnection 11L so as to pass through the upper and lower surfaces of the third-layer interconnection 11L. The connecting hole 8d has a diameter of, for example, about 0.2 to 1.2 µm, and preferably is about 0.4 µm. The aspect ratio of the connecting hole 8d is about 2 to 6 and is preferably less than 4 in consideration of the favorable burying of the connecting conductor portion. Incidentally, the upper surface height of the connecting conductor portion 12C is substantially equal to that of the second-layer interconnection 11L, that is, the upper surface height of the interlayer insulating film 4c.

The connecting conductor portion 12C is composed of a relatively thin conductor film 12C1 at its bottom and sides and a relatively thick conductor film 12C2 surrounded by the thin conductor film 12C1. The thin conductor film 12C1 is made of a material equipped with a function of improving the adhesion between the connecting conductor portion 12C and the interlayer insulating film 4c and also a function of suppressing, as a barrier, the diffusion of component atoms of the thick conductor film 12C2. Examples of the material include tungsten, TiN, Ti, Ta, WN, WSiN, TiSiN, TaN and TaSiN.

When the thin conductor film 12C1 is made of tungsten or the like, it becomes possible to reduce the interconnection resistance compared with the case where the film is made of TiN, Ti, Ta, WN, WSiN, TiSiN, TaN or TaSiN. Although there is no particular limitation, the thin conductor film 12C1 is made of, for example, tungsten in this first embodiment.

The thick conductor film 12C2 is a member constituting the main body of the connecting conductor portion 12C and is composed of a low-resistance material such as Al, Al alloy, tungsten, tungsten alloy, Cu or Cu alloy. The use of Cu or Cu alloy for forming the thick conductor film 12C2 makes it possible to reduce the resistance of the connecting conductor portion 12C and to improve the EM resistance of it compared with the use of Al, Al alloy, tungsten or tungsten alloy. The use of Al or Al alloy for forming the thick conductor film 12C2 makes it possible to reduce the resistance of the connecting conductor 12C compared with the use of tungsten or tungsten alloy. The use of tungsten or tungsten alloy for constituting the thick conductor film 12C2 makes it possible to improve the EM resistance and SM resistance of the connecting conductor portion 12C compared with the use of Al or Al alloy. Although there is no particular limitation, the thick conductor film 12C2 is made of, for example, tungsten in this first embodiment.

In the interlayer insulating film 4c, a connecting hole 8e is perforated from the upper surface of the insulating film 4c toward the upper surface of the second-layer interconnection 9L so as to expose a part of the second-layer interconnection 9L. A connecting conductor portion 12C is formed by being buried in the connecting hole 8e. The connecting hole 8e has a diameter of, for example, about 0.2 to 1.2 µm, preferably, about 0.5 µm. The aspect ratio of the connecting hole 8e is about 2 to 6 and is preferably less than 4 in consideration of the favorable burying of the connecting conductor portion. This connecting conductor portion 12C has a structure similar to that of the above-described one. In FIG. 1, however, the connecting conductor portion 12C is not directly connected with the third-layer interconnection 11L. This connecting conductor portion 12C is in contact with the connecting conductor portion 10C formed in the lower connecting hole 8c and therefore, they are electrically connected. According to this first embodiment, in the interconnection layers having a buried interconnection structure, the connecting conductor portions 10C and 12C are electrically connected while passing through predetermined interconnection layers. By forming the connecting conductor portion 12C from a material similar to that used for the connecting conductor portion 10C, the connecting resistance can be decreased. More specifically, the contact resistance can be reduced and therefore the connecting resistance can be reduced compared with the connection between the connecting conductor portions 10C and 12C via the second-layer interconnection 9L formed of a different conductor material.

It is however possible to use, as materials for constituting the thick conductor film 12C2 and thin conductor film 12C1 of the connecting conductor portion 12C to be buried in the connecting hole 8e, materials different from those for constituting the thick conductor film 12C2 and thin conductor film 12C1 of the connecting conductor portion 12C buried in the connecting hole 8e.

As the connecting structure between the connecting conductor portions 10C and 12C in the right side of FIG. 1, it is possible to directly and electrically connect the third-layer interconnection 11L and the first-layer interconnection 6L, as illustrated in FIG. 7, via one connecting conductor 12C in the connecting hole 8e1 which passes through the interlayer insulating films 4c and 4b. By such a structure, the connecting resistance can be reduced.

Over the interlayer insulating film 4c, an interlayer insulating film 4d composed of a silicon nitride film 4d1 and a silicon oxide film 4d2 similar to the interlayer insulating film 4b is formed. On the upper surface of the interlayer insulating film 4d, a fourth-layer interconnection 13L (or fourth level layer wiring line) is formed. The fourth-layer interconnections 13L and 13L are formed of, for example, Al or Al alloy and are electrically connected with the third-layer interconnection 11L and connecting conductor portion 12C through the connecting holes 8f and 8f perforated in the interlayer insulating film 4d, respectively.

Since Al or Al alloy is employed as a material for constituting the uppermost fourth-layer interconnection 13L, the conventional technique for the connection of a bonding wire or the formation of a bump electrode can be used as is. More specifically, by using a conventionally used material such as Al or Al alloy for the uppermost interconnection layer to be connected with a bonding wire or bump electrode, the conventional joining technique of the bonding wire or bump electrode can be used as is. This makes it possible to introduce a semiconductor integrated circuit device having a buried interconnection structure made of Cu base material into a fabrication line without a technical change in the fabrication step (wire bonding step or bump electrode formation step). Therefore, the cost reduction of the semiconductor integrated circuit device having a buried interconnection made of a Cu base material can be promoted and time necessary for the fabrication and development of it can also be saved.

The connecting hole 8f has a diameter of, for example, about 0.2 to 1.2 µm, and preferably is about 0.5 µm. The aspect ratio of the connecting hole 8f is about 2 to 6 and is preferably less than about 4 in consideration of the favorable burying of the connecting conductor portion. In the connecting hole 8f, a connecting conductor portion 14C is buried. The connecting conductor portion 14C is composed of a relatively thin conductor film 14C1 at its bottom and sides and a relatively thick conductor film 14C2 surrounded by the thin conductor film 14C1. Incidentally, the connecting conductor 14C does not pass through the fourth-layer interconnection 13L.

The thin conductor film 14C1 is made of a material having a function of improving the adhesion between the connecting conductor portion 14C and the interlayer insulating film 4d and also a function of suppressing, as a barrier, the diffusion of component atoms of the thick conductor film 14C2. Examples of the material include tungsten, TiN, Ti, Ta, WN, WSiN, TiSiN, TaN and TaSiN. When tungsten or the like is used as a material for constituting the thin conductor film 14C1, the interconnection resistance can be reduced compared with the case where TiN, Ti, Ta, WN, WSiN, TiSiN, TaN or TaSiN is used. Although there is no particular limitation, the thin conductor film 14C1 is made of, for example, tungsten in this first embodiment.

The thick conductor film 14C2 is a member which constitutes the main body of the connecting conductor portion 14C and is made of a low-resistance material such as Al, Al alloy, tungsten or tungsten alloy.

When Al or Al alloy is used for forming the thick conductor film 14C2, the resistance of the connecting conductor portion 14C can be lowered compared with the case where tungsten or tungsten alloy is used. When tungsten or tungsten alloy is used for constituting tile thick conductor film 14C2, the EM resistance and SM resistance of the connecting conductor portion 14C can be improved compared with the case where Al or Al alloy is used. In addition, when tungsten or tungsten alloy is used as a material for constituting the thick conductor film 14C2, Cu which constitutes the third-layer interconnection 11L, and Al or Al alloy which constitutes the fourth-layer interconnection 13L can be isolated by a thick barrier metal, whereby an increase in the resistance caused by the reaction between these two materials can be easily prevented. In other words, by burying in the connecting hole 8f a material having a barrier function, the third-layer interconnection 11L made of a Cu base material and the fourth-layer interconnection 13L made of an Al base material can be isolated so that the reaction between these two materials can be reduced. Although there is no particular limitation, the thick conductor film 14C2 is made of, for example, tungsten in this first embodiment.

On the interlayer insulating film 4d, a surface protecting film 15 is formed, with which the surface of the fourth-layer interconnection 13L is covered. The surface protecting film 15 is composed of, for example, a protecting film 15a and a protecting film 15b stacked thereon. The protecting film 15a is made of, for example, $SiO_2$, while the upper protecting film 15b is made of, for example, silicon nitride. In one part of the surface protecting film 15, an opening portion 16 is formed so as to expose a portion of the fourth-interconnection layer 13L. This exposed portion from the opening portion 16 forms a bonding pad portion BP. With this bonding pad portion BP, a bonding wire is directly connected, through which a lead of the package constituting the semiconductor integrated circuit device is electrically connected. Incidentally, it is also possible to dispose, on the bonding pad portion BP, a bump electrode made of lead-tin alloy or gold via an underground metal layer. Each of the above-described interlayer insulating films 4a to 4d may be, for example, a coated film formed by the SOG (Spin on Glass) method, an organic film, a CVD film having fluorine added thereto or a silicon nitride film or a film obtained by stacking these films.

A fabrication process of the semiconductor integrated circuit device of the first embodiment will next be described with reference to FIGS. 8 to 18.

A fabrication process of buried interconnections by using the same material will be described first with reference to FIGS. 8 through 12. Here, the first-layer interconnection 6L, second-layer interconnection 9L and third-layer interconnection 11L are the same in structure so that the fabrication process of buried interconnections will be described with the first-layer interconnection 6L as a typical example.

Figure 8:
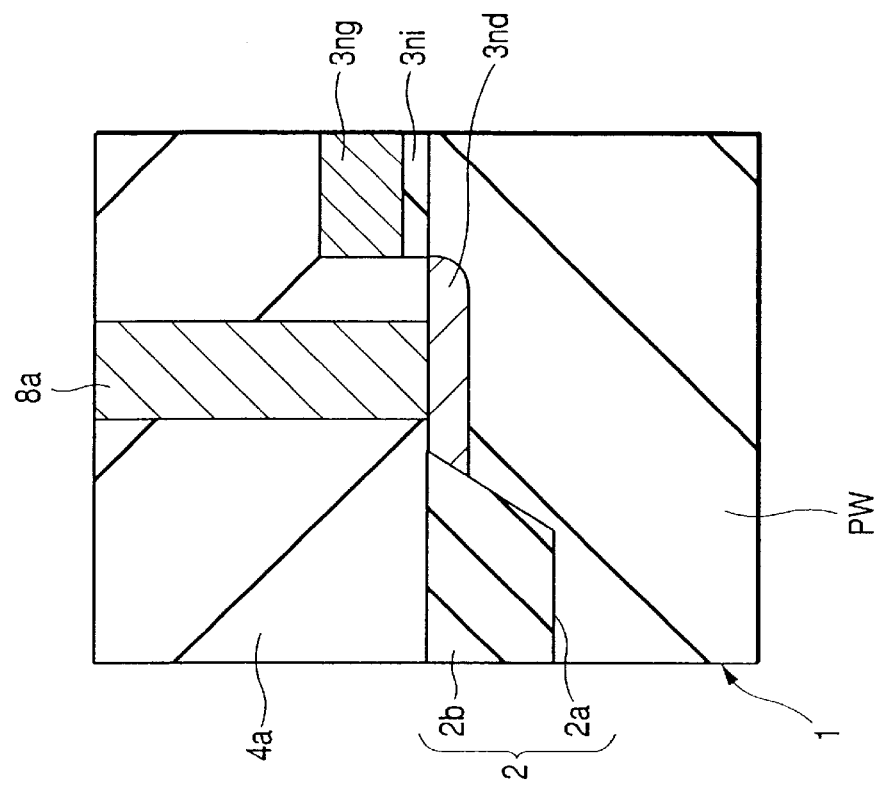
FIG. 8 is a fragmentary cross-sectional view illustrating the semiconductor integrated circuit device of FIG. 1 during its fabrication step.

FIG. 8 is a fragmentary cross-sectional view illustrating the semiconductor integrated circuit during its fabrication process. In the interlayer insulating film 4a formed on the semiconductor substrate 1, the connecting hole 8a to expose the principal surface (semiconductor region 3nd) of the semiconductor substrate 1 has already been made by photolithography and dry etching techniques. The interlayer insulating film 4a is composed of, for example, a silicon oxide film, a silicon oxide film formed by the SOG (Spin On Glass) method, an organic film, a CVD film having fluorine added thereto or a silicon nitride film or a stacked film of them. The interlayer insulating film 4a has a planarized surface and it is obtained by polishing, for example, a silicon oxide film, which has been deposited by the CVD (Chemical Vapor Deposition) method, by the CMP method or the like.

Figure 9:
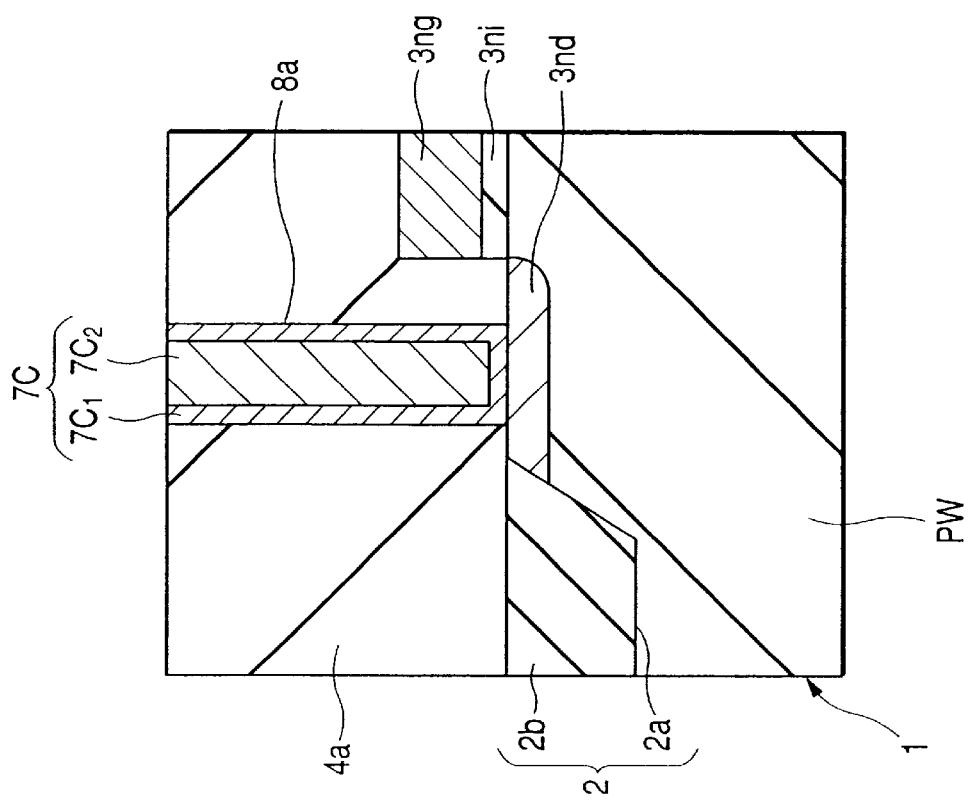
FIG. 9 is a fragmentary cross-sectional view illustrating the semiconductor integrated circuit device of FIG. 1 during its fabrication step.

Then, as illustrated in FIG. 9, the thin conductor film 7C1 made of, for example, tungsten (W) is adhered by sputtering or the like method to the upper surface of the interlayer insulating film 4a and the side and bottom surfaces of the connecting hole 8a. This thin conductor film 7C1 is made of a material having a function of improving the adhesion between the connecting conductor portion and interlayer insulating film 4a and also a function of suppressing, as a barrier, the diffusion of the material gas and diffusion of component atoms of the thick conductor film 7C2 upon forming the thick conductor film 7C2 The material is not limited to tungsten,but various materials can be used instead such as TiN, Ti, Ta, WN, WSiN, TiSiN, TaN or TaSiN.

Over the thin conductor film 7C1, the thick conductor film 7C2 made of, for example, tungsten is then adhered by the CVD method or the like, whereby a conductor film can be filled favorably in the minute connecting hole 8a. The thick conductor film 7C2 is not limited to tungsten or the like, but various materials can be used instead. For example, low-resistance materials such as Al or Al alloy can be used. The formation method of this thick conductor film 7C2 is not limited to the CVD method, but a plating method, a sputtering method or a combination of the CVD and plating methods can be employed.

In the second-layer interconnection and third-layer interconnection, Cu or Cu alloy may be used instead of the above-described material for forming the thick conductor film of the connecting conductor portions 10C and 12C (see FIG. 1). The film formation of Cu in this case may be carried out by, for example, the CVD method or plating method.

Figure 10:
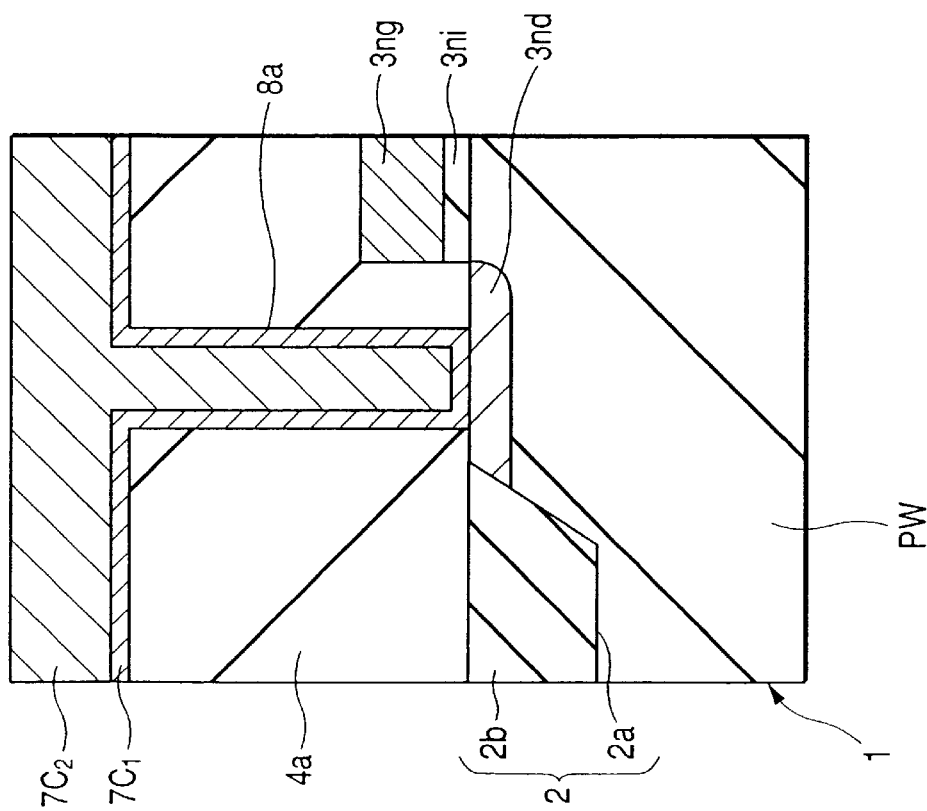
FIG. 10 is a fragmentary cross-sectional view illustrating the semiconductor integrated circuit device of FIG. 1 during its fabrication step.

The semiconductor substrate 1 is then subjected to, for example, CMP (Chemical Mechanical Polishing) treatment to remove the thick conductor film 7C2 and thin conductor film 7C1 at portions other than the connecting hole 8a, whereby the connecting conductor portion 7C is formed as illustrated in FIG. 10 in the connecting hole 8a.

As illustrated in FIG. 11, a photoresist pattern 17a for the formation of the interconnection groove is formed over the interlayer insulating film 4a and then with this pattern as an etching mask, the exposed portion of the interlayer insulating film 4a from the photoresist pattern 17a is removed, whereby the interconnection grooves 5a and 5b (see FIG. 1) are formed in the upper part of the interlayer insulating film 4a. At this time, the upper portion of the connecting conductor portion 7C formed in advance protrudes in the interconnection groove 5a.

After the photoresist pattern 17a is removed, the thin conductor film 6L1 made of, for example, TiN is adhered by the sputtering method or the like to the surface of the interlayer insulating film 4a containing the interconnection groove 5a and the exposed surface of the connecting conductor portion 7C as illustrated in FIG. 12. This thin conductor film 6L1 is made of a material having a function of improving the adhesion between the first-layer interconnection and interlayer insulating film 4a and a function of suppressing, as a barrier, the diffusion of component atoms of the thick conductor film. The material of this thin conductor film is not limited to TiN, but various materials such as tungsten, Ti, Ta, WN, WSiN, TiSIN, TaN or TaSiN may be used instead.

On the thin conductor film 6L1, the thick conductor film 6L2 made of, for example, Cu is adhered by the CVD method, sputtering method or plating method or the combination of them. It is desired, upon the formation of a Cu film, to adopt a method which permits the formation of as small an overhang as possible and has good step coverage. In the sputtering method, for example, a sputtering device which can set the distance between the target and semiconductor wafer so as to be larger than the radius of the semiconductor wafer is desirable. The material of the thick conductor film 6L is not limited to Cu, but various materials such as Cu alloy, Al, Al alloy, tungsten or tungsten alloy can be used instead.

When the above-described conductor film for interconnection is formed by the sputtering method, the component atoms (ex. Cu) of the thick conductor film 6L2 are fluidized and then, supplied and buried sufficiently in the interconnection groove 5a particularly by subjecting the semiconductor substrate 1 to the thermal treatment. At this time, the thermal treatment is carried out in an inert gas atmosphere, oxidizing gas atmosphere, reducing gas atmosphere or combined atmosphere of at least two of them. Alternatively, a so-called reflow sputtering method in which thermal treatment is carried out during the sputtering of Cu may be adopted. By such treatment, the EM characteristics of the Cu interconnection can be improved.

The semiconductor substrate 1 is then subjected to CMP treatment, whereby the thick conductor film 6L2 and thin conductor film 6L1 on the interlayer insulating film 4a at portions other than the interconnection grooves 5a and 5b (see FIG. 1) are removed and the first-layer interconnection 6L, illustrated in FIG. 2 and the like is formed.

Prior to or subsequent to the CMP treatment, the semiconductor substrate 1 may be subjected to the thermal treatment. At this time, the thermal treatment is carried out in an inert gas atmosphere, oxidizing gas atmosphere, reducing gas atmosphere or the combined atmosphere of at least two of them. In the thermal treatment step after the CMP treatment, the growth of the Cu grains of the thick conductor film 6L2 is accelerated to improve the EM resistance and the surface of it is planarized by removing the damage or oxide film which has appeared on the surfaces of the thin conductor film 6L1 and thick conductor film 6L2 upon the CMP treatment. The surface stains on the insulating film 4a are also removed and reduced at the same time, whereby the reliability of the interconnection can be improved.

A method for forming buried interconnections made of different conductor materials in the same buried interconnection layer will next be described with reference to FIGS. 13 to 18. This corresponds to the above-described example of the fabrication process in the case where interconnections made of different conductor materials exist in the same interconnection film. In this first embodiment, a case where different conductor materials are buried in the interconnection grooves 5a and 5b, respectively to form the first-layer interconnections 6L will next be described as a typical example.

Figure 13:
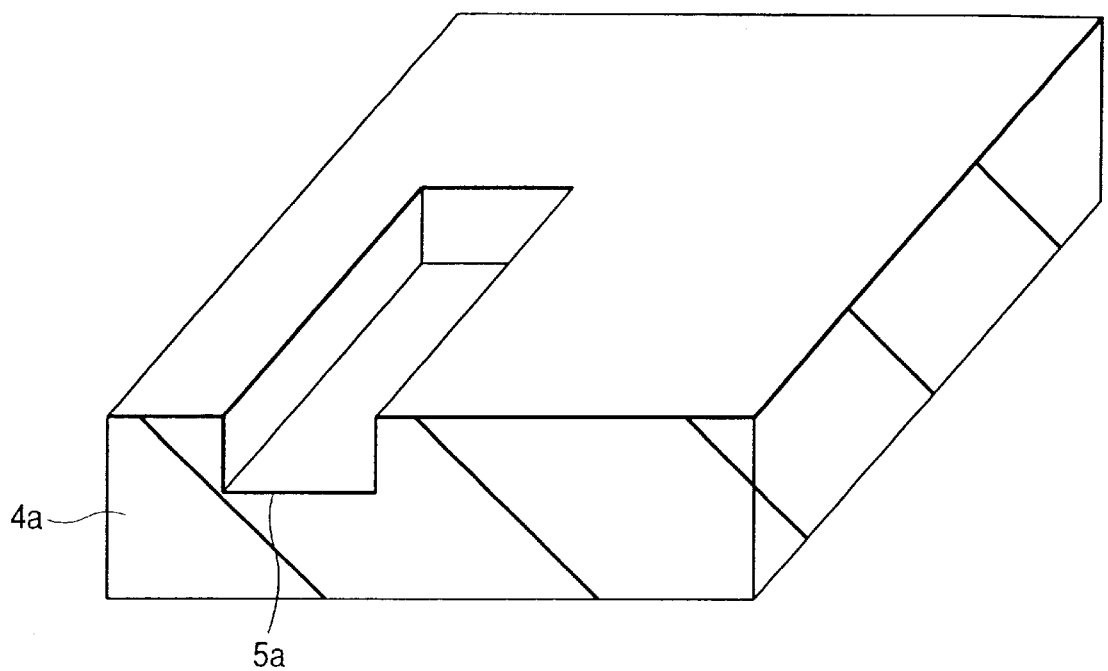
FIG. 13 is a fragmentary, partially-cutaway, perspective view illustrating the semiconductor integrated circuit device of FIG. 1 during its fabrication step.

FIG. 13 is a fragmentary perspective view of the interlayer insulating film 4a of the semiconductor integrated circuit device during the fabrication step. In the upper part of the interlayer insulating film 4a, the interconnection groove 5a is formed by photolithography and dry etching techniques.

Figure 14:
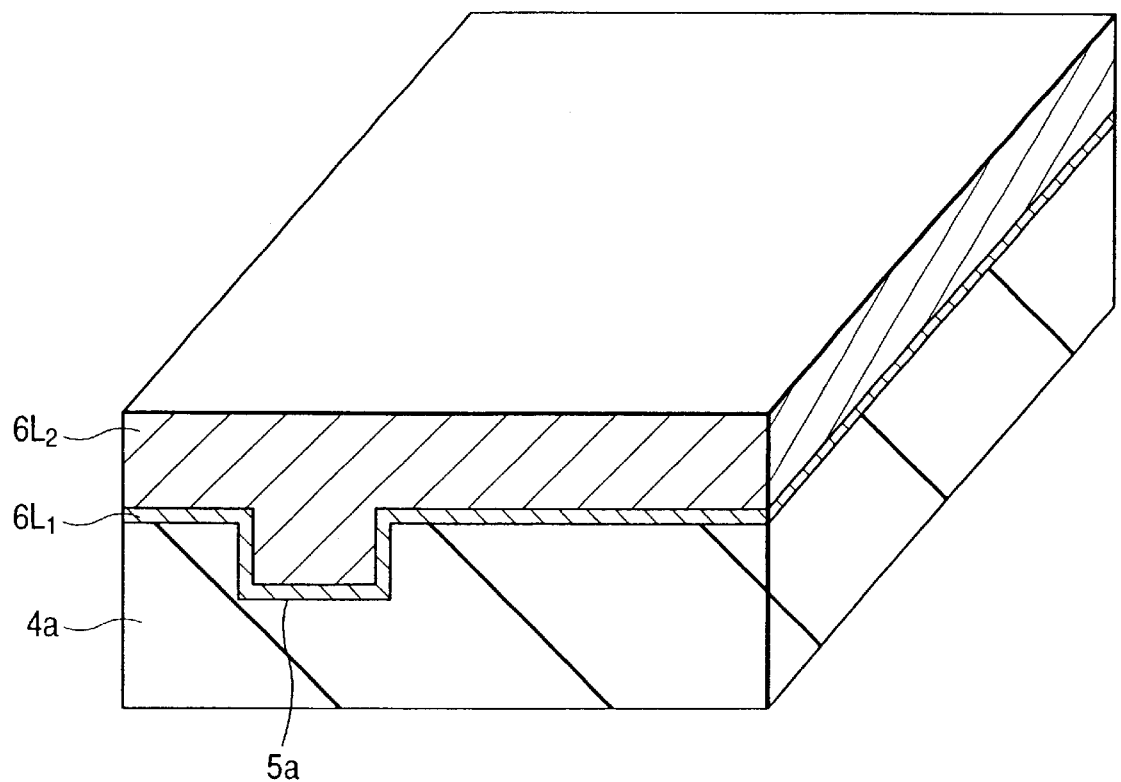
FIG. 14 is a fragmentary, partially-cutaway, perspective view illustrating the semiconductor integrated circuit device of FIG. 1 during its fabrication step.

As illustrated in FIG. 14, the thin conductor film 6L1 made of, for example, TiN is adhered by the sputtering method or the like to the surface of the interlayer insulating film 4a containing the interconnection groove 5a. This thin conductor film 6L1 is made of a material having a function of improving the adhesion between the first-layer interconnection and interlayer insulating film 4a and a function of suppressing, as a barrier, the diffusion of component atoms of the thick conductor film. The material of this thin conductor film is not limited to TiN,but various materials such as tungsten, Ti, Ta, WN, WSiN, TiSIN, TaN or TaSiN can be used instead.

On the thin conductor film 6L1, the thick conductor film 6L2 made of, for example, Cu is adhered by the CVD method, sputtering method or plating method. It is desired, upon the formation of Cu, to adopt a method which permits the formation of as small an overhang as possible and has good step coverage. In the sputtering method, for example, a sputtering device which can set the distance between the target and semiconductor wafer to be larger than the radius of the semiconductor wafer is suited. The material of the thick conductor film 6L is not limited to Cu but various materials such as Cu alloy, Al, Al alloy, tungsten or tungsten alloy can be used instead.

When the above-described conductor film for interconnection is formed by the sputtering method, the component atoms (ex. Cu) of the thick conductor film are fluidized and then, supplied and buried sufficiently in the interconnection groove 5a, particularly by subjecting the semiconductor substrate 1 to thermal treatment. At this time, the thermal treatment is carried out in an inert gas atmosphere, oxidizing gas atmosphere, reducing gas atmosphere or a combined atmosphere of at least two of them. Alternatively, a so-called reflow sputtering method may be adopted in which thermal treatment is carried out during the sputtering of Cu. By such treatment, the EM characteristics of the Cu interconnection can be improved.

Figure 15:
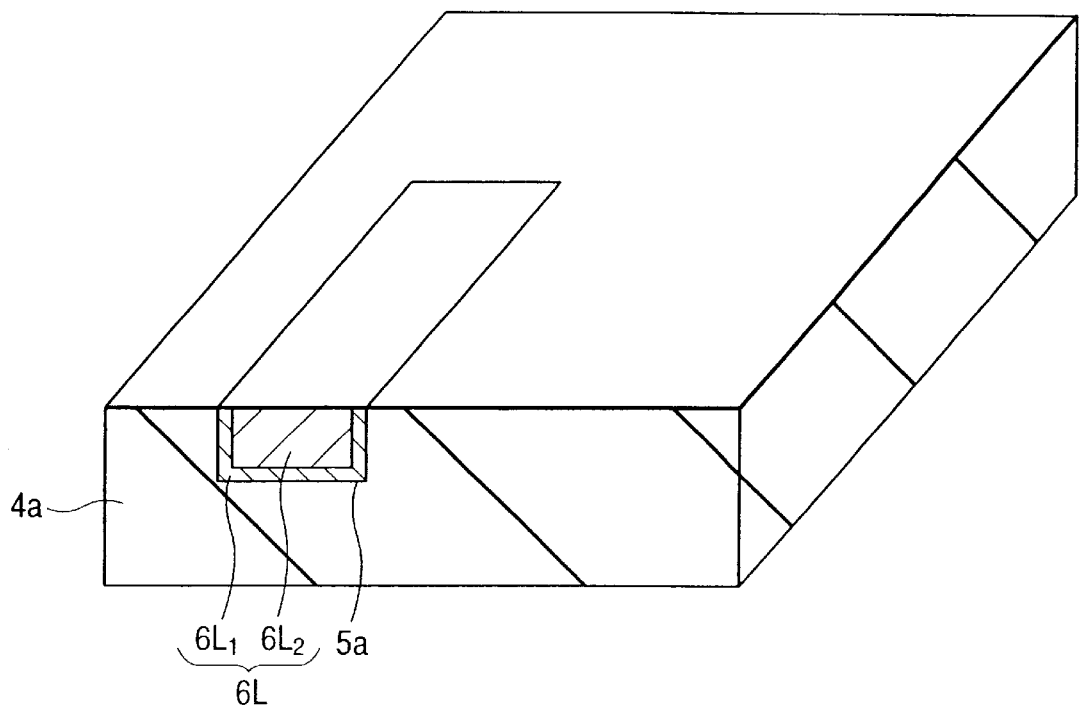
FIG. 15 is a fragmentary, partially-cutaway, perspective view illustrating the semiconductor integrated circuit device of FIG. 1 during its fabrication step.

The semiconductor substrate 1 is then subjected to CMP treatment, whereby the thick conductor film 6L2 and thin conductor film 6L1 on the interlayer insulating film 4a at portions other than the interconnection groove 5a are removed and the first-layer interconnection 6L as is illustrated in FIG. 15 is formed in the interconnection groove 5a.

Prior to or subsequent to the CMP treatment, the semiconductor substrate 1 may be subjected to thermal treatment. At this time, the thermal treatment is carried out in an inert gas atmosphere, oxidizing gas atmosphere, reducing gas atmosphere or a combined atmosphere of at least two of them. In the thermal treatment step after the CMP treatment, the growth of the Cu grains of the thick conductor film 6L2 is accelerated to improve the EM resistance and the surface of it is planarized by removing the damage or oxide film which has appeared on the surfaces of the thin conductor film 6L1 and thick conductor film 6L2 During the CMP treatment. The surface stains on the insulating film 4a are also removed and reduced at the same time, whereby the reliability of the interconnection can be improved.

Figure 16:
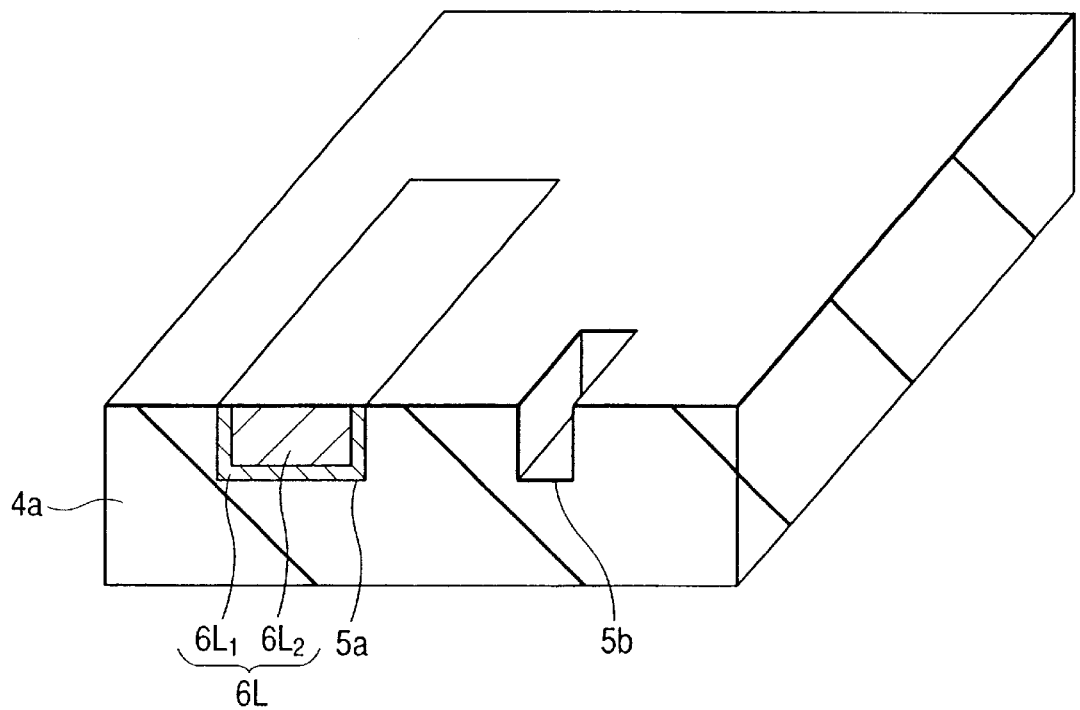
FIG. 16 is a fragmentary, partially-cutaway, perspective view illustrating the semiconductor integrated circuit device of FIG. 1 during its fabrication step.
Figure 17:
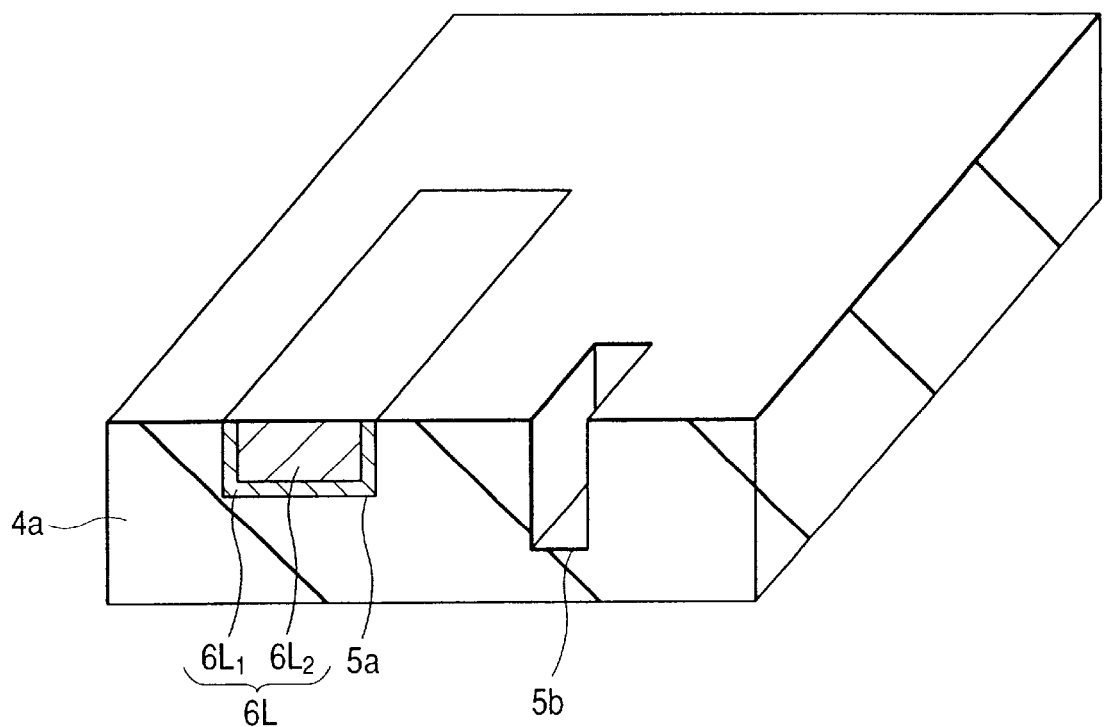
FIG. 17 is a fragmentary, partially-cutaway, perspective view illustrating the semiconductor integrated circuit device of FIG. 1 during its fabrication step.

Then, as illustrated in FIG. 16, the interconnection groove 5b which is narrower or shorter than the interconnection groove 5a is formed in the upper part of the interlayer insulating film 4a by photolithography and dry etching techniques. At this time, the interconnection groove 5b may be formed to have the same depth with that of the interconnection groove 5a, or to have a depth different from that of the interconnection groove 5a. As illustrated in FIG. 17, the interconnection groove 5b may be made deeper than the interconnection groove 5a. In this case, the interconnection groove 5b is deep in spite of having a narrower width so that the interconnection resistance of the conductor film to be buried in the interconnection groove 5b can be reduced. It is also possible to deepen the interconnection groove 5b enough to reach the lower interconnection layer or semiconductor substrate and to use it for connection.

To the surface of the interlayer insulating film 4a including the upper surface of the first-layer interconnection 6L in the interconnection groove 5a and the interconnection groove 5b, a thin conductor film made of, for example, tungsten is then adhered in a similar manner to that described above. This thin conductor film is made of a material having a function of improving the adhesion between the first-layer interconnection and the interlayer insulating film 4a and also a function of suppressing, as a barrier, the diffusion of component atoms of the thick conductor film. The material of the thin conductor film is not limited to tungsten,but various materials can be used instead. Examples of the material include TiN, Ti, Ta, WN, WSiN, TiSiN, TaN and TaSiN.

To the thin conductor film, a thick conductor film made of, for example, tungsten is adhered by the CVD method or the like. Upon the formation of the tungsten film or the like, it is desirable to adopt a method which permits the formation of as small an overhang as possible and has good step coverage. Such a method makes it possible to fill an interconnection conductor favorably inside of the interconnection groove 5b which is deeper than the interconnection groove 5a as is illustrated in FIG. 17. The material of the thick conductor film is not limited to tungsten,but various materials can be used instead. Examples include tungsten alloy, Al and Al alloy.

Figure 18:
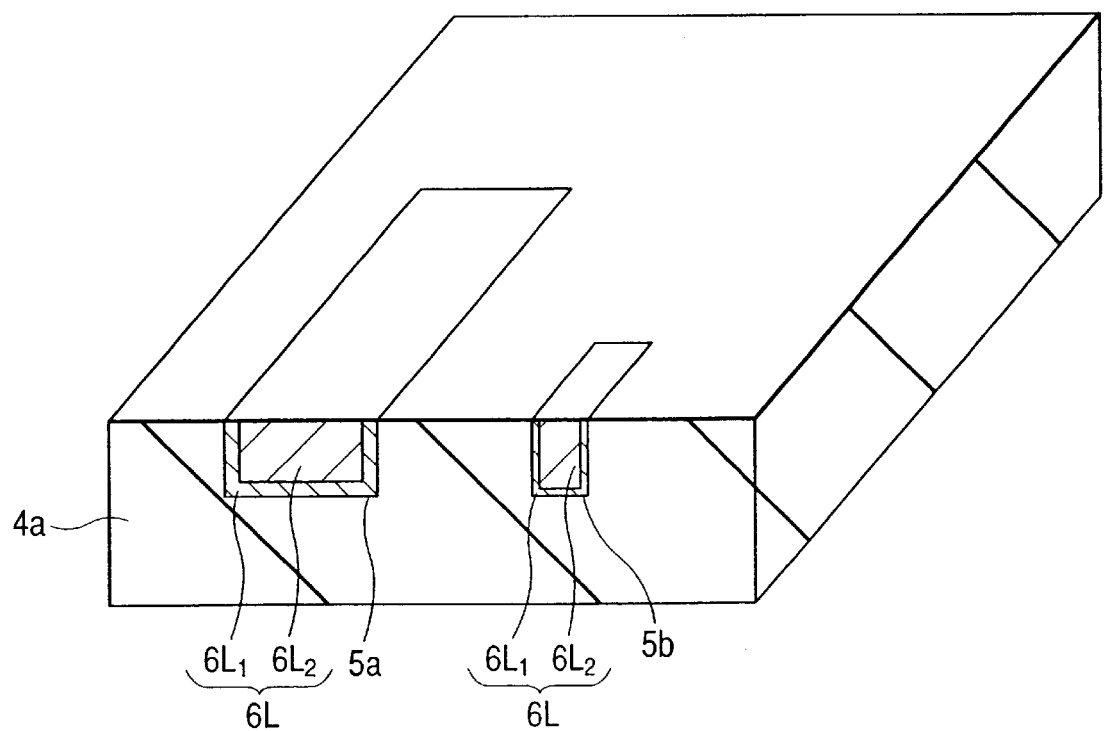
FIG. 18 is a fragmentary, partially-cutaway, perspective view illustrating the semiconductor integrated circuit device of FIG. 1 during its fabrication step.

The semiconductor substrate 1 is then subjected to the CMP treatment, whereby the thick conductor film and thin conductor film at portions other than the interconnection groove 5b are removed. In this manner, as illustrated in FIG. 18, the first-layer interconnection 6L having the thin conductor film 6L1 and thick conductor film 6L2, which are made of conductor materials different from the thin conductor film 6L1 and thick conductor film 6L2 in the interconnection groove 5a, respectively, are provided in the interconnection groove 5b which is narrower than the interconnection groove 5a.

The following advantages are available according to the first embodiment.

(1) It becomes possible to favorably bury a conductor film in each of the interconnection grooves 5a to 5f and more minute connecting holes 8a to 8f by filling a conductor film in each of the minute connecting holes 8a to 8f by the CVD method or the like, forming the interconnection grooves 5a to 5f larger in the plain size than the connecting holes 8a to 8f, filling a conductor film in each of the interconnection grooves 5a to 5f and thereby forming the first-layer interconnection 6L, connecting conductor portion 7C, second-layer interconnection 9L, connecting conductor portion 10C, third-layer interconnection 11L and connecting conductor portion 12C, each having a buried structure (2) When there exist interconnection grooves of different size in the same interconnection layer, it becomes possible to bury a conductor film favorably in each of these interconnection grooves by selecting methods which make it easy to bury the minute interconnection groove and the other larger interconnection groove, respectively.

(3) The advantages described above in (1) and (2) make it possible to improve the reliability of the connection between interconnection layers, leading to an improvement in the yield and reliability of the semiconductor integrated circuit device (4) The advantages described above in (1) and (2) make it possible to promote the miniaturization of a buried interconnection, leading to the acceleration of the miniaturization and high integration of the semiconductor integrated circuit device.

(5) The advantages described above in (1) and (2) make it possible to favorably bury a conductor film in each of the interconnection grooves 5a to 5f and connecting holes 8a to 8f without adopting a difficult technique.

(6) The advantages described above in (1) and (2) make it possible to improve the buried condition even if Cu or a Cu alloy is used as a wiring material to be buried.

(7) By forming the connecting conductor portion 7C, which is in direct contact with the semiconductor substrate 1, from a tungsten base (tungsten or tungsten alloy) conductor material and forming the first-layer interconnection 6L, which is to be connected with the connecting conductor portion 7C, from a low-resistance Cubase conductor material, it becomes possible to prevent the diffusion of Cu atoms toward the semiconductor substrate 1, thereby avoiding connection failure attributable to this diffusion, while maintaining a good buried condition of a conductor film in the connecting hole 8a; and at the same time to reduce the interconnection resistance of the firstlayer interconnection 6L, thereby improving the propagation rate of signals.

(8) It is possible to follow the conventional fabrication technique such as a wire bonding technique or a bump-electrode forming technique, because the uppermost fourth-layer interconnection 13L is formed of an Al base (Al or Al alloy) conductor material. Accordingly, it becomes possible to easily introduce, into the fabrication step, a semiconductor integrated circuit device having a Cu-base buried interconnection.

(9) The connecting conductor portion 14C formed of a tungsten base conductor material is disposed between the fourth-layer interconnection 13L made of an Al base conductor material and the third-layer interconnection 11L which underlies the interconnection 13L and is made of a Cu base conductor material, whereby the Al base conductor material is isolated from the Cu base conductor material by a thick barrier metal. It therefore becomes possible to prevent the formation of an alloy film having a high specific resistance which will otherwise appear at the point where the Al base conductor material and Cu base conductor material are brought into direct contact. This makes it possible to reduce the resistance between the interconnection layers.

(10) By subjecting the semiconductor substrate 1 to thermal treatment after the CMP treatment for forming a buried interconnection made of a Cu base conductor material, the grain growth of Cu can be promoted to improve the EM resistance, and at the same time, the damage or oxide film which has appeared on the surface of the interconnection conductor film during the CMP treatment can be removed to planarize the surface or stains on the surface of the insulating film exposed during the CMP treatment can be removed or reduced, which make it possible to improve the reliability of the buried interconnection made of a Cu base conductor material.

(Second Embodiment)

Figure 22:
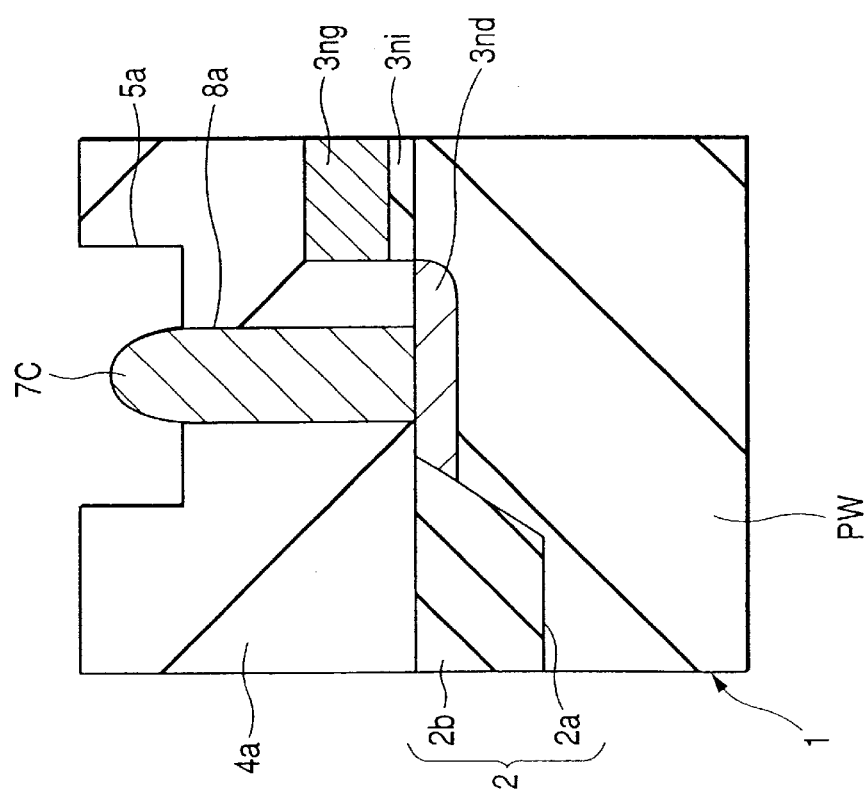
FIG. 22 is a fragmentary cross-sectional view illustrating the semiconductor integrated circuit device during its fabrication step subsequent to the step of FIG. 19.
Figure 23:
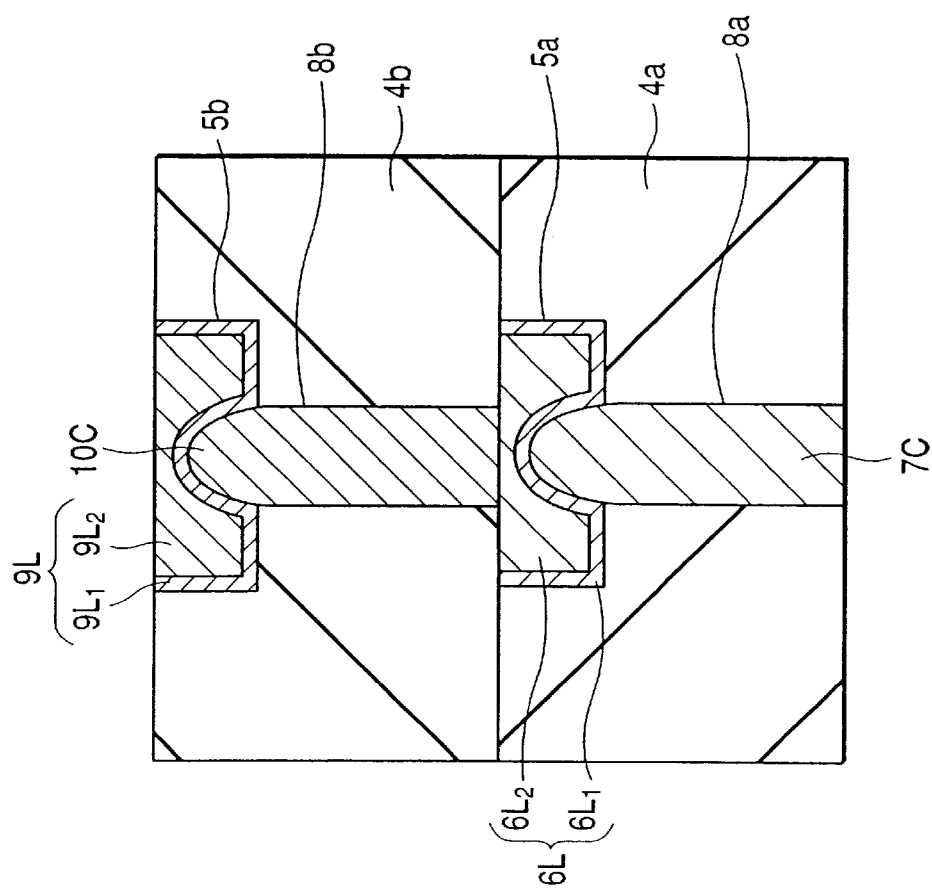
FIG. 23 is a fragmentary cross-sectional view illustrating the semiconductor integrated circuit device during its fabrication step subsequent to the step of FIG. 19.
Figure 24:
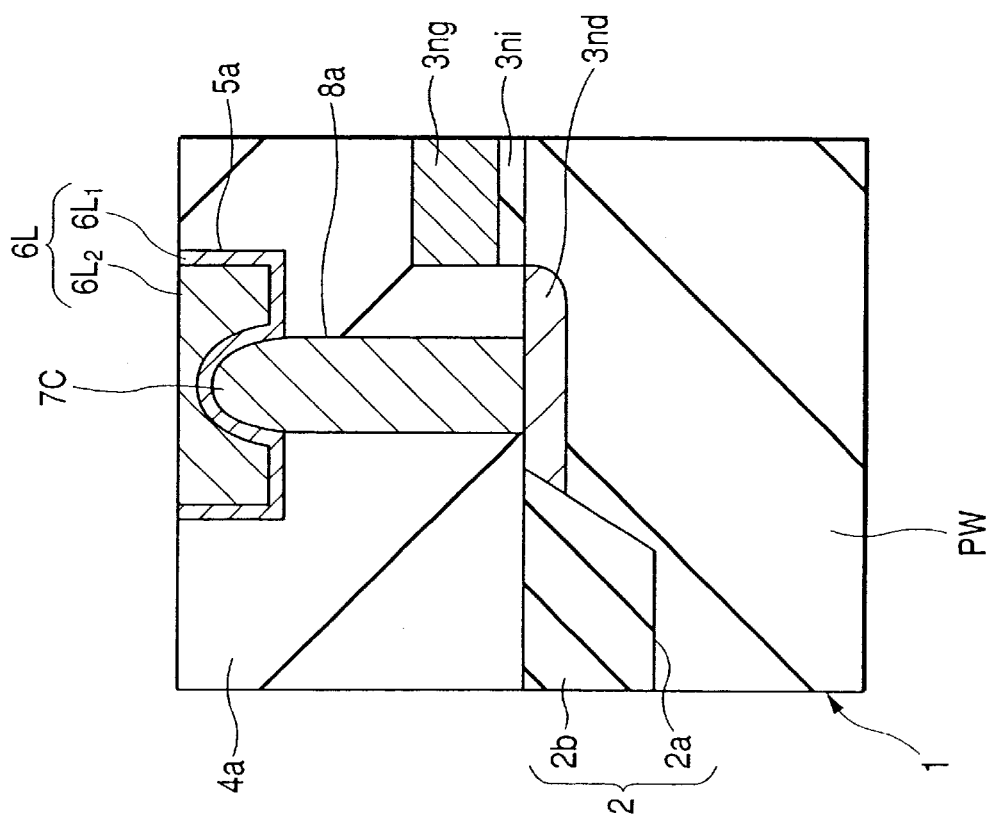
FIG. 24 is a fragmentary cross-sectional view illustrating a semiconductor integrated circuit device according to another embodiment of the present invention.

FIGS. 19 through 23 are fragmentary cross-sectional views of the semiconductor integrated circuit device according to the second embodiment of the present invention during the fabrication process and FIG. 24 is a fragmentary cross-sectional view illustrating the semiconductor integrated circuit device.

This second embodiment is different from the first embodiment in the structure of a connecting conductor portion and its forming process.

As illustrated in FIG. 19, a photoresist pattern 17b is formed on the upper surface of the interlayer insulating film 4a for the formation of an interconnection groove. Then, the interlayer insulating film 4a is etched with the photoresist pattern 17b as an etching mask, whereby an interconnection groove 5a is formed in the upper part of the interlayer insulating film 4a.

After the removal of the photoresist pattern 17b, a photoresist pattern 17c is formed, as illustrated in FIG. 20, over the interlayer insulating film 4a for the formation of a connecting hole. The interlayer insulating film 4a is etched with the photoresist pattern 17c as an etching mask, whereby a connecting hole 8a which extends toward the semiconductor substrate 1 from the bottom of the interconnection groove 5a and from which the upper surface of the semiconductor substrate 1 is exposed partially is perforated in the interlayer insulating film 4a.

Figure 21:
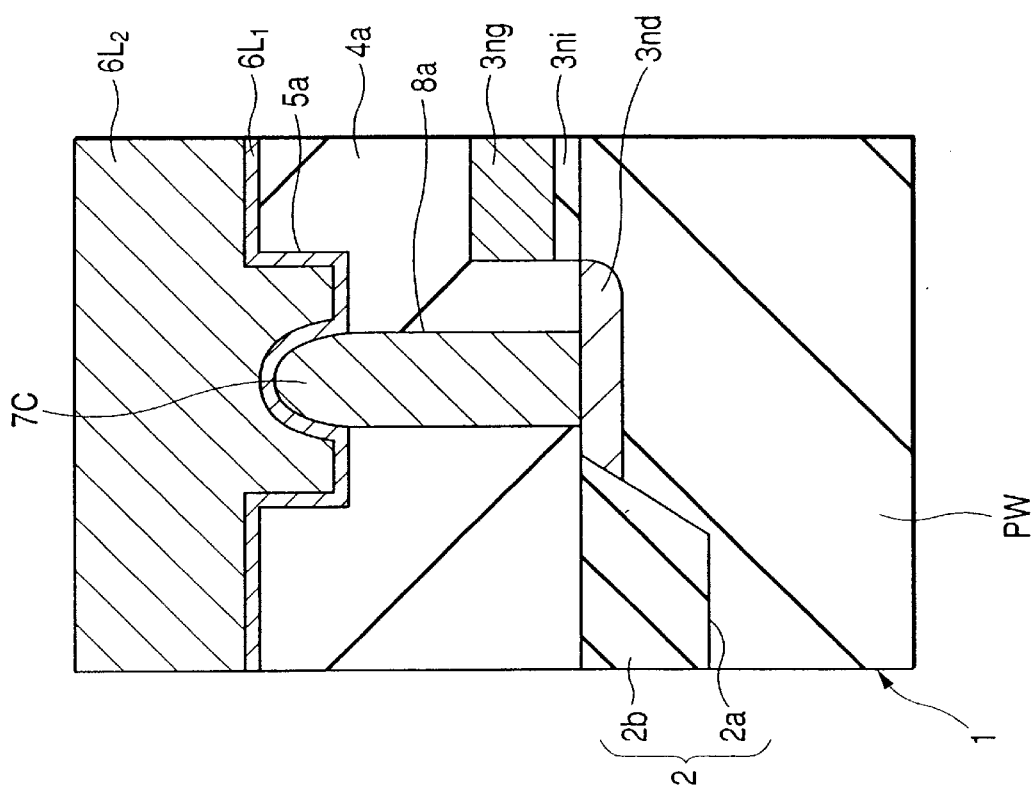
FIG. 21 is a fragmentary cross-sectional view illustrating the semiconductor integrated circuit device during its fabrication step subsequent to the step of FIG. 19.

After removal of the photoresist pattern 17c, the connecting conductor portion 7C made of, for example, tungsten is formed in the connecting hole 8a by the selective CVD method or the like as illustrated in FIG. 21. At this time, the upper part of the connecting conductor portion 7C may protrude in the interconnection groove 5a or not. The material of the connecting conductor portion 7C is not limited to tungsten, but various materials can be used instead, for example, tungsten, Al or Al alloy.

To the surface of the interlayer insulating film 4a including the interconnection groove 5a and exposed surface of the connecting conductor portion 7C, the thin conductor film 6L1 made of, for example, TiN is adhered by the sputtering method or the like as illustrated in FIG. 22. This thin conductor film 6L1 is made of a material having a function of improving the adhesion between the first-layer interconnection and the interlayer insulating film 4a and also a function of suppressing, as a barrier, the diffusion of component atoms of the thick conductor film. The material of the thin conductor film is not limited to TiN, but various materials can be used instead. Examples of the material include tungsten, Ti, Ta, WN, WSIN, TiSiN, TaN and TaSiN.

To the thin conductor film 6L1, the thick conductor film 6L2 made of, for example, Cu is then adhered by the CVD method, sputtering method, plating method or the like. It is desired, upon the formation of Cu, to adopt a method which permits the formation of as small an overhang as possible and has good step coverage. In the sputtering method, for example, a sputtering device which can set the distance between the target and semiconductor wafer to be larger than the radius of the semiconductor wafer is desirable. The material of the thick conductor film 6L2 is not limited to Cu, but various materials such as Cu alloy, Al, Al alloy, tungsten or tungsten alloy can be used instead.

When the above-described conductor film for interconnection is formed by the sputtering method, the component atoms (ex. Cu) of the thick conductor film are fluidized and then, supplied and buried sufficiently in the interconnection groove 5a particularly by subjecting the semiconductor substrate 1 to thermal treatment subsequent to the sputtering. At this time, the thermal treatment is carried out in an inert gas atmosphere, oxidizing gas atmosphere, reducing gas atmosphere or a combined atmosphere of at least two of them. Alternatively, a so-called reflow sputtering method may be adopted in which thermal treatment is carried out during the sputtering of Cu. By such treatment, the EM characteristics of the Cu interconnection can be improved.

The semiconductor substrate 1 is then subjected to CMP treatment to remove the thick conductor film 6L2 and thin conductor film 6L1 on the interlayer insulating film 4a at portions other than the interconnection groove 5a, whereby the first-layer interconnection 6L is formed in the interconnection groove 5a as illustrated in FIG. 23.

Prior to or subsequent to the CMP treatment, the semiconductor substrate 1 may be subjected to thermal treatment. At this time, the thermal treatment is carried out in an inert gas atmosphere, oxidizing gas atmosphere, reducing gas atmosphere or a combined atmosphere of at least two of them. In the thermal treatment step after the CMP treatment, the growth of the Cu grains of the thick conductor film 6L2 is accelerated to improve the EM resistance and at the same time, the surfaces of the thin conductor film 6L1 and thick conductor film 6L2 are planarized by removing the damage or oxide film which has appeared on their surfaces during CMP treatment. The surface stains on the insulating film 4a are also removed and reduced, whereby the reliability of the interconnection can be improved.

Such a buried interconnection structure may be applied to the second-layer interconnection 9L as illustrated in FIG. 24.

More specifically, the connecting conductor portion 10C is formed of a conductor film such as tungsten, tungsten alloy, Al, Al alloy, Cu or Cu alloy by the selective CVD method or the like.

According to the second embodiment, similar advantages to those of the first embodiment are available.

(Third Embodiment)

Figure 32:
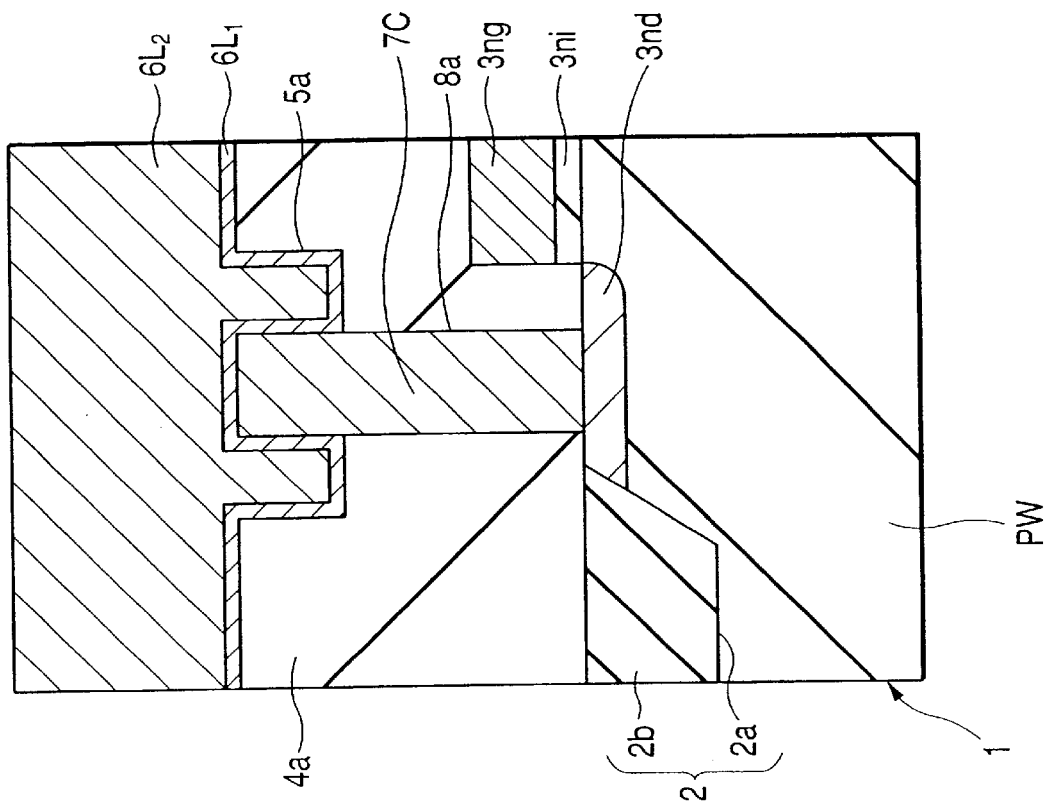
FIG. 32 is a fragmentary cross-sectional view illustrating the semiconductor integrated circuit device during its fabrication step subsequent to the step of FIG. 29.
Figure 33:
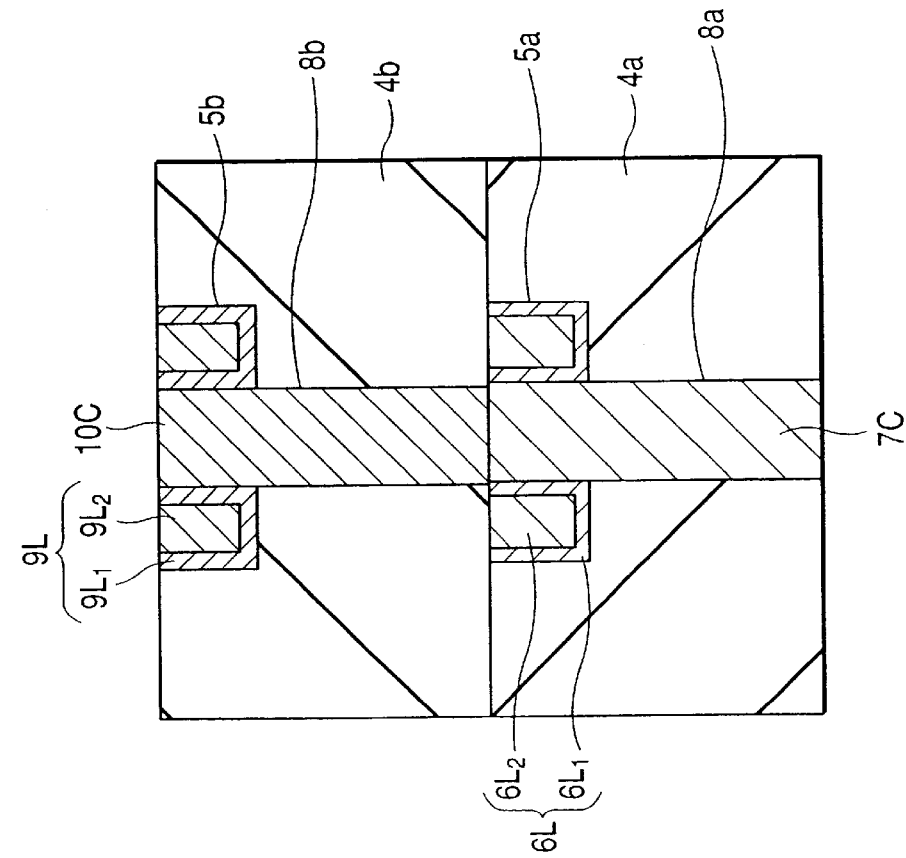
FIG. 33 is a fragmentary cross-sectional view illustrating a semiconductor integrated circuit device according to another embodiment of the present invention.

FIGS. 25 through 28 and FIGS. 29 through 32 are fragmentary cross-sectional views of the semiconductor integrated circuit device according to the third embodiment of the present invention during the fabrication process; and FIG. 33 is a fragmentary cross-sectional view of the semiconductor integrated circuit device.

Figure 25:
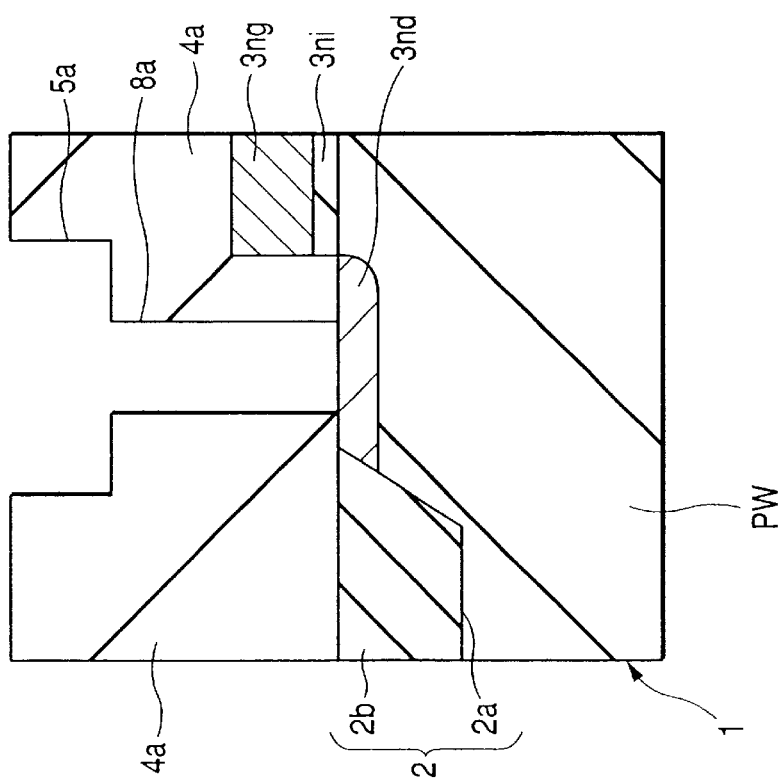
FIG. 25 is a fragmentary cross-sectional view illustrating a semiconductor integrated circuit device according to another embodiment of the present invention during its fabrication step.

FIG. 25 illustrates the semiconductor integrated circuit device during the fabrication process. In the interlayer insulating film 4a, the interconnection groove 5a and connecting hole 8a are formed by the method as described in the second embodiment.

Figure 26:
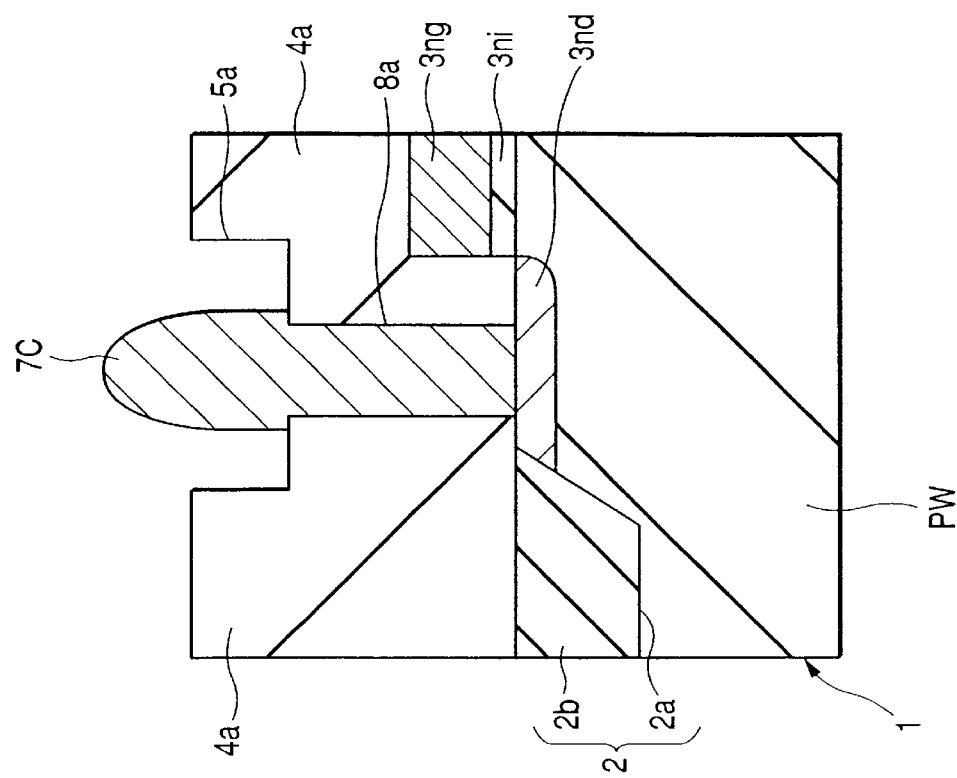
FIG. 26 is a fragmentary cross-sectional view illustrating the semiconductor integrated circuit device during its fabrication step subsequent to the step of FIG. 25.

In the third embodiment, the connecting conductor portion 7C made of, for example, tungsten is formed in the connecting hole 5a by the selective CVD method as illustrated in FIG. 26. In this third embodiment, the film formation is carried out to such an extent as the upper part of the connecting conductor portion 7C protrudes outside the interconnection groove 5a. The material of the connecting conductor portion 7C is not limited to tungsten; but various materials such as tungsten alloy, Al or Al alloy may be used instead.

Figure 27:
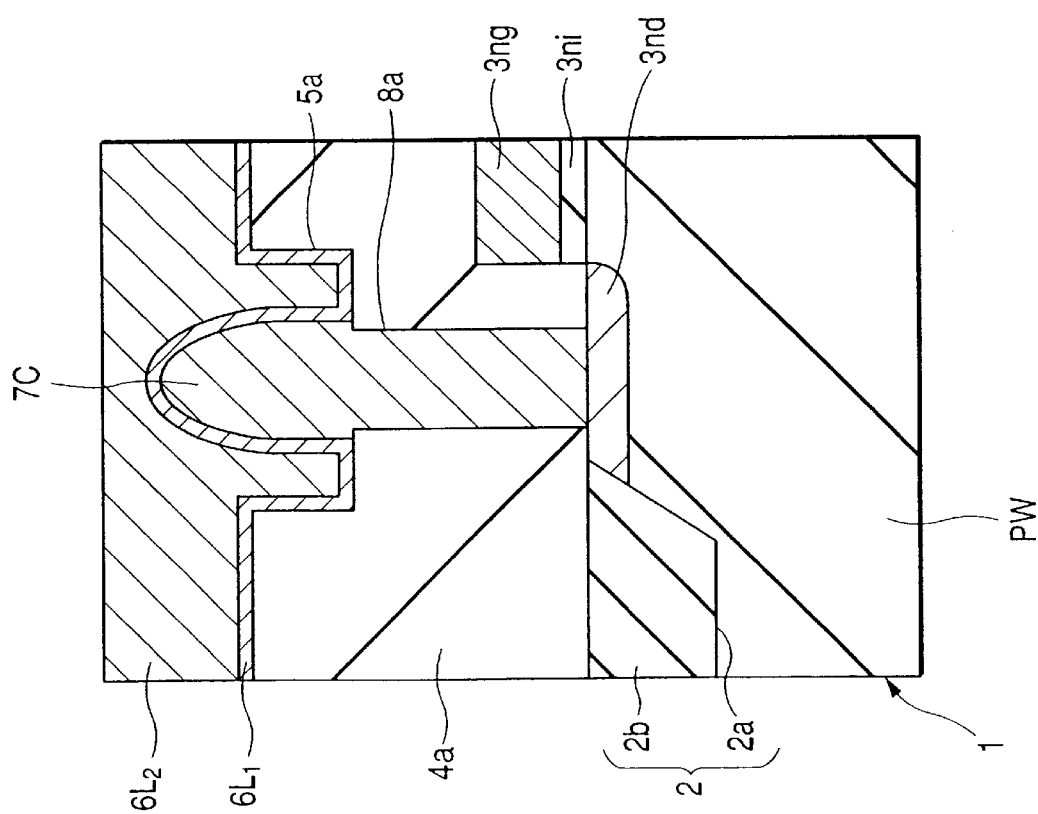
FIG. 27 is a fragmentary cross-sectional view illustrating the semiconductor integrated circuit device during its fabrication step subsequent to the step of FIG. 25.

To the surface of the interlayer insulating film 4a including the interconnection groove 5a and the surface of the connecting conductor portion 7C, the thin conductor film 6L1 made of, for example, TiN is adhered by the sputtering method or the like as illustrated in FIG. 27. This thin conductor film 6L1 is made of a material having a function of improving the adhesion between the first-layer interconnection and the interlayer insulating film 4a and also a function of suppressing, as a barrier, the diffusion of component atoms of the thick conductor film. The material of the thin conductor film is not limited to TiN but various materials can be used instead. Examples of the material include tungsten, Ti, Ta, WN, WSiN, TiSiN, TaN and TaSiN.

To the thin conductor film 6L1, the thick conductor film 6L2 made of, for example, Cu is then adhered by the CVD method, sputtering method, plating method or the like It is desired, upon the formation of Cu, to adopt a method which permits the formation of as small an overhang as possible and has good step coverage. In the sputtering method, for example, a sputtering device which can set the distance between the target and semiconductor wafer to be larger than the radius of the semiconductor wafer is desirable. The material of the thick conductor film 6L2 is not limited to Cu, but various materials such as Cu alloy, Al, Al alloy, tungsten or tungsten alloy may be used instead.

When the above-described conductor film for interconnection is formed by the sputtering method, the component atoms (ex. Cu) of the thick conductor film are fluidized and then, supplied and buried sufficiently in the interconnection groove 5a particularly by subjecting the semiconductor substrate 1 to thermal treatment. At this time, the thermal treatment is carried out in an inert gas atmosphere, oxidizing gas atmosphere, reducing gas atmosphere or combined atmosphere of at least two of them. Alternatively, so-called reflow sputtering method may be adopted in which thermal treatment is carried out during the sputtering of Cu. By such treatment, the EM characteristics of the Cu interconnection can be improved.

Figure 28:
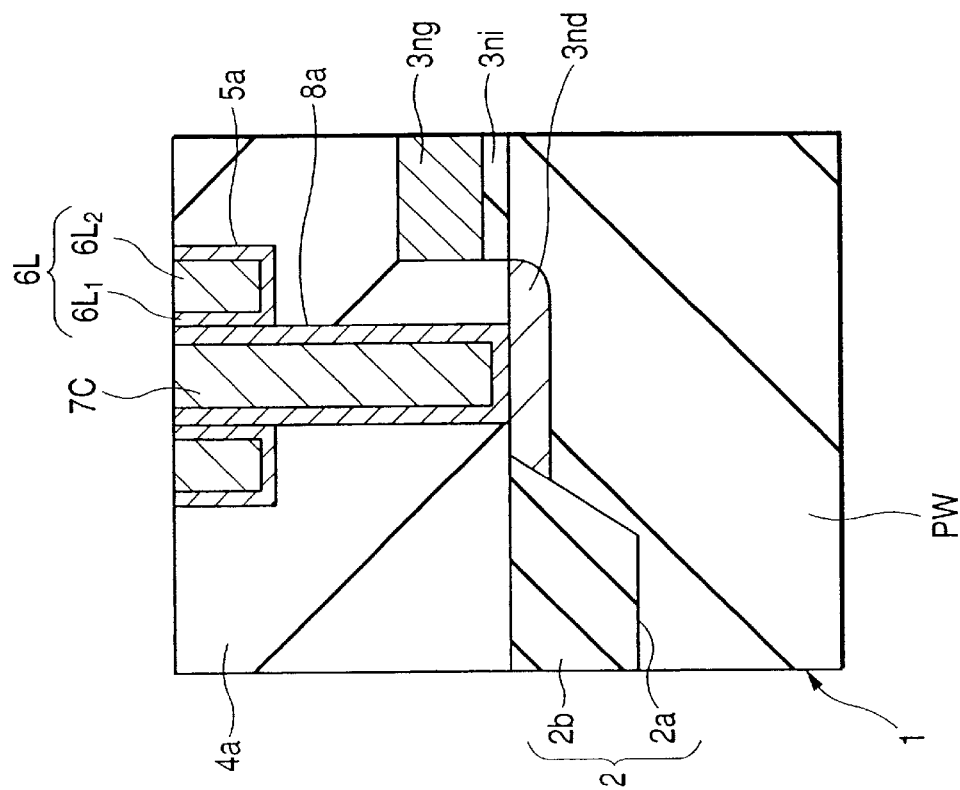
FIG. 28 is a fragmentary cross-sectional view illustrating the semiconductor integrated circuit device during its fabrication step subsequent to the step of FIG. 25.

The semiconductor substrate 1 is then subjected to CMP treatment to remove the thick conductor film 6L2 and thin conductor film 6L1 on the interlayer insulating film 4a at portions other than the interconnection groove 5a, whereby as is illustrated in FIG. 28, the first-layer interconnection 6L is formed in the interconnection groove 5a and at the same time, connecting conductor 7C is formed Prior to or subsequent to the CMP treatment, the semiconductor substrate 1 may be subjected to thermal treatment. At this time, the thermal treatment is carried out in an inert gas atmosphere, oxidizing gas atmosphere, reducing gas atmosphere or the combined atmosphere of at least two of them. In the thermal treatment step after the CMP treatment, the growth of the Cu grains of the thick conductor film 6L2 is accelerated to improve the EM resistance and the surface of it is planarized by removing the damage or oxide film which has appeared on the surfaces of the thin conductor film 6L1 and thick conductor film 6L2 upon the CMP treatment. The surface stains on the insulating film 4a are also removed and reduced, whereby the reliability of the interconnection can be improved, The buried interconnection as illustrated in FIG. 28 may be formed, for example, as follows:

First, as illustrated in FIG. 29, the connecting hole 8a by which a part of the upper surface of the semiconductor substrate 1 is exposed is formed in the interlayer insulating film 4a by the photolithography and dry etching techniques.

Then, as illustrated in FIG. 30, the connecting conductor portion 7C made of, for example, tungsten is formed by the selective CVD method in the connecting hole 8a in such a way that the upper surface of the connecting conductor portion 7C substantially coincides with that of the interlayer insulating film 4a. The material of the connecting conductor portion 7C is not limited to tungsten, but various materials such as tungsten alloy, Al or Al alloy may be used instead.

Figure 31:
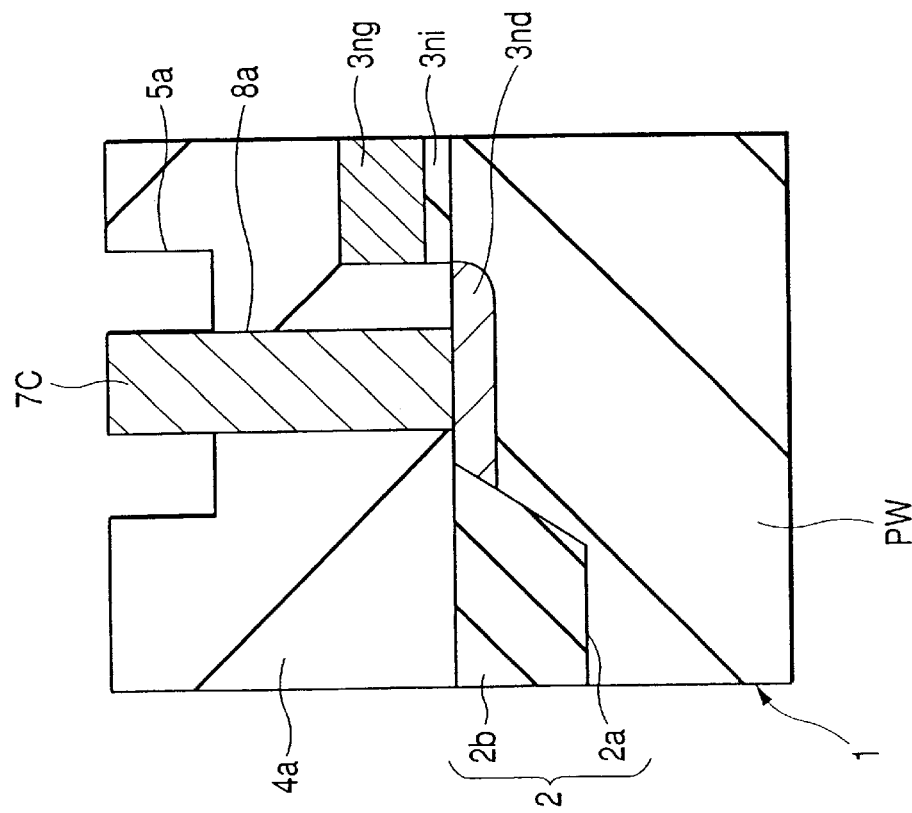
FIG. 31 is a fragmentary cross-sectional view illustrating the semiconductor integrated circuit device during its fabrication step subsequent to the step of FIG. 29.

As illustrated in FIG. 31, the interconnection groove 5a is then formed in the interlayer insulating film 4a by the photolithography and dry etching techniques. At this time, the upper part of the connecting conductor portion 7C is exposed in the interconnection groove 5a.

To the surface of the interlayer insulating film 4a including the interconnection groove 5a and the exposed surface of the connecting conductor portion 7C, the thin conductor film 6L1 made of, for example, TiN is adhered by the sputtering method or the like as illustrated in FIG. 32. This thin conductor film 6L1 is made of a material having a function of improving the adhesion between the first-layer interconnection and the interlayer insulating film 4a and also a function of suppressing, as a barrier, the diffusion of component atoms of the thick conductor film. The material of the thin conductor film is not limited to TiN, but various materials can be used instead. Examples of the material include tungsten, Ti, Ta, WN, WSiN, TiSiN, TaN and TaSiN.

To the thin conductor film 6L, the thick conductor film 6L2 made of, for example, Cu is then adhered by the CVD method, sputtering method, plating method or the like. It is desired, upon the formation of Cu, to adopt a method which permits the formation of as small an overhang as possible and has good step coverage. In the sputtering method, for example, a sputtering device which can set the distance between the target and semiconductor wafer to be larger than the radius of the semiconductor wafer is desirable. The material of the thick conductor film 6L2 is not limited to Cu, but various materials such as Cu alloy, Al, Al alloy, tungsten or tungsten alloy can be used instead.

When the above-described conductor film for interconnection is formed by the sputtering method, the component atoms (ex. Cu) of the thick conductor film are fluidized and then, supplied and buried sufficiently in the interconnection groove 5a particularly by subjecting the semiconductor substrate 1 to thermal treatment. At this time, the thermal treatment is carried out in an inert gas atmosphere, oxidizing gas atmosphere, reducing gas atmosphere or a combined atmosphere of at least two of them. Alternatively, a so-called reflow sputtering method may be adopted in which thermal treatment is carried out during the sputtering of Cu.

The semiconductor substrate 1 is then subjected to CMP treatment to remove the thick conductor film 6L2 and thin conductor film 6L1 on the interlayer insulating film 4a at portions other than the interconnection groove 5a, whereby as illustrated in FIG. 28, the first-layer interconnection 6L is formed in the interconnection groove 5a and at the same time, the connecting conductor 7C is formed.

Prior to or subsequent to the CMP treatment, the semiconductor substrate 1 may be subjected to thermal treatment. At this time, the thermal treatment is carried out in an inert gas atmosphere, oxidizing gas atmosphere, reducing gas atmosphere or a combined atmosphere of at least two of them. In the thermal treatment step, the growth of the Cu grains of the thick conductor film 6L2 is accelerated to improve the EM resistance and the surfaces of the thin conductor film 6L1 and thick conductor film 6L2 are planarized by removing the damage or oxide film which has appeared on their surfaces upon the CMP treatment. The surface stains on the insulating film 4a are also removed and reduced, whereby the reliability of the interconnection can be improved.

The buried interconnection structure as described above may be applied to the second-layer interconnection 9L as illustrated in FIG. 33. More specifically, the connecting conductor portion 10C is formed of a conductor film such as tungsten, tungsten alloy, Al, Al alloy, Cu or Cu alloy by the selective CVD method.

According to the third embodiment, similar advantages to those of the first embodiment are available.

(Fourth Embodiment)

Figure 34:
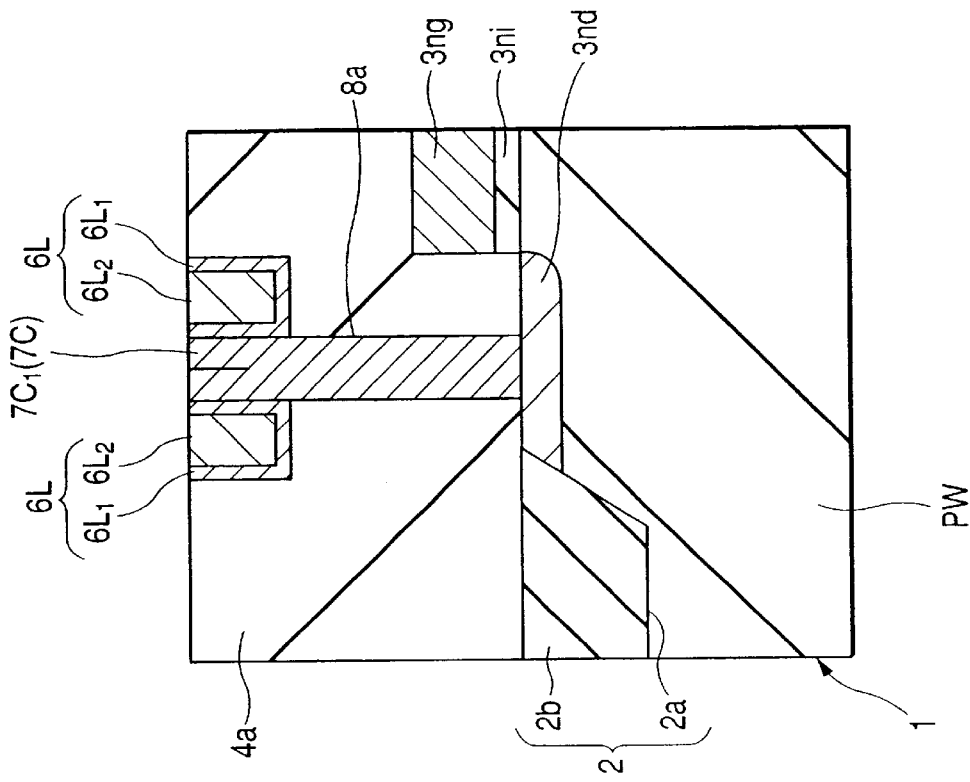
FIG. 34 is a fragmentary cross-sectional view illustrating a semiconductor integrated circuit device according to another embodiment of the present invention.
Figure 35:
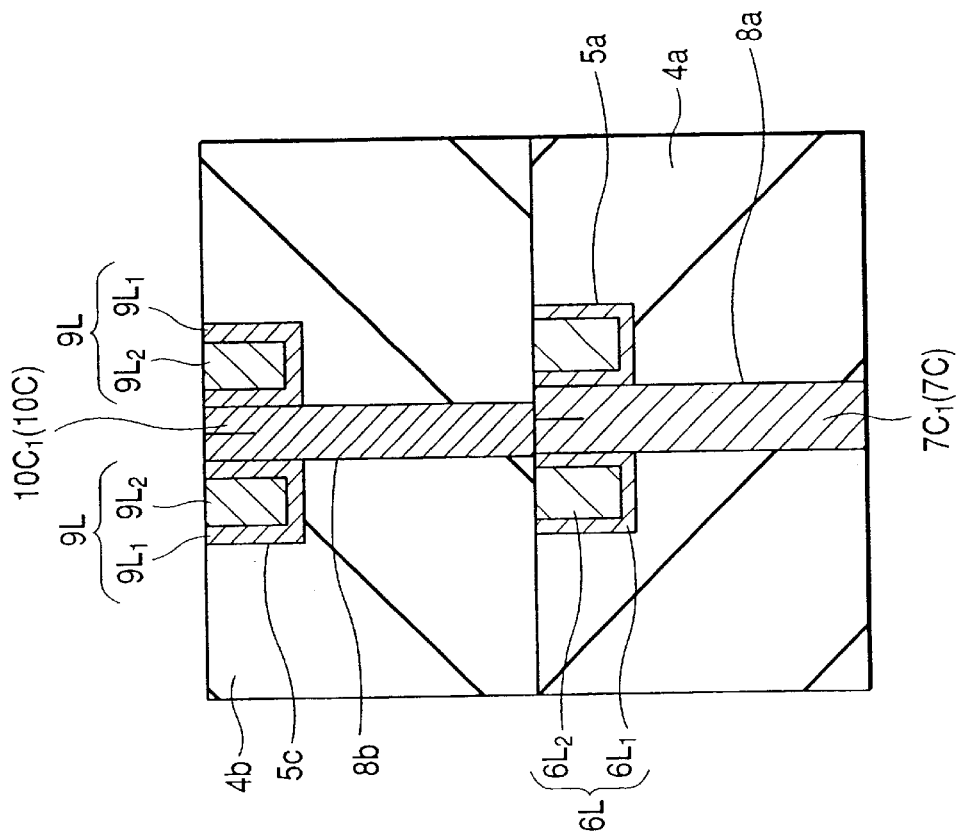
FIG. 35 is a fragmentary cross-sectional view of a semiconductor integrated circuit device according to another embodiment of the present invention.

FIGS. 34 and 35 are fragmentary cross-sectional views of the semiconductor integrated circuit device according to the fourth embodiment of the present invention.

In this fourth embodiment, as illustrated in FIGS. 34 and 35, the connecting conductor portions 7C and 10C are formed of thin conductor films 7C1 and 10C1, respectively, in other words, the connecting holes 8a and 8b are buried with thin conductor films 7C and 10C1, respectively.

The thin conductor films 7C1 and 10C1 are made of a material having a function of improving the adhesion between the connecting conductor portions 7C and 10C and the interlayer insulating films 4a and 4b, respectively and also a function of suppressing, as a barrier, the diffusion of component atoms of the interconnection. Examples of the material include tungsten, TiN, Ti, Ta, WN, WSiN, TiSiN, TaN and TaSiN.

The connecting hole 8a has a diameter of, for example, about 0.1 to 0.4 µm, and preferably is about 0.2 µm. The aspect ratio of the connecting hole 8a is about 2 to 10 and preferably is less than about 5 in consideration of the favorable burying of the connecting conductor portion.

The connecting hole 8b has a diameter of, for example, about 0.1 to 0.4 µm, and preferably is about 0.2 µm. The aspect ratio of the connecting hole 8b is about 2 to 10 and preferably is less than about 5 in consideration of the favorable burying of the connecting conductor portion.

The interconnection structure is not limited to the structure as illustrated in FIG. 34 or 35, but various structures can be adopted. For example, the structure as described in the above first embodiment with reference to FIGS. 3 to 5 may be adopted.

Such buried interconnection is fabricated as described in the first embodiment with reference to FIGS. 8 to 12. More specifically, the fabrication process of the first-layer interconnection 6L can be applied as one example.

First, the connecting hole 8a is made in the interlayer insulating film 4a and then, the thin conductor film 7C1 is adhered to the interlayer insulating film 4a by the sputtering method or the like so as to bury the thin conductor film in the connecting hole 8a. The semiconductor substrate 1 is then subjected to the CMP method or the like to remove the thin conductor film 7C1 at portions other than the connecting hole 8a, whereby the connecting conductor portion 7C composed only of the thin conductor film 7C1 is formed in the connecting hole 8a. The interconnection groove 5a is then formed in the interlayer insulating film 4a, followed by the adhesion of the interconnection conductor film to the interlayer insulating film 4a by the sputtering method, CVD method, plating method or the like so as to bury the interconnection conductor film in the interconnection groove 5a. The semiconductor substrate 1 is then subjected to the CMP method or the like to remove the interconnection conductor film at portions other than the interconnection groove 5a, whereby the first-layer interconnection 6L is formed in the interconnection groove 5a.

Subsequent to the formation of the thick conductor film 6L1 or CMP treatment, the semiconductor substrate 1 may be subjected to thermal treatment. At this time, the thermal treatment is carried out in an inert gas atmosphere, oxidizing gas atmosphere, reducing gas atmosphere or a combined atmosphere of at least two of them. By the thermal treatment, the growth of the Cu grains of the thick conductor film 6L2 can be accelerated to improve the EM resistance and the surfaces of the thin conductor film 6L1 and thick conductor film 6L2 can be planarized by removing the damage or oxide film which has appeared on their surfaces during the CMP treatment. The surface stains on the insulating film 4a are also removed and reduced, whereby the reliability of the interconnection can be improved.

According to the fourth embodiment, similar advantages to those of the first embodiment are available.

(Fifth Embodiment)

Figure 37:
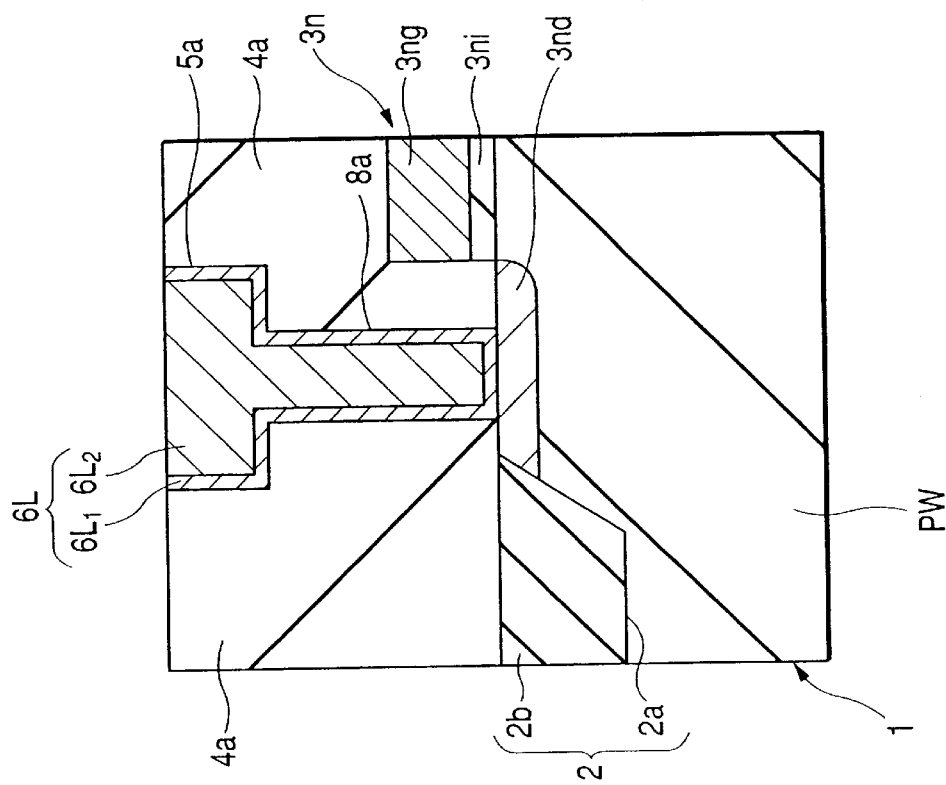
FIG. 37 is a fragmentary enlarged cross-sectional view illustrating the semiconductor integrated circuit device of FIG. 36.
Figure 36:
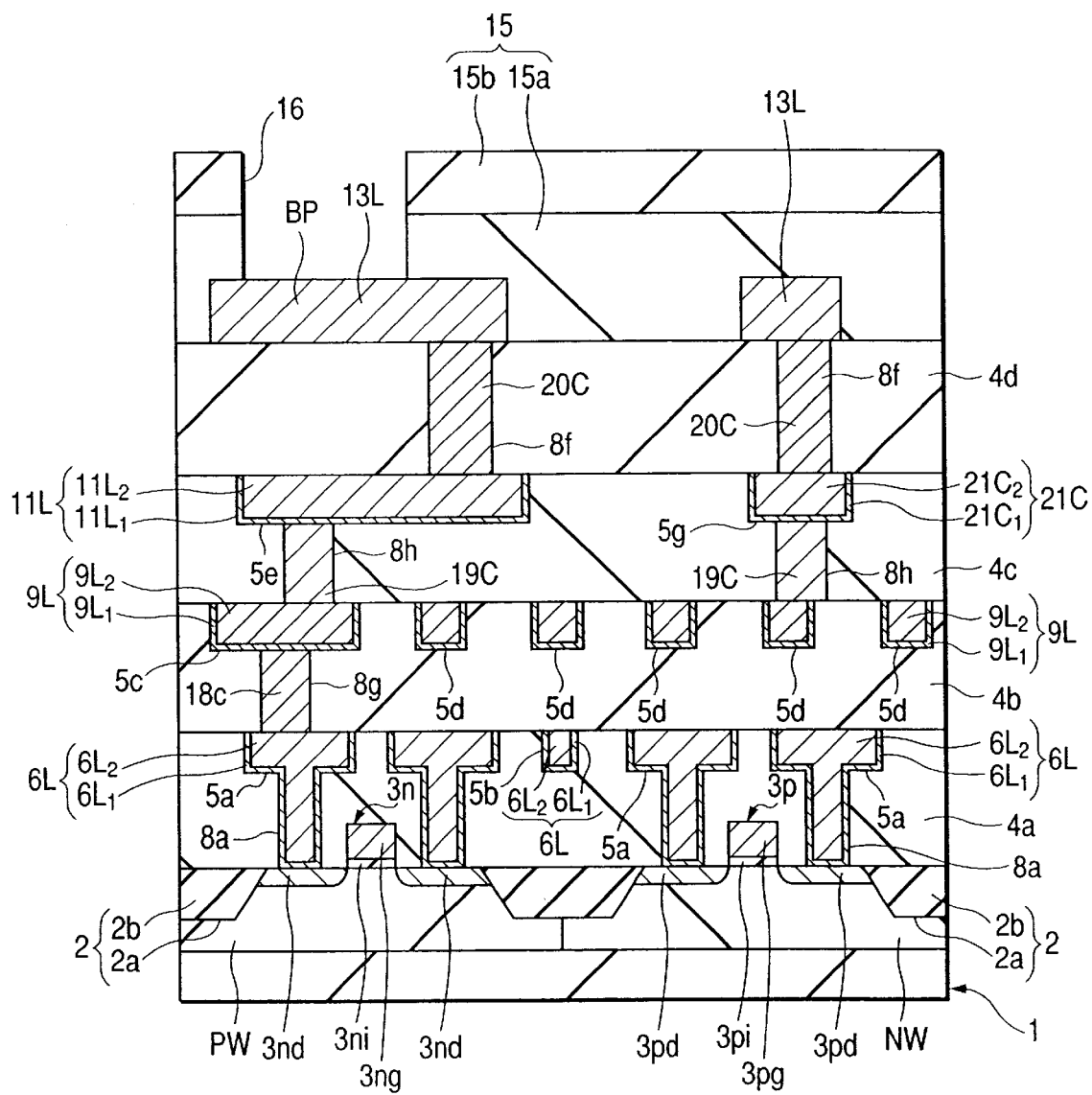
FIG. 36 is a fragmentary cross-sectional view illustrating a semiconductor integrated circuit device according to another embodiment of the present invention.
Figure 38:
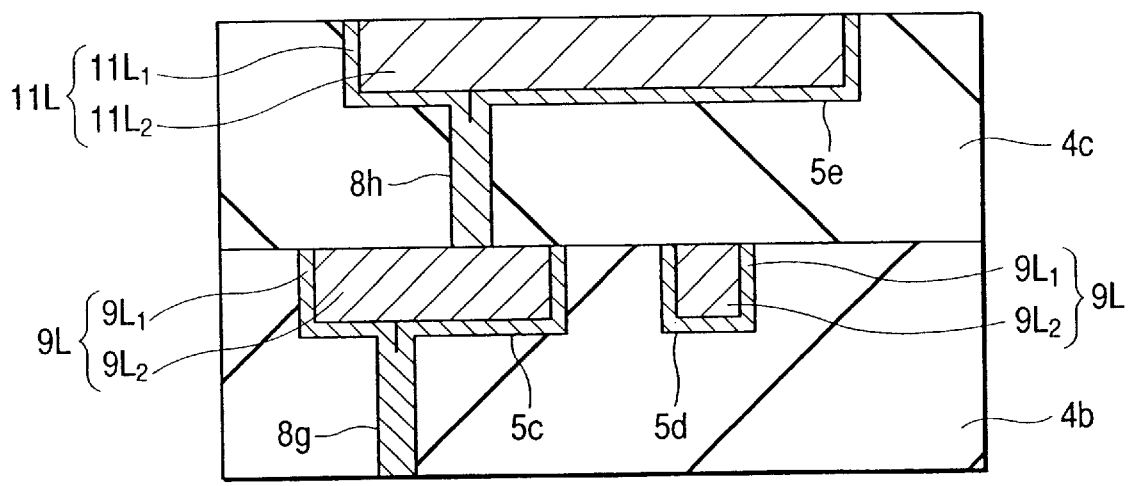
FIG. 38 is a fragmentary enlarged cross-sectional view illustrating a modification example of the semiconductor integrated circuit device illustrated in FIG. 37.
Figure 39A:
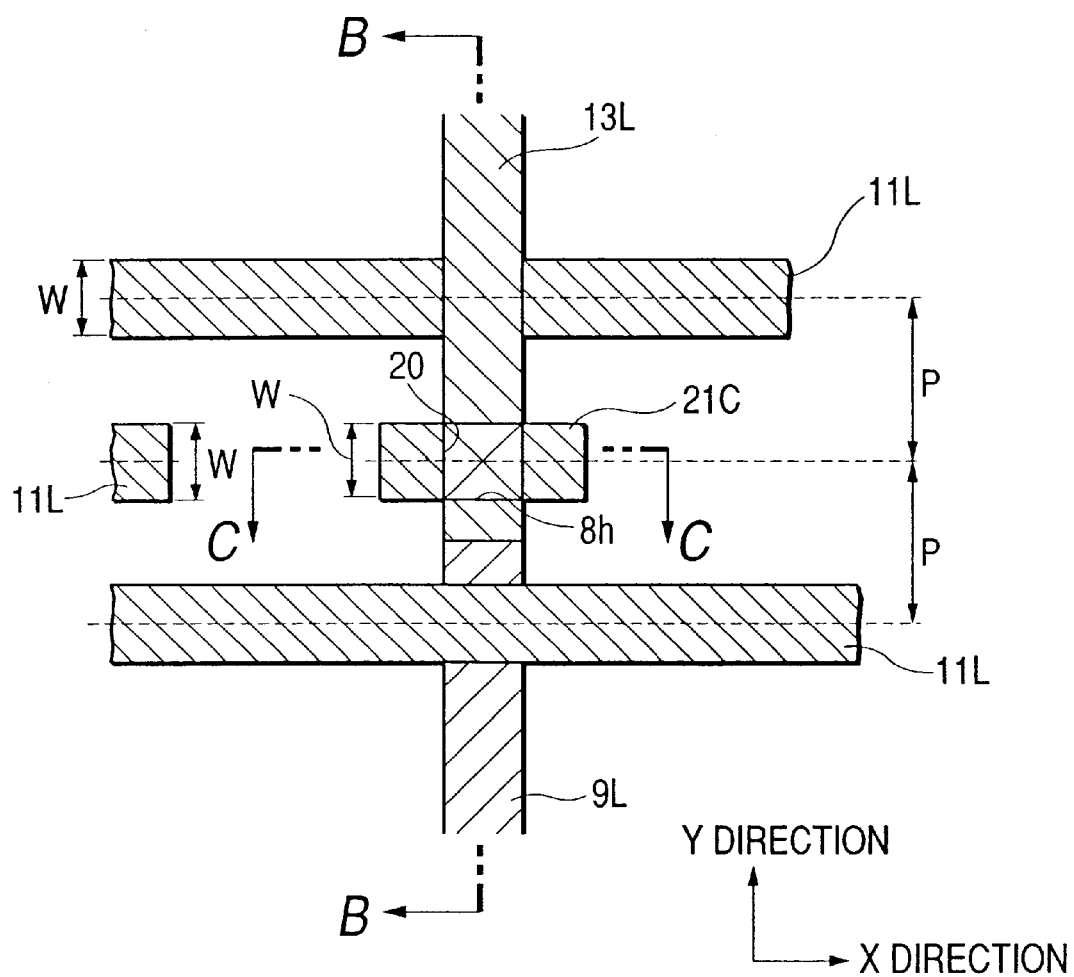
FIG. 39(A) is a fragmentary plain view illustrating the semiconductor integrated circuit device illustrated in FIG. 37.
Figure 41:
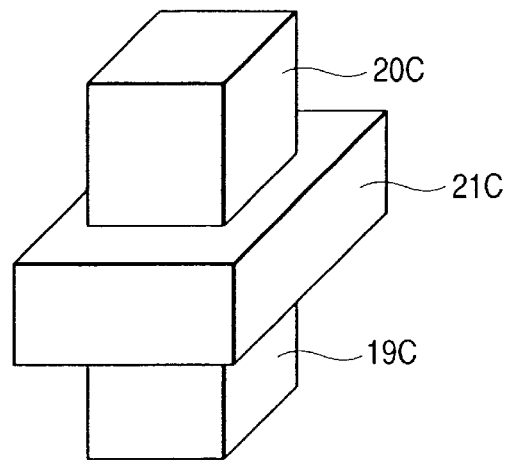
FIG. 41 is a schematic view illustrating an example of a modification of FIG. 40.
Figure 42:
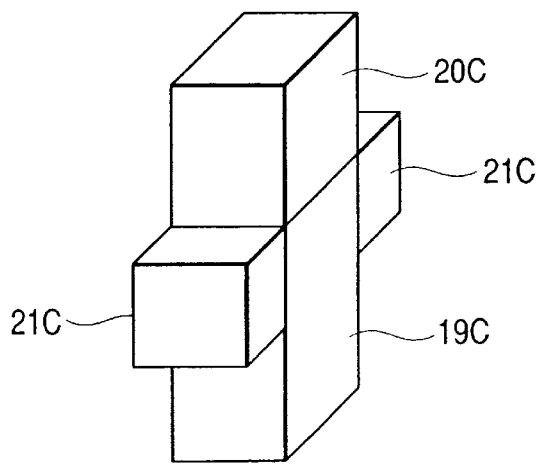
FIG. 42 is a schematic view illustrating an example of a modification of FIG. 40.
Figure 43:
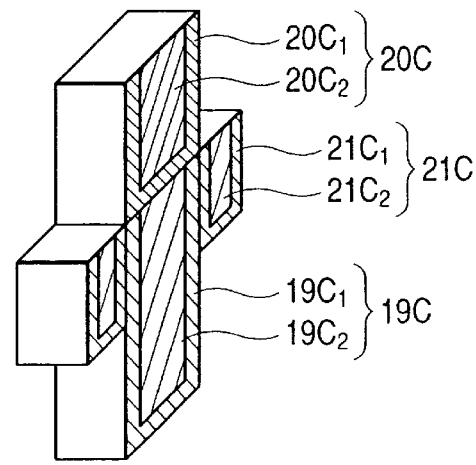
FIG. 43 is a schematic view illustrating an example of a modification of FIG. 40.

FIG. 36 is a fragmentary cross-sectional view of the semiconductor integrated circuit device according to the fifth embodiment of the present invention; FIG. 37 is a fragmentary enlarged cross-sectional view of the semiconductor integrated circuit device of FIG. 36; FIG. 38 is a fragmentary enlarged cross-sectional view illustrating a modification of the semiconductor integrated circuit device illustrated in FIG.37; FIG. 39 is a fragmentary enlarged cross-sectional view of the semiconductor integrated circuit illustrated in FIG. 37; FIG. 40 is a fragmentary schematic view illustrating the semiconductor integrated circuit device of FIG. 39; FIG. 41 is a schematic view illustrating a modification of FIG. 40; FIGS. 42 and 43 are schematic views illustrating a modification of FIG. 40; and FIGS. 44 through 48 are fragmentary enlarged cross-sectional views illustrating a modification of the semiconductor circuit device of FIG. 36.

The structure of the semiconductor circuit device according to the fifth embodiment will be described with reference to FIGS. 36 through 48. The whole basic structure of the fifth embodiment is, for example, as follows:

First, as the component material of the first-layer interconnection 6L, conductor materials other than Cu and Cu alloy, for example, tungsten, tungsten alloy, Al and Al alloy are used. This makes it possible to prevent the direct contact of a Cu interconnection with the semiconductor substrate 1, whereby device failure caused by the diffusion of Cu atoms toward the semiconductor substrate 1 can be suppressed and the reliability of the semiconductor circuit device can be improved. In addition, it is possible to reduce the diffusion of Cu atoms toward the semiconductor substrate 1 by keeping the second and third interconnection layers 9L and 11L formed of Cu interconnection apart from the semiconductor substrate 1.

Secondly, Al or Al alloy, for example, is used as the component material for the uppermost fourth-layer interconnection 13L, which makes it possible to follow the conventional connecting technique of a bonding wire or forming technique of a bump electrode. More specifically, for the connection of the uppermost interconnection layer with a bonding wire or bump electrode, it becomes possible to use the conventional technique for the bonding of the bonding wire and/or bump electrode as is conventionally used when Al or Al alloy is used as the uppermost wiring material. It is therefore possible to introduce the fabrication line of the semiconductor integrated circuit device having a buried interconnection structure composed of a Cu base material without a technical change of the fabrication step (wire bonding step or bump-electrode formation step). Accordingly, the cost reduction of the semiconductor integrated circuit device having a buried interconnection composed of a Cu base material can be promoted and a shortening of the time for the fabrication and development of the device can also be promoted.

Thirdly, Cu or Cu alloy, for example, is employed as the component material of the interconnection layer (second-layer interconnection 9L and third-layer interconnection 11L) between the uppermost interconnection layer and the lowest interconnection layer, which makes it possible to reduce the interconnection resistance or interconnection capacity and improve the signal propagation rate in the semiconductor integrated circuit device, thereby improving the operation rate.

Fourthly, the connecting conductor portion 18C or 19C which connects between the interconnection layers composed of a Cu base material is constituted by a material composed of, for example, tungsten, TiN, Ti, Ta, WN, WSiN, TiSiN, TaN or TaSiN, whereby a conductor film can be favorably buried in the minute connecting hole 8g or 8h, thereby making it possible to improve the reliability of the electrical connection between interconnection layers.

Fifthly, the fourth-layer interconnection 13L made of an Al base material and the third-layer interconnection 11L made of a Cu base material are not brought into direct contact and a barrier layer (connecting conductor portion 20C or the like) is interposed therebetween, which makes it possible to suppress the phenomenon of forming an alloy film having a high specific resistance which occurs by the direct contact between the Al-base material and Cu-base material, thereby improving the propagation rate of signals which pass through the interconnection.

Sixthly, the connecting conductor portion 19C and connecting conductor portion 20C are electrically connected by disposing a connecting conductor portion (connecting conductor portion for relay) 21C, which has been formed longer than the connecting conductor portion 19C or 20C along at least the lengthwise direction of the interconnection to have a longer plane, in the interconnection layer at the position where the connecting conductor portion 19C and connecting conductor portion 20C are to be connected. This makes it possible to relatively enlarge the plane area of the connecting groove 5g wherein the connecting conductor portion 21C is to be formed and to bury the interconnection conductor film favorably in the groove. In addition, the plane alignment margin with the connecting conductor portion 19C or connecting conductor portion 20C in the lengthwise direction of the interconnection can be enlarged. The reliability of the connection between the upper connecting conductor portion 19C and lower connecting conductor portion 20C can be improved.

Each component of the semiconductor integrated circuit device according to the fifth embodiment will be described in detail.

The first-layer interconnection 6L (or first level layer wiring line) formed by being buried in the interconnection groove 5a or 5b is composed of the relatively thin conductor film 6L1 at its bottom and sides and the relatively thick conductor film 6L2 surrounded by the thin conductor film 6L1. The thin conductor film 6L1 is made of a material having a function of improving the adhesion between the first-layer interconnection 6L and the interlayer insulating film 4a and a function of suppressing, as a barrier, the diffusion of the component atoms of the thick conductor film 6L2. Examples include tungsten, TiN, Ti, Ta, WN, WSiN, TiSiN, TaN and TaSiN.

When tungsten or the like is used as a material for constituting the thin conductor film 6L1, the interconnection resistance can be reduced compared with the case where TiN, Ti, Ta, WN, WSiN, TiSiN, TaN or TaSiN is used. Although there is no particular limitation, the thin conductor film 6L1 is made of, for example, tungsten in this fifth embodiment.

The thick conductor film 6L2 is a member which constitutes the main body of the first-layer interconnection 6L and is made of, for example, a low-resistance material such as Al, Al alloy, tungsten or tungsten alloy. Although there is no particular limitation, the thick conductor film 6L2 is made of, for example, tungsten in this fifth embodiment.

The structure of the first-layer interconnection 6L is not limited to the structure as illustrated in FIG. 36 or 37, but various structures can be used instead. The structures as described with reference to FIGS. 3 through 5 in the first embodiment may also be adopted. More specifically, there are structures wherein a cap conductor film is disposed on the thick conductor film 6L2 and a thin conductor film 6L1, wherein a cap conductor film is disposed on the thick conductor film 6L2 and the upper surface of the cap conductor film substantially agrees with the upper surface of the interlayer insulating film 4a; wherein the interconnection is composed only of the thick conductor film 6L2 and wherein a cap conductor is disposed on the upper surface of the interconnection composed only of the thick conductor film 6L2. The cap conductor film is made of, for example, tungsten, TiN, Ti, Ta, WN, WSiN, TiSiN, TaN or TaSiN.

The first-layer interconnection 6L of the interconnection groove 5a is electrically connected with the semiconductor region 3nd of the nMOS3n or the semiconductor region 3pd of the pMOS3p through the connecting hole 8a. In this fifth embodiment, an interconnection forming conductor film is integrally buried in the interconnection groove 5a and connecting hole 8a.

Such a fabrication process of the first-layer interconnection 6L is similar to the conventional fabrication process of a buried interconnection which will be described below. More specifically, after forming the interconnection grooves 5a and 5b and connecting hole 8a in the interlayer insulating film 4a by respective photolithography techniques and dry etching techniques, the thin conductor film 6L1 made of, for example, tungsten is adhered by the sputtering method. Then, on the thin conductor film 6L1, the thick conductor film 6L2 made of, for example, tungsten is formed by the CVD method or the like. This makes it possible to bury the conductor film in even the minute connecting hole 8a favorably. The conductor film at portions other than interconnection grooves 5a and 5b and connecting hole 8a is removed by the CMP treatment, whereby the first-layer interconnection 6L a buried structure is formed.

The second-layer interconnection 9L (or second level layer wiring line) formed by being buried in the interconnection groove 5c or 5d is composed of the relatively thin conductor film 9L1 at its bottom and sides and the relatively thick conductor film 9L2 surrounded by the thin conductor film 9L1. The thin conductor film 9L1 is made of a material having a function of improving the adhesion between the second-layer interconnection 9L and the interlayer insulating film 4b and a function of suppressing, as a barrier, the diffusion of the component atoms of the thick conductor film 9L2. Examples include tungsten, TiN, Ti, Ta, WN, WSiN, TiSiN, TaN and TaSiN.

When tungsten or the like is used as a material for constituting the thin conductor film 9L1, the interconnection resistance can be reduced compared with the case where TiN, Ti, Ta, WN, WSiN, TiSiN, TaN or TaSiN is used. Although there is no particular limitation, the thin conductor film 9L1 is composed of, for example, TiN in this fifth embodiment.

The thick conductor film 9L2 is a member which constitutes the main body of the second-layer interconnection 9L and is made of, for example, a low-resistance material such as Cu or Cu alloy. The structure of the second-layer interconnection 9L is not limited to the structure as illustrated in FIG. 36, but various structures can be used instead. The structures as described with reference to FIGS. 3 through 5 in the first embodiment may also be adopted. More specifically, there are structures wherein a cap conductor film is disposed on the thick conductor film 9L2 and thin conductor film 9L1, wherein a cap conductor film is disposed on the thick conductor film 9L2 and the upper surface of the cap conductor film substantially agrees with the upper surface of the interlayer insulating film 4b, wherein the interconnection is composed only of the thick conductor film 9L2 and wherein a cap conductor is disposed on the upper surface of the interconnection composed only of the thick conductor film 9L2. The cap conductor film is made of, for example, tungsten, TiN, Ti, Ta, WN, WSiN, TiSiN, TaN or TaSiN.

The second-layer interconnection 9L in the interconnection groove 5c is electrically connected with the first-layer interconnection 6L through the connecting hole 8g. The connecting hole 8g is formed from the bottom surface of the interconnection groove 5c toward the upper surface of the first-layer interconnection 6L so as to expose a part of the upper surface of the first-layer interconnection 6L. In the connecting hole, there is disposed the connecting conductor portion 18C made of, for example, tungsten, a tungsten alloy, Al or an Al alloy.

The third-layer interconnection 11L (or third level layer wiring line) formed by being buried in the interconnection groove 5e is similar in structure to the second-layer interconnection 9L and is composed of the relatively thin conductor film 11L1 at its bottom and sides and the relatively thick conductor film 11L2 surrounded by the thin conductor film 11L1. The thin conductor film 11L1 is made of a material having a function of improving the adhesion between the third-layer interconnection 11L1 and the interlayer insulating film 4c and a function of suppressing, as a barrier, the diffusion of the component atoms of the thick conductor film 11L2. Examples include tungsten, TiN, Ti, Ta, WN, WSIN, TiSiN, TaN and TaSiN.

When tungsten or the like is used as a material for constituting the thin conductor film 11L1, the interconnection resistance can be reduced compared with the case where TiN, Ti, Ta, WN, WSiN, TiSiN, TaN or TaSiN is used. Although there is no particular limitation, the thin conductor film 11L1 is composed of, for example, TiN in this fifth embodiment.

The thick conductor film 11L2 is a member which constitutes the main body of the third-layer interconnection 11L and it is made of, for example, a low-resistance material such as Cu or Cu alloy. The structure of the third-layer interconnection 11L is not limited to the structure as illustrated in FIG. 36, but various structures can be used instead. The structures as described with reference to FIGS. 3 through 5 in the first embodiment may also be adopted. More specifically, there are structures wherein a cap conductor film is disposed on the thick conductor film 11L2 and thin conductor film 11L1, wherein a cap conductor film is disposed on the thick conductor film 11L2 and the upper surface of the cap conductor film substantially agrees with the upper surface of the interlayer insulating film 4c, wherein the interconnection is composed only of the thick conductor film 11L2 and wherein a cap conductor film is disposed on the upper surface of the interconnection composed only of the thick conductor film 11L2. The cap conductor film is made of, for example, tungsten, TiN, Ti, Ta, WN, WSiN, TiSiN, TaN or TaSiN.

The third-layer interconnection 11L of the interconnection groove 5e is electrically connected with the second-layer interconnection 9L through the connecting hole 8h. The connecting hole 8h is formed from the bottom surface of the interconnection groove 5e toward the upper surface of the second-layer interconnection 9L so as to expose a part of the upper surface of the second-layer interconnection 9L. In the connecting hole 8h, there is disposed the connecting conductor portion 19C made of, for example, tungsten, a tungsten alloy, Al or an Al alloy. As illustrated in FIG. 39(A) which will be described later, the second-layer interconnection 9L is disposed, extending in the Y direction and the pitch between second-layer interconnections 9L is designed to be a predetermined value in the X direction. The third-layer interconnection 11L is disposed, extending, for example, in the X direction transverse to the Y direction and a pitch between the third-interconnection layers 11L is designed to be a predetermined value in the Y direction.

The fabrication process of such second-layer interconnection 9L or third-layer interconnection 11L is similar to the conventional process of a buried interconnection. The fabrication process of the second-layer interconnection 9L will next be described as one example.

First, in the interlayer insulating film 4b, the interconnection grooves 5c and 5d and connecting hole 8g are formed by respective photolithography techniques and etching techniques, followed by the formation of the connecting conductor portion 18C by the selective growth of a conductor film made of, for example, tungsten by the selective CVD method or the like in the connecting hole 8g.

Then, the thin conductor film 9L1 made of, for example, TiN is adhered by the sputtering method, and on the thin conductor film 9L1, the thick conductor film 9L2 made of, for example, Cu or Cu alloy is formed by the sputtering method, CVD method, plating method or the like. After this step, Cu atoms may be filled favorably in the interconnection grooves 5c and 5d by the thermal treatment, whereby the conductor film can be buried in the minute connecting hole 8g favorably.

The semiconductor substrate 1 is then subjected to the CMP treatment to remove the conductor film at portions other than the interconnection grooves 5c and 5d, whereby the second-layer interconnection 9L of a buried structure is formed. Subsequent to the formation of the thick conductor film 9L2 or CMP treatment, the semiconductor substrate 1 may be subjected to thermal treatment. At this time, the thermal treatment is carried out in an inert gas atmosphere, oxidizing gas atmosphere, reducing gas atmosphere or a combined atmosphere of at least two of them. The thermal treatment makes it possible to accelerate the growth of the Cu grains of the thick conductor film 6L2, thereby improving the EM resistance; remove the damage or oxide film which has appeared on the surfaces of the thin conductor film 6L1 and thick conductor film 6L2 during the CMP treatment, thereby planarizing their surfaces; and remove or reduce the surface stains on the insulating film 4a, whereby the reliability of the interconnection can be improved.

The buried structure of the connecting hole 8g or 8h is not limited to the structure as illustrated in FIG. 36, but various structures can, be adopted instead. The structure as illustrated in FIG. 38 may be applied for example. In FIG. 38, the connecting holes 8g and 8h are buried with the thin conductor films 9L1 and 11L1, respectively. In this case, the same material as described above can be used as a constituting material of the thin conductor film 11L1. Examples include tungsten, TiN, Ti, Ta, WN, WSIN, TiSiN, TaN and TaSiN. The thick conductor films 9L2 and 11L2 are each made of, for example, Cu or Cu alloy.

The connecting holes 8g and 8h may each be composed of a relatively thin conductor film disposed at its bottom and sides and a relatively thick conductor film surrounded by the thin conductor film. In this case, the thin conductor film is made of, for example, tungsten or TiN, while the thick conductor film is made of, for example, tungsten.

In the upper part (third-layer interconnection) of the interlayer insulating film 4c, the above-described interconnection groove 5e and the connecting groove 5g having the same depth with that of the groove 5e are formed. The connecting groove 5g is formed simultaneously with the interconnection groove 5e.

The connecting groove 5g is formed, as described above, so as to extend along the lengthwise direction of the interconnection, which makes it possible to bury a conductor film in the connecting groove 5g favorably. More specifically, when the conductor film is buried in the interconnection groove 5e and at the same time, in the connecting groove 5g in the same inter-connection layer, if the plane shape and size of the connecting groove 5g are formed equal to those of the upper surface of the connecting conductor portion 19C which is disposed below the connecting groove 5g, minuteness of the connecting groove 5g sometimes prevents a sufficient burying of the conductor film therein. In order to avoid such inconvenience, the plane shape of the connecting groove 5g is designed to extend along the lengthwise direction of the interconnection and to achieve good burying of the conductor film while preventing a reduction in the packaging density of the interconnection. Such a structure makes it possible to carry out good connection between the upper and lower interconnection layers.

Figure 39B:
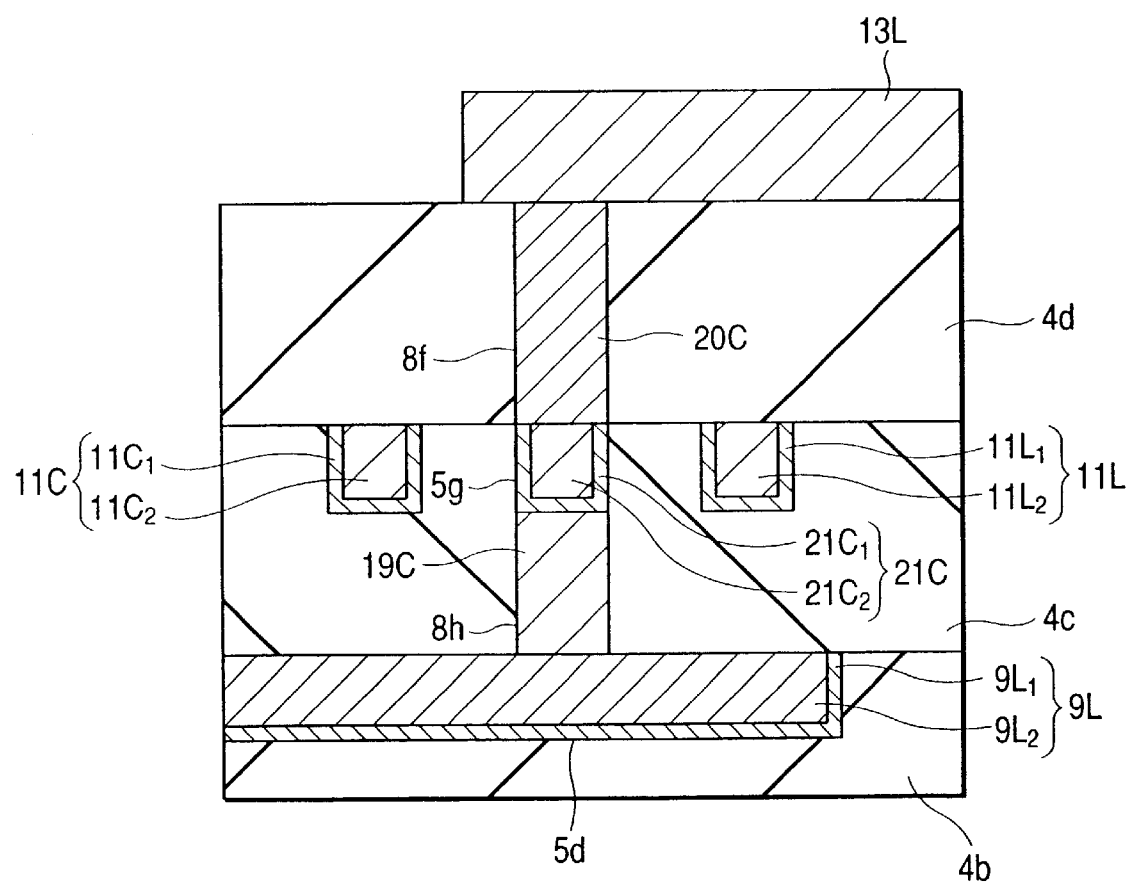
FIGS. 39(B) and 39(C) are fragmentary enlarged cross-sectional views illustrating the semiconductor integrated circuit device of FIG. 39(A)
Figure 39C:
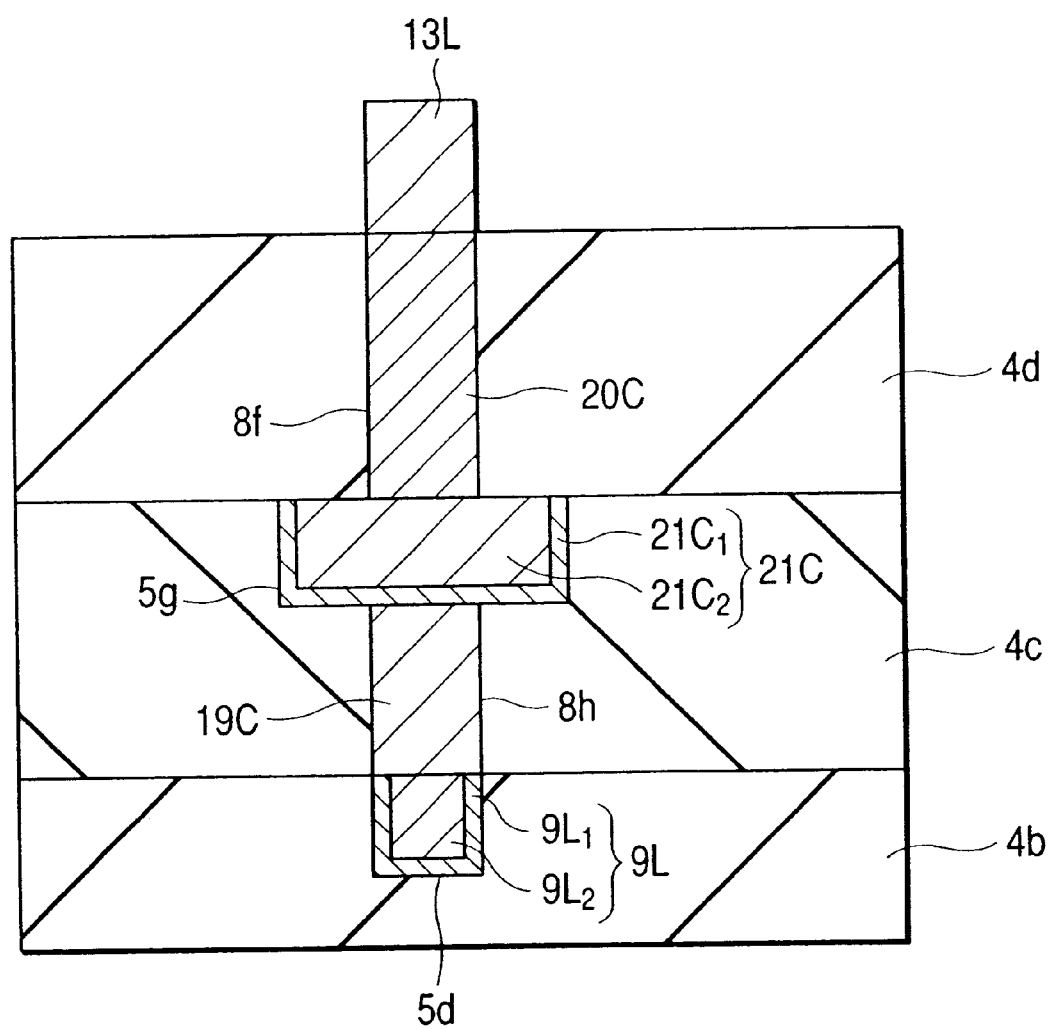
Figure 40:
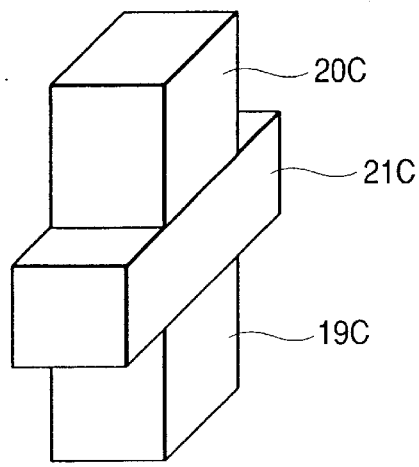
FIG. 40 is a fragmentary schematic view illustrating the semiconductor integrated circuit device of FIG. 39.

In the connecting groove 5g, the connecting conductor portion 21C is disposed as illustrated in FIGS. 36, 39 and 40. FIG. 39(A) is a fragmentary plane view partially illustrating the second-layer interconnection 9L (or second level layer wiring line) to fourth-layer interconnection 13L (or fourth level layer wiring line); FIG. 39(B) is a fragmentary cross-sectional view taken along a line B—B of FIG. 39(A); and FIG. 39(C) is a fragmentary cross-sectional view taken along a line C—C of FIG. 39(A). Incidentally, FIG. 39(B) is a cross-sectional view, cut vertically relative to the paper, of the second-layer interconnection 9L to the fourth-layer interconnection 13L, which are illustrated on the right side of FIG. 36.

The connecting conductor portion 21C has a similar structure to the third-layer interconnection 11L and is composed of the relatively thin conductor film 21C1 disposed at its side and bases and the relatively thick conductor film 21C2 surrounded by the thin conductor film 21C1. In short, the connecting conductor portion 21C is composed of the interconnection W similar to the third-layer interconnection 11L. The thin conductor film 21C1 is made of a material having a function of improving the adhesion between the connecting conductor portion 21C and the interlayer insulating film 4c and also a function of suppressing, as a barrier, the diffusion of component atoms of the thick conductor film 21C2. Examples of the material include tungsten, TiN, Ti, Ta, WN, WSiN, TiSiN, TaN and TaSiN.

When the thin conductor film 21C1 is made of tungsten or the like, it becomes possible to reduce the interconnection resistance compared with the case where the film is made of TiN, Ti, Ta, WN, WSiN, TiSiN, TaN or TaSiN. Although there is no particular limitation, the thin conductor film 21C1 is formed of the same material and at the same time with that of the thin conductor film 11L1 of the third-layer interconnection 11L1 in this fifth embodiment. It is made of, for example, TiN.

The thick conductor film 21C2 is a member which constitutes the main body of the connecting conductor portion 21C and is made of a low resistance material such as Cu or a Cu alloy. The structure of the connecting conductor portion 21C is not limited to the structure shown in FIGS. 36 to 41, but various structures can be employed instead. The structure as described with reference to FIGS. 3 to 5 in the first embodiment may also be applied.

Described specifically, there are structures wherein a cap conductor film is disposed on the thick conductor film 21C2 and a thin conductor film 21C1, wherein a cap conductor film is disposed on the thick conductor film 21C2 and the upper surface of the cap conductor film substantially agrees with the upper surface of the interlayer insulating film 4c, wherein the interconnection is composed only of the thick conductor film 21C2 and wherein a cap conductor is disposed on the upper surface of the interconnection composed only of the thick conductor film 21C2. The cap conductor film is made of, for example, tungsten, TiN, Ti, Ta, WN, WSiN, TiSiN, TaN or TaSiN. As illustrated in FIGS. 39 and 40, the alignment margin of each of the upper and lower connecting conductor portions 19C and 20C can be made larger in the X direction by designing the plane shape of the connecting conductor portion 21C in the lengthwise direction (X direction) to be larger than the interconnection width in the Y direction. This makes it possible to increase the alignment margin of each of the upper and lower connecting conductor portions 19C and 20C in the X direction without increasing the interconnection pitch P of the third-layer interconnection 11L in the Y direction, leading to high densification and high integration of interconnection. In addition, the interconnection length in the lengthwise direction of the interconnection is at least the interconnection width. By increasing the interconnection length to be at most twice that of the interconnection width, the alignment margin can be increased without creating a dog bone effect and the burying margin can also be increased. The high integration can be accomplished without need for an increase in the interconnection pitch.

As illustrated in FIG. 41, it is also possible to enlarge the plane shape of the connecting conductor portion 21C so that it becomes long both in the lengthwise direction of the interconnection and in a direction crossing therewith (direction of the interconnection width, that is, Y direction). In this case, the lengthwise direction (X direction) of the interconnection is designed so as to be larger than the interconnection width direction, that is, the Y direction. In this case, the alignment margin of the upper and lower connecting conductor portions 19C and 20C can be increased in both the lengthwise and width directions of the interconnection. The alignment accuracy upon the formation of the connecting hole 8f to be buried with the connecting conductor portion 20C can be relaxed, which makes it possible to form the connecting hole 8f easily. Furthermore, it becomes possible to favorably connect the connecting conductor portion 20C and connecting conductor portion 21C even if the plane position of the connecting hole 8f is a little shifted from the designed value.

As illustrated in FIGS. 42 and 43, the structure as described in the first embodiment, that is, the structure in which the upper part of the connecting conductor portion 19C protrudes in the connecting conductor portion 21C may be applied. Such a structure is fabricated in a similar manner to that described in the first embodiment. More specifically, the connecting conductor portion 21C is formed in the connecting groove 5g by forming the connecting conductor portion 19C by being buried in the connecting hole 8h (see FIG. 36) which has been formed in the interlayer insulating film 4c, forming the connecting groove 5g (see FIG. 36), depositing a conductor film and then polishing by the CMP treatment.

The fourth-layer interconnection 13L (or fourth level layer wiring line) has a normal interconnection structure similar to that of the first embodiment. The fourth-layer interconnection 13L is electrically connected with the third-layer interconnection 11L or connecting conductor portion 21 through the connecting conductor portion 20C in the connecting hole 8f. The connecting conductor portion 20C is made of, for example, tungsten or tungsten alloy formed by the selective CVD method.

In this fifth embodiment, the fourth-layer interconnection 13L made of an Al base material and the third-layer interconnection 11L made of a Cu base material or the connecting conductor portion 21C are not brought into direct contact, but they are electrically connected via the connecting conductor portion 20C made of a tungsten base material, which makes it possible to prevent the direct contact of Al with Cu, thereby preventing the formation, at the contact surface, of an alloy layer having a high specific resistance.

Figure 44:
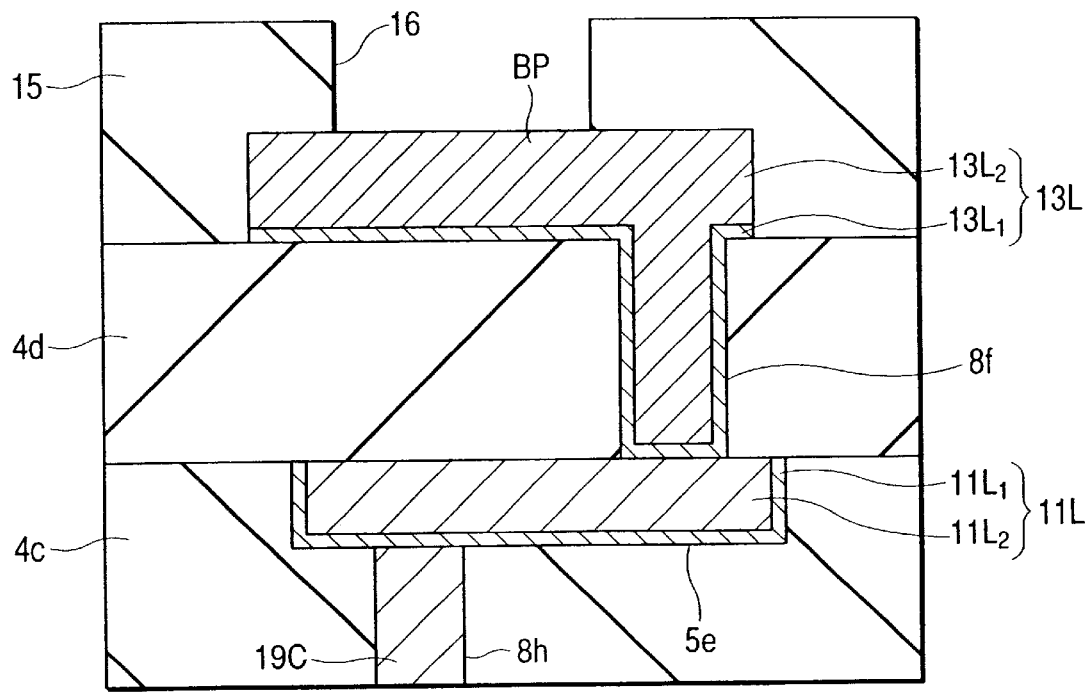
FIG. 44 is a fragmentary enlarged cross-sectional view illustrating an example of a modification of the semiconductor integrated circuit device of FIG. 36.

As a structure which prevents the formation of such an alloy layer, not only the structure as illustrated in FIG. 36, but also various structures can be employed. Structures as illustrated in FIGS. 44 through 52 may also be used. More specifically, FIG. 44 illustrates a structure in which the fourth-layer interconnection 13L is composed of a thin conductor film 13L1 and a thick conductor film 13L2 stacked thereon. The thin conductor film 13L1 is made of a material having a function of improving the adhesion between the fourth-layer interconnection 13L and the interlayer insulating film 4d and also a function of suppressing, as a barrier, the diffusion of component atoms of the thick conductor film 13L2. Examples of the material include tungsten, TiN, Ti, Ta, WN, WSiN, TiSiN, TaN and TaSiN. The thick conductor film 13L2 is made of, for example, Al or Al alloy.

Figure 45:
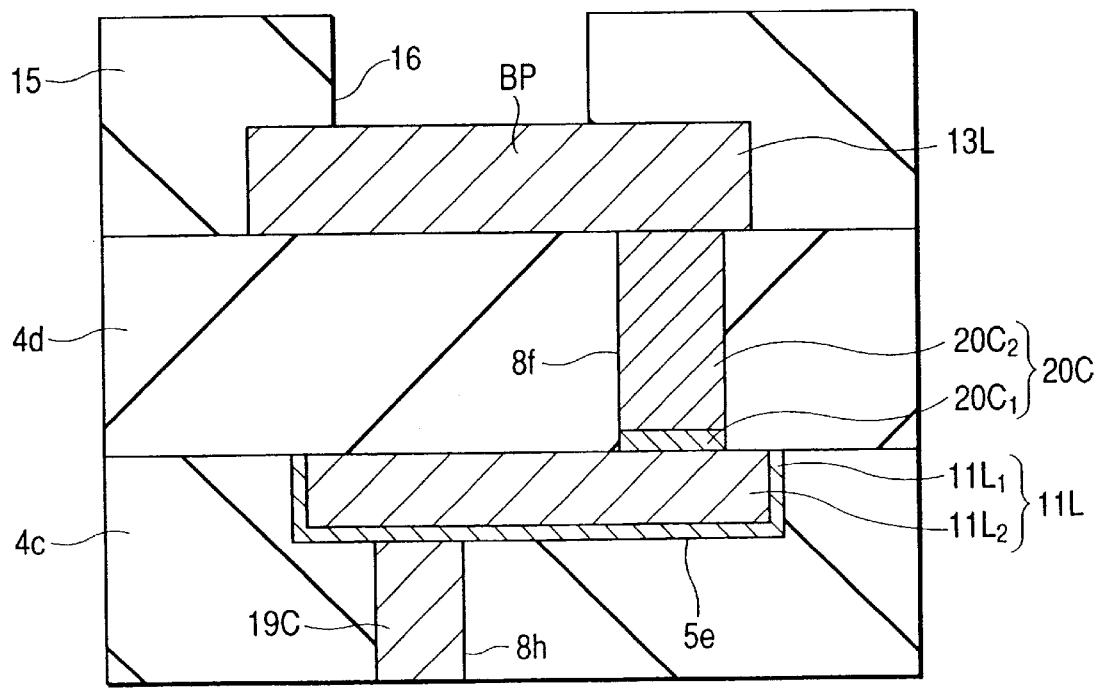
FIG. 45 is a fragmentary enlarged cross-sectional view illustrating an example of a modification of the semiconductor integrated circuit device of FIG. 36.

FIG. 45 illustrates the structure wherein a connecting conductor portion 20C1 made of, for example, tungsten or a tungsten alloy formed by the selective CVD method is disposed over the surface of the third-layer interconnection 11L exposed from the connecting hole 8f and in the connecting hole 8f, and a connecting conductor portion 20C2 made of, for example, Al or Al alloy is disposed over the connecting conductor portion 20C1. A fourth-layer interconnection 13L is electrically connected with the third-layer interconnection 11L through this connecting conductor portion 20C (20C2, 20C1). Incidentally, the third-layer interconnection 13L and the connecting conductor portion 20C may be formed simultaneously. In this structure, the connecting conductor portion 20C1 made of tungsten or the like is disposed at the place where the fourth-layer interconnection 13L and connecting conductor portion 20C2 each made of an Al base material are brought into contact with the third-layer interconnection 11L made of a Cu base material, whereby the formation of an alloy layer having a high specific resistance at the contact surface can be prevented. Furthermore, by forming the connecting conductor portion 20C2, which constitutes most of the connecting conductor portion 20C, from a low-resistance Al base material, the resistance of the connecting conductor portion 20C can be reduced compared with the structure of FIG. 36 in which the whole of the corresponding connecting conductor portion is formed of tungsten or the like.

Figure 46:
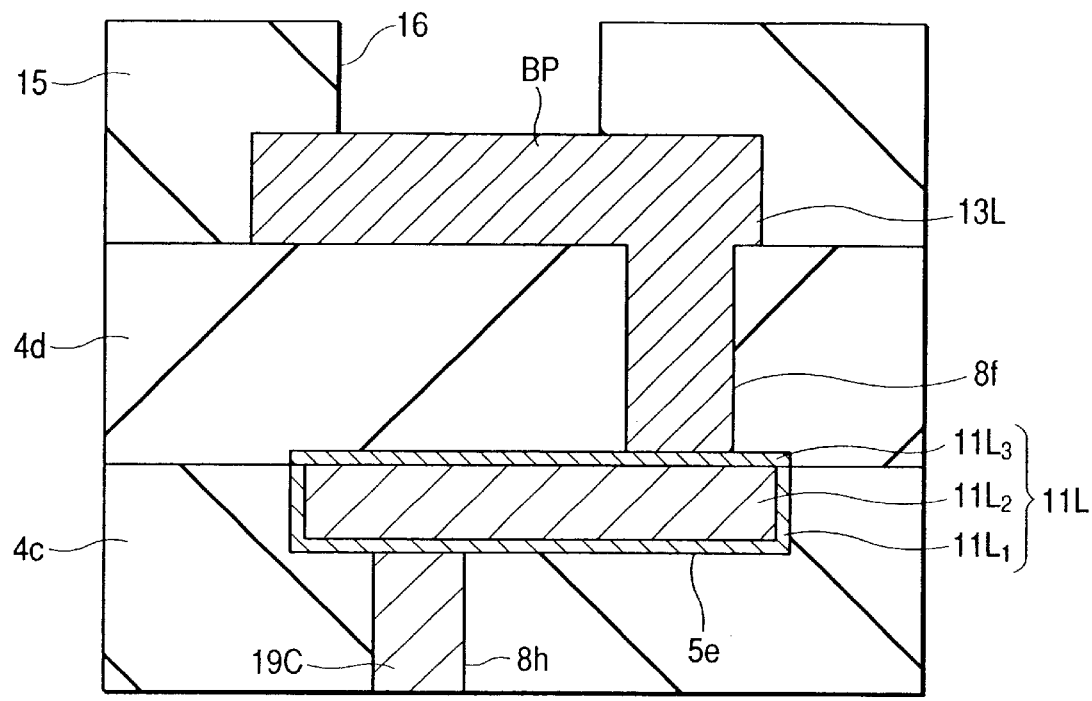
FIG. 46 is a fragmentary enlarged cross-sectional view illustrating an example of a modification of the semiconductor integrated circuit device of FIG. 36.

FIG. 46 illustrates a structure in which a cap conductor film 11L3 is disposed in the upper part of the second-layer interconnection 11L. A cap conductor film 11L3 is made of, for example, tungsten, TiN, Ti, Ta, WN, WSiN, TiSiN, TaN or TaSiN. A thick conductor film 13L is made of, for example, Al or Al alloy. In the connecting hole 8f, a conductor film which is integrally formed with the fourth-layer interconnection 13L and is made of Al or an Al aR alloy is buried. Also in this case, a thin conductor film 11L3 made of tungsten is disposed at the place where the fourth-interconnection 13L made of an Al base material is brought into contact with the third-layer interconnection 11L made of a Cu base material so that the formation of an alloy layer having a high specific resistance at the contact surface can be prevented. Furthermore, a low resistance Al base material is buried in the connecting hole 8f so that the resistance of the connecting conductor portion can be reduced.

Figure 47:
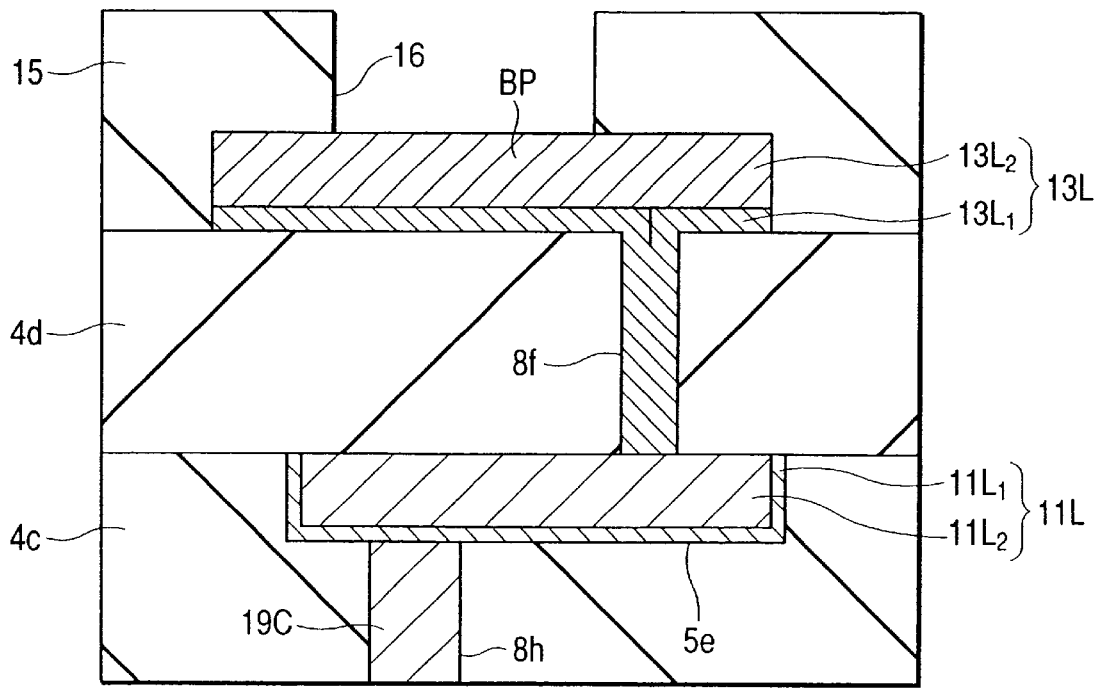
FIG. 47 is a fragmentary enlarged cross-sectional view illustrating a modification of the semiconductor integrated circuit device of FIG. 36.

In FIG. 47, the thin conductor film 13L1 is buried in the connecting hole 8f. The thin conductor film 13Li is made of a material similar to that described above such as tungsten, TiN, Ti, Ta, WN, WSiN, TiSiN, TaN or TaSiN. The thick conductor film i3L2 is made of, for example, Al or an Al alloy.

Figure 48:
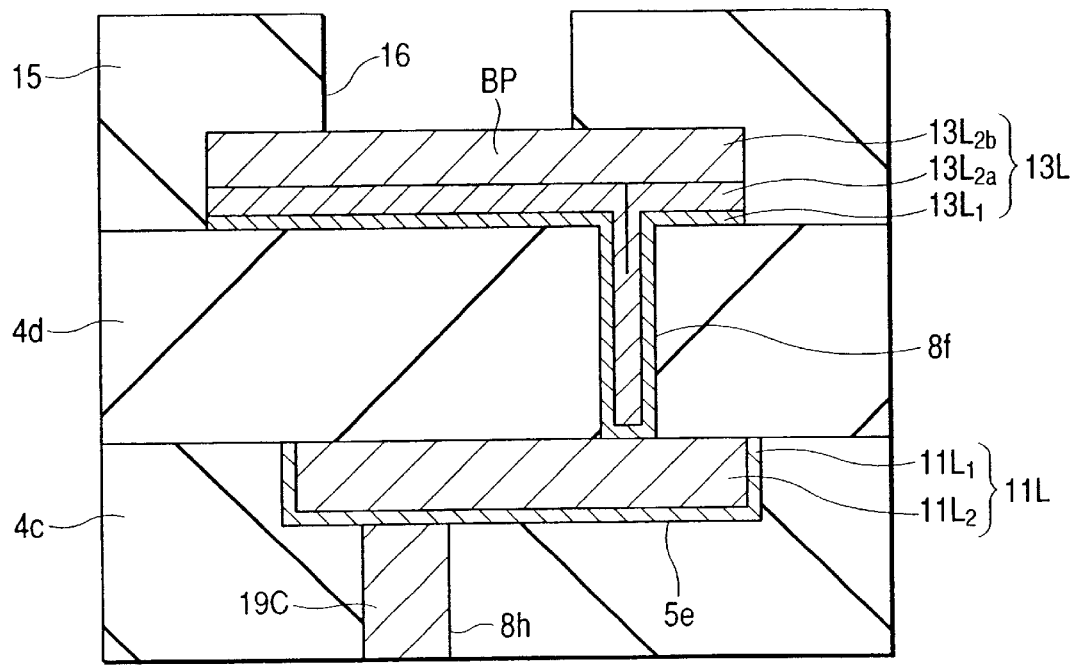
FIG. 48 is a fragmentary enlarged cross-sectional view illustrating a modification of the semiconductor integrated circuit device of FIG. 36.

The structure of FIG. 48 is similar to that of FIG. 47 except that the thick conductor films 13L2a and 13L2b are stacked in this order on the thin conductor film 13L1. The lower thick conductor film 13L2a is made of, for example, tungsten or tungsten alloy and is formed, for example, by the CVD or sputtering method. The upper thick conductor film 13L2b is made of, for example, Al or Al alloy and is formed by the CVD or sputtering method.

Figure 49:
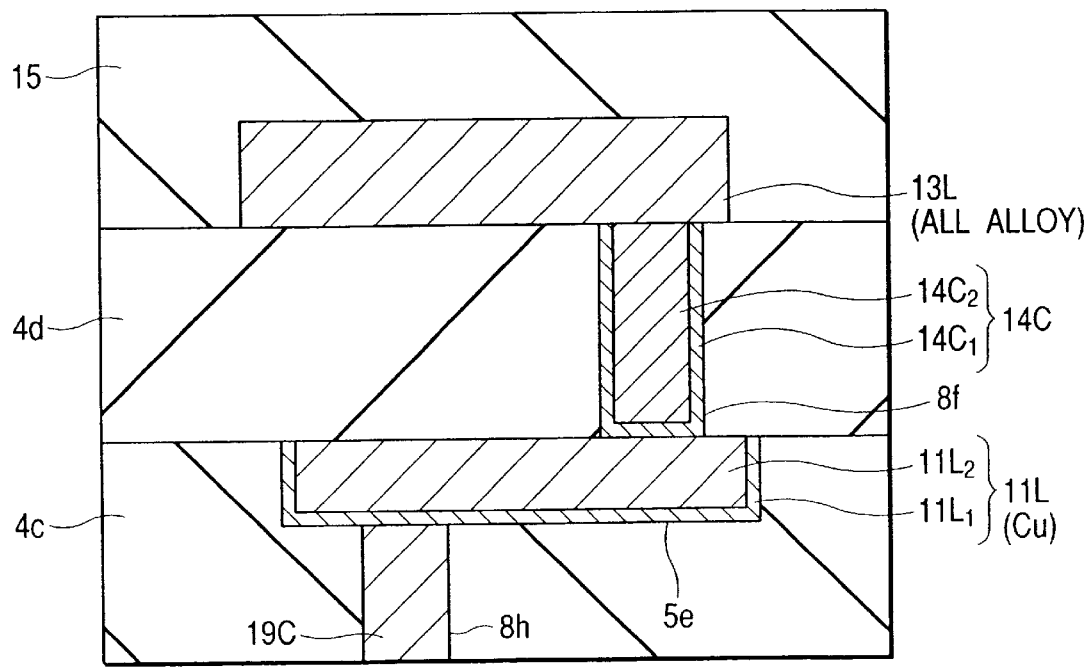
FIG. 49 is a fragmentary enlarged cross-sectional view illustrating a modification of the semiconductor integrated circuit device of FIG. 36.

In the structure of FIG. 49, a connecting conductor portion 14C for connecting the fourth-layer interconnection 13L (BP) made of an Al base material and the third-layer interconnection 11L made of a Cu base material is formed of a barrier metal (thin conductor film) 14C1 made of W, TiN or the like by the sputtering method and a plug (thick conductor film) 14C2 formed of W or the like by the CVD method. By this structure, the contact resistance can be reduced.

It is possible to fabricate this structure by depositing the barrier metal by the sputtering method, depositing W to bury it in the connecting hole 8f by the CVD method and then forming the barrier metal 14C1 and plug 14C2 only in the connecting hole 8f by the CMP or etchback method.

The connecting conductor portion 14C is constituted only of the plug 14C2 obtained by burying TiN in the connecting hole 8f by the CVD method.

Figure 50:
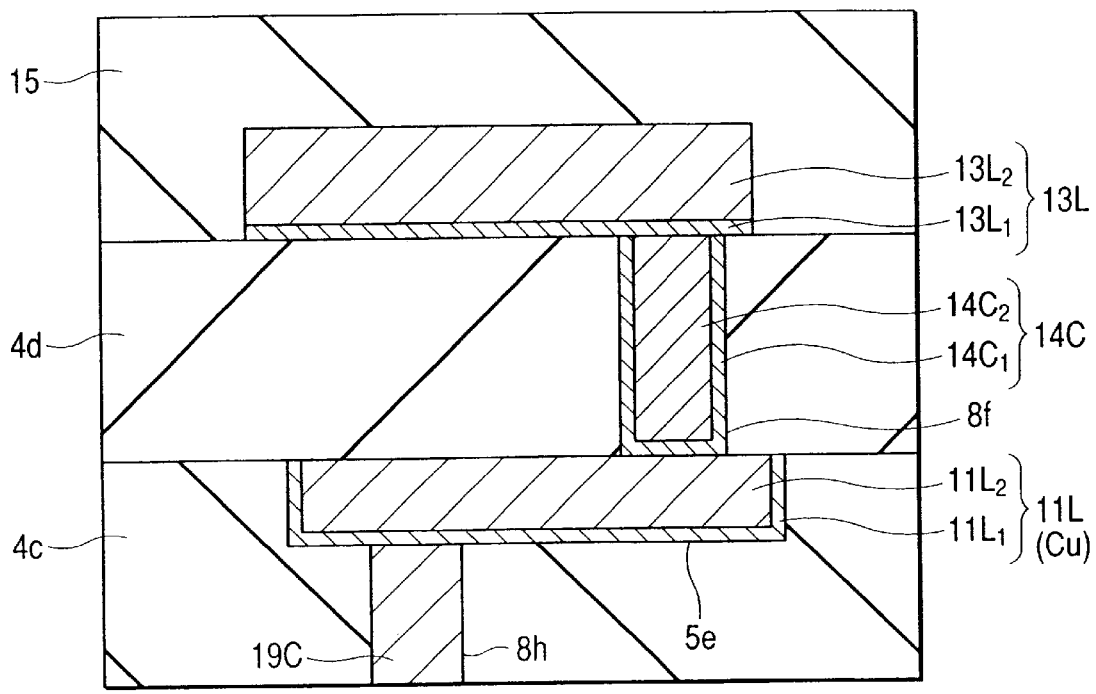
FIG. 50 is a fragmentary enlarged cross-sectional view illustrating a modification example of the semiconductor integrated circuit device of FIG. 36.

The structure of FIG. 50 is similar to that of FIG. 49 except that the fourth-layer interconnection 13L (BP) is formed of the thick conductor film 13L2 made of an Al base material and the thin conductor film 13L1 formed from a high-melting point metal or metal compound such as TiN or W. This structure brings about a further improvement in the reliability.

Figure 51:
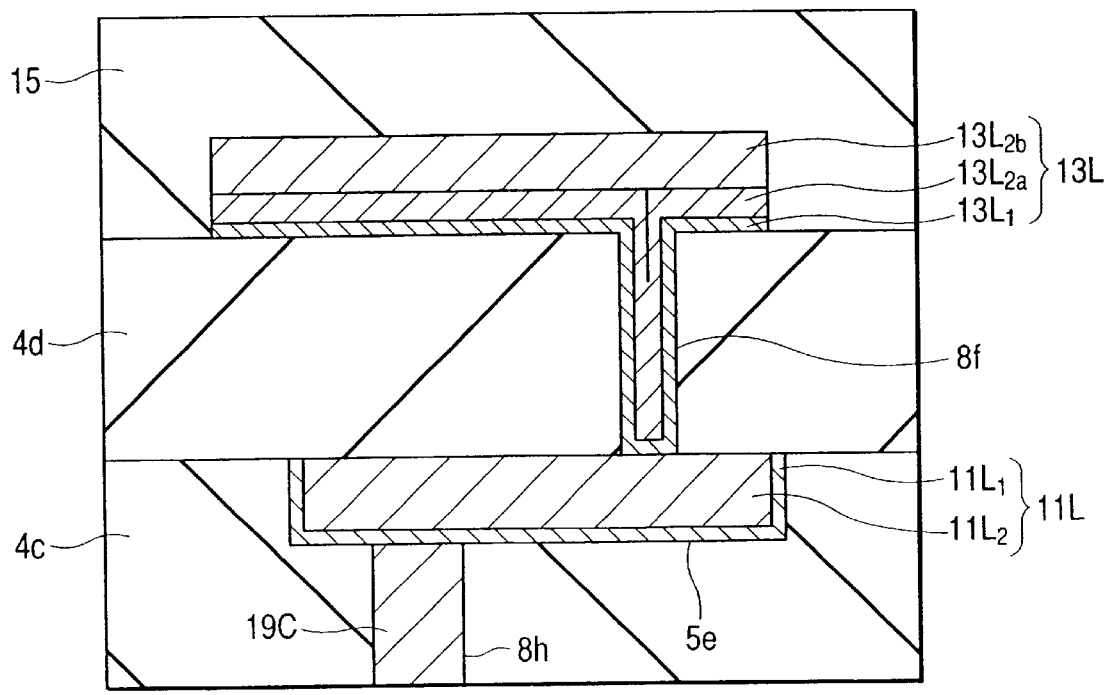
FIG. 51 is a fragmentary enlarged cross-sectional view illustrating a modification of the semiconductor integrated circuit device of FIG. 36.

The structure of FIG. 51 is similar to that of FIG. 49 except that the fourth-layer interconnection 13L (BP) is constituted from the barrier metal (thin conductor film) 13L1, which has been obtained by depositing a barrier metal and W in the connecting hole 8f and then depositing an Al base material without plug processing, the thick conductor film 13L2a made of W and a thick conductor film 13L2b made of an Al base material. By leaving the barrier metal and W without plug processing and forming a stacked interconnection with an Al alloy, simplification of the fabrication step due to the elimination of the plug polishing step and improvement in the reliability due to the stacked structure can be attained.

Figure 52:
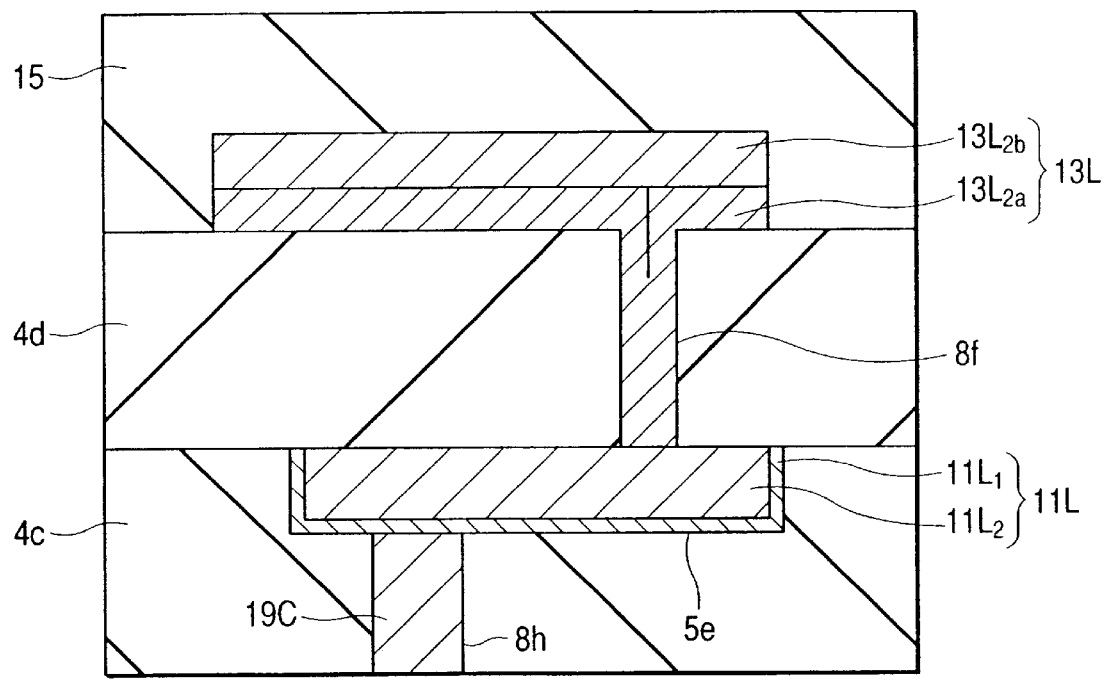
FIG. 52 is a fragmentary enlarged cross-sectional view illustrating a modification of the semiconductor integrated circuit device of FIG. 36.

The structure of FIG. 52 is similar to that of FIG. 51 except that the fourth-layer interconnection 13L, BP is constituted from the thick conductor film 13L2a, which has been formed of TiN by the CVD method, and the thick conductor film 13L2b, which has been formed of an Al base material, without the barrier metal (thin conductor film) 13L1. The TiN film 13L2b formed by the CVD method has better adhesion with the interlayer insulating film than the W film, so that disposal of the barrier metal 13L1 is not required, leading to a reduction in the number of fabrication steps. Similar to the structure of FIG. 51, by leaving the conductor film without plug processing and forming a stacked interconnection with an Al alloy, simplification of the fabrication process due to the elimination of the plug polishing step and improvement in the reliability due to the stacked structure can be attained.

Figure 53:
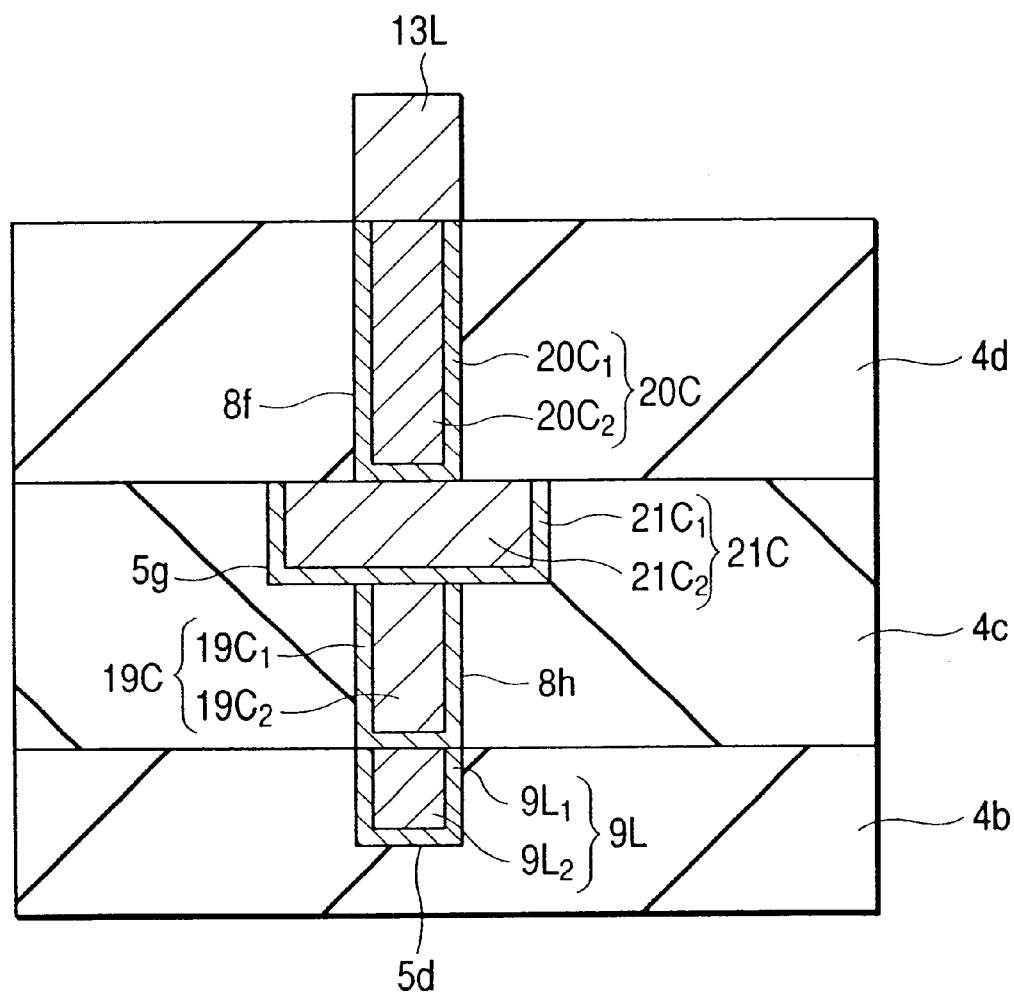
FIG. 53 is a cross-sectional view illustrating a modification of the semiconductor integrated circuit device of 39(C)

The structure of the connecting conductor portion 14C as illustrated in FIG. 49 can be applied to the connecting conductor portion 10C, 12C, 18C, 19C or 20C. FIG. 53 illustrates the application of the structure of the connecting conductor portion 14C as illustrated in FIG. 49 to the connecting conductor portions 19C and 20C as illustrated in FIG. 39 and FIG. 40, respectively. The thin conductor films 19C1 and 20C1 are formed similar to the barrier metal 14C1, while the thick conductor films 19C2 and 20C2 are formed similar to the plug 14C2.

Figure 54:
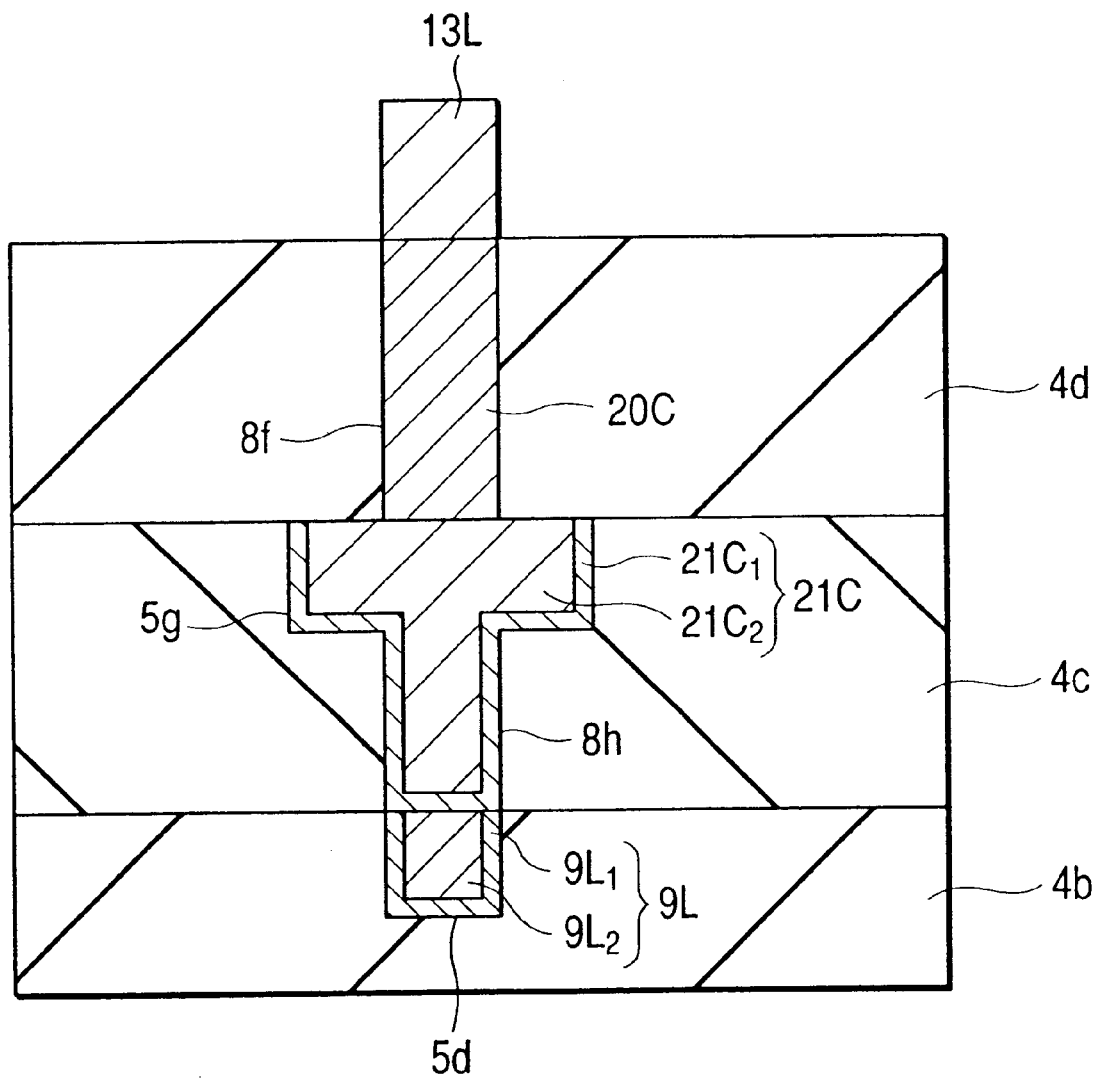
FIG. 54 is a cross-sectional view illustrating a modification of the semiconductor integrated circuit device of 39(C)

FIG. 54 illustrates the structure wherein the third-layer interconnection 11L, 21C as illustrated in FIG. 53 has been formed by the dual damascene method. This structure is fabricated by forming connecting holes 5g and 8h, depositing a barrier metal by the sputtering method, forming a thin film of Cu by the sputtering method, burying the film in the connecting holes 5g and 8h by the electrolytic plating method and then polishing by the CMP method, whereby the third-layer interconnection 11L, 21C composed of the thin conductor film 21C1 made of the barrier metal and the thick conductor film 21C2 made of Cu is formed. By forming the plane length of the third-layer interconnection 21C so as to be longer than the length of the connecting hole 8h along at least the lengthwise direction of the interconnection, the effective aspect ratio upon simultaneous burying of the connecting holes 5g and 8h with Cu can be reduced, whereby Cu can be buried in the hole easily.

Figure 55A:
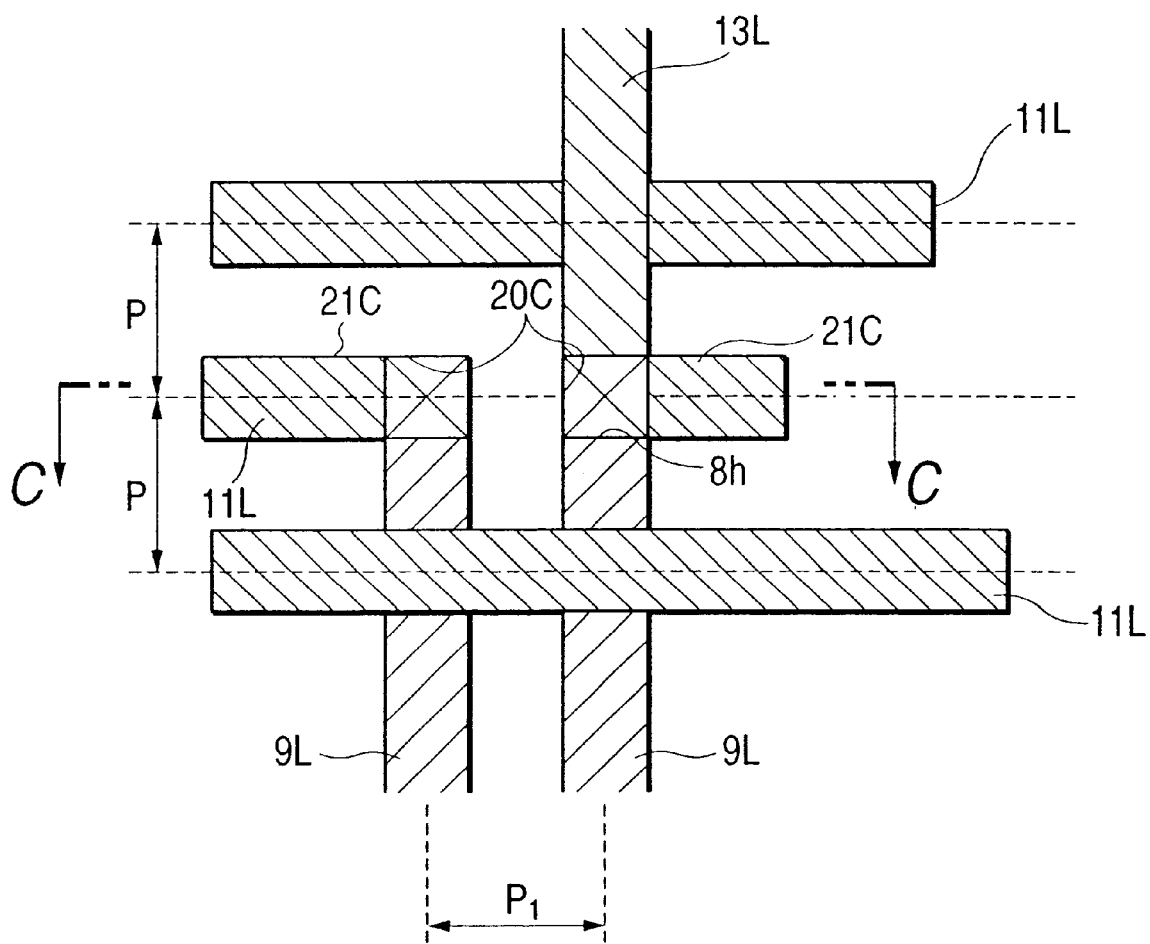
FIG. 55(A) is a plain view illustrating a modification example of the semiconductor integrated circuit device of 39(A)
Figure 55B:
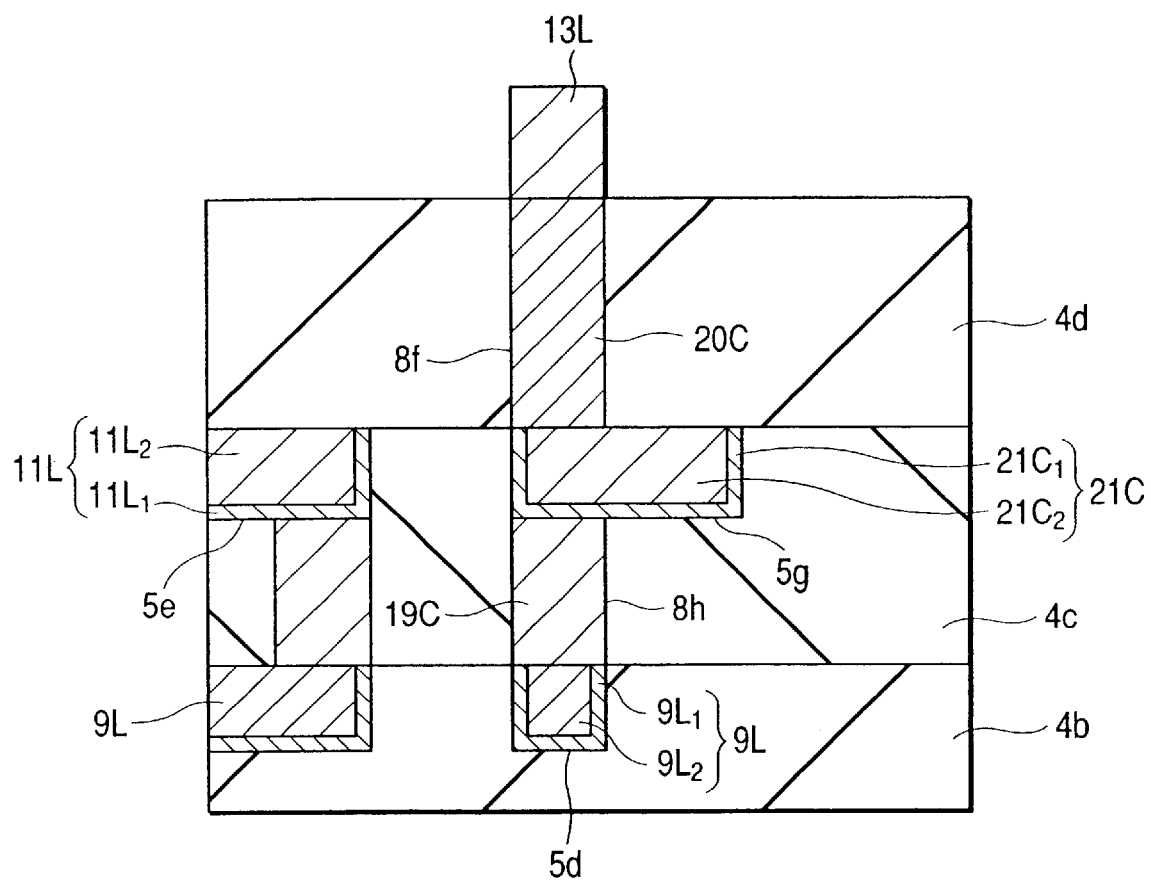
FIG. 55(B) is a fragmentary enlarged cross-sectional view of the semiconductor integrated circuit device shown in FIG. 55(A)

FIGS. 55(A) and 55(B) are examples of modifications of the connecting conductor portion 21C of FIG. 39 shifted to the lengthwise direction (X direction), in which FIG. 55(A) is a fragmentary plain view illustrating a part of the second-layer interconnection 9L to the fourth-layer interconnection 13L and FIG. 55(B) is a fragmentary cross-sectional view taken along a line C—C of FIG. 55(A). It is possible to dispose the connecting conductor portion 21C even if the second-layer interconnection 9L is formed at the position of the pitch P1 from an adjacent second-layer interconnection 9L.

Figure 56:
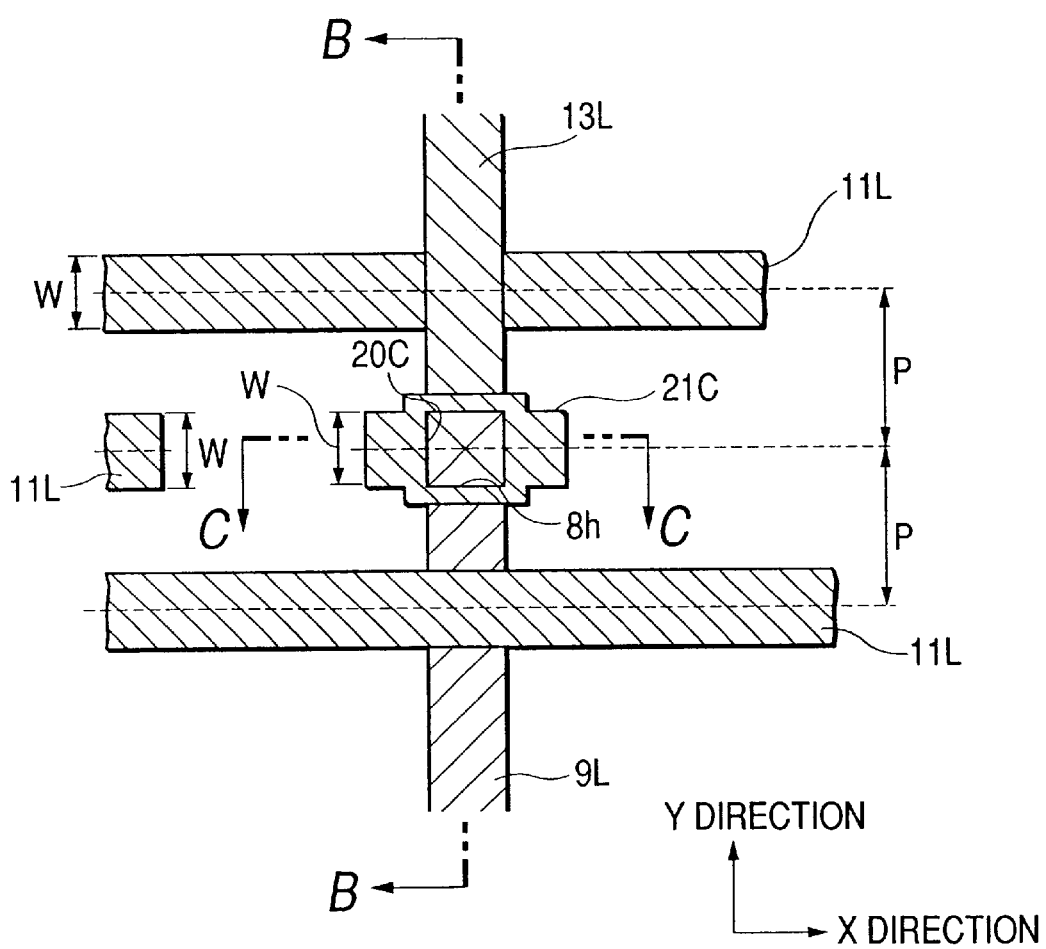
FIG. 56 is a plain view illustrating a modification of the semiconductor integrated circuit device of FIG. 39(A)

FIG. 56 is a modification of the connecting conductor portion 21C which has been widened within an extent not changing the pitch p, at only the position where the connecting hole 8f is to be disposed, in the direction vertical to the lengthwise direction (X direction). The connecting conductor portion 21C as illustrated in FIG. 56 may be applied to the connecting conductor portion 21C as illustrated in FIGS. 55(A) and 55(B).

(Sixth embodiment)

Figure 57:
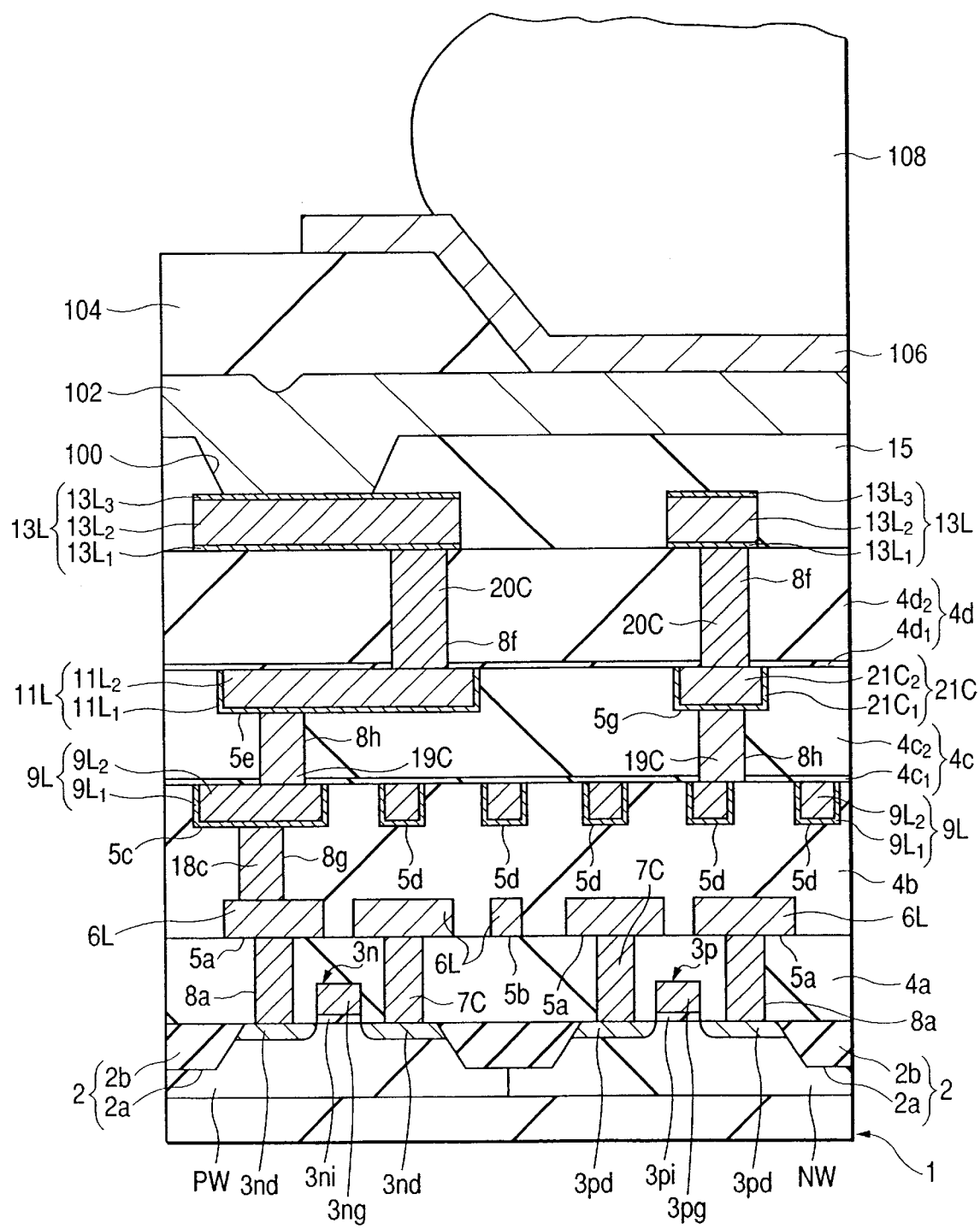
FIG. 57 is a fragmentary cross-sectional view illustrating a semiconductor integrated circuit device according to another embodiment of the present invention.
Figure 59:
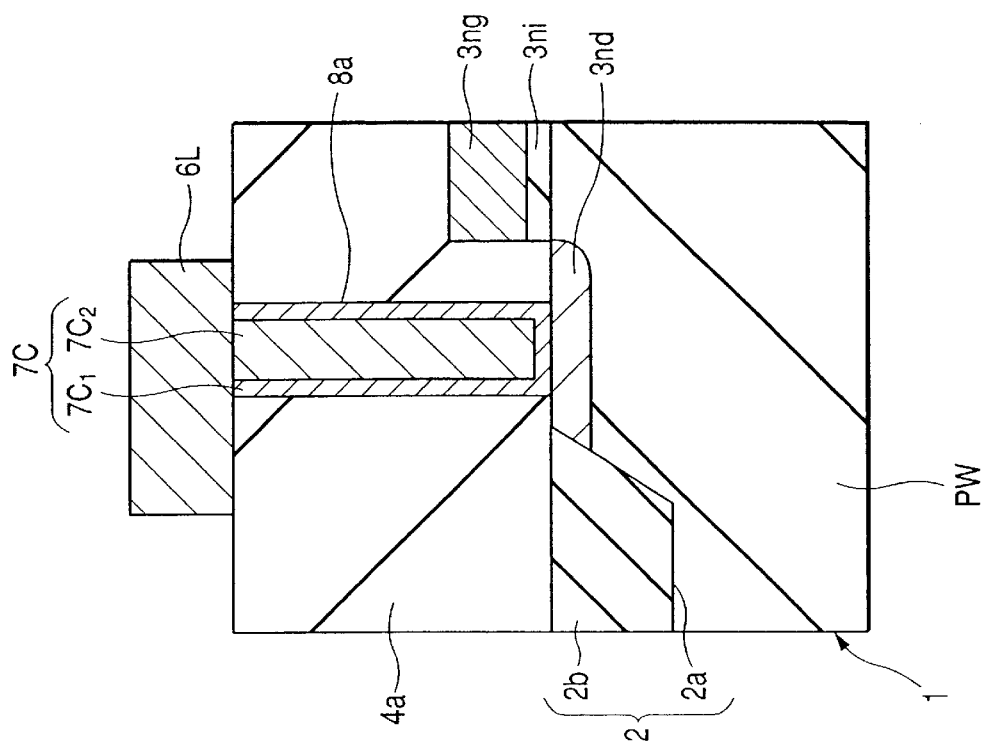
FIG. 59 is a fragmentary cross-sectional view illustrating the semiconductor integrated circuit device of FIG. 57 during its fabrication step.
Figure 58:
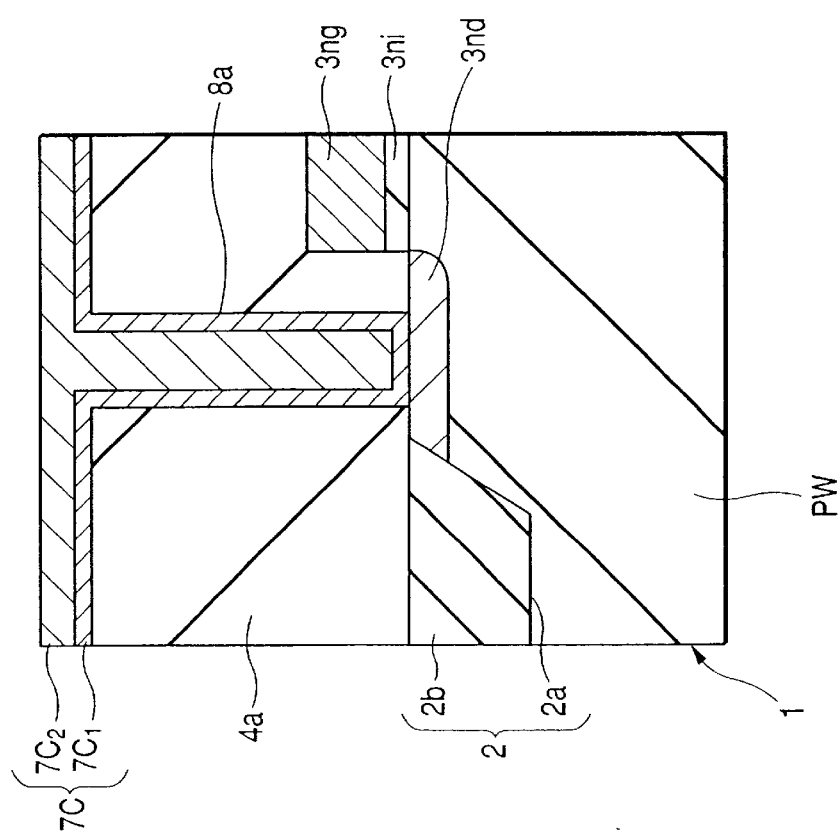
FIG. 58 is a fragmentary cross-sectional view of the semiconductor integrated circuit device of FIG. 57 during its fabrication step.

FIG. 57 is a fragmentary cross-sectional view of the semiconductor integrated circuit device according to the sixth embodiment of the present invention; and FIGS. 58 and 59 are fragmentary cross-sectional views of the semiconductor integrated circuit device of FIG. 57 during the fabrication process.

The structure of the semiconductor integrated circuit device according to the sixth embodiment of the present invention will next be described with reference to FIG. 57.

The first-layer interconnection 6L is composed of a conductive material, other than Cu (copper) base material, such as W (tungsten), while the second-layer interconnection 9L and third-layer interconnection 11L are each composed of a Cu-base conductive material similar to the fifth embodiment.

The first-layer interconnection 6L is used as the interconnection in a logic circuit constituted of, for example, a MISFET or an interconnection between logic circuits, and it is relatively shorter than the second-layer interconnection 9L or third-layer interconnection 11L.

The second-layer interconnection 9L and third-layer interconnection 11L are used as an interconnection between logic circuits, and one of them is formed to extend in the X direction, while the other one is formed to extend in the Y direction.

By forming the first-layer interconnection 6L from a W film, it can be formed in a minute pattern, whereby high integration and an increase in the electron migration resistance can be achieved.

Since a Cu base conductive material is not used for the first-layer interconnection 6L, the diffusion of Cu toward the semiconductor substrate 1 can be reduced, leading to an improvement in the reliability.

By constituting the second-layer interconnection 9L and third-layer interconnection 11L from a Cu base conductive material, the specific resistance of the interconnection can be reduced, which permits high-speed operation.

Similar to the connecting conductor portion 14C of FIG. 49, the connecting conductor portions 7C, 18C, 19C, 20C and 21C are each composed of a barrier metal (thin conductor film) 14C1 made of W formed by the sputtering method and a plug 14C2 (thick conductor film) made of W.

The fourth-layer interconnection 13L and fifth interconnection layer 102 are each formed of, for example, an Al (aluminum) base conductive material.

The fourth-layer interconnection 13L has a stacked structure wherein the thick conductor film 13L2 made of Al or Al alloy is sandwiched between the barrier metals (thin conductor films) 13L1 and 13L2 such as W or TiN.

By electrically connecting the fourth-layer interconnection 13L made of an Al base conductive material and the third-layer interconnection 11L made of a Cu base conductive material via the connecting conductor portion 20C made of W, it becomes possible to prevent the formation of an alloy layer having a high specific resistance at the contact surface of Al and Cu. Interconnection structures as illustrated in FIGS. 44 to 52 can be applied to the fourth-layer interconnection 13L.

The fifth-layer interconnection 102 is electrically connected with the fourth-layer interconnection 13L without a connecting conductor portion, but the invention is not limited thereto. Similar to the connection between the fourth-layer interconnection 13L and the third-layer interconnection 11L, the fifth-layer interconnection 102 and fourth-layer interconnection 13L may be electrically connected through a connecting conductor portion having the similar structure to the connecting conductor portion 20C.

A stacked structure similar to that of the fourth-layer interconnection 13L may be applied to the fifth-layer interconnection 102.

Over the fifth-layer interconnection 102, an insulating film 104 made of, for example, silicon oxide is formed and a lower electrode 106 is formed in an opening portion formed in the insulating film 104. The fifth-layer interconnection 102 is electrically connected through the lower electrode 106 with a bump electrode 108 made of a solder bump and the lower electrode 106 is made of, for example, a barrier metal.

The fabrication process of the first-layer interconnection 6L and connecting conductor portion 7C will next be described simply with reference to FIGS. 58 and 59.

As illustrated in FIG. 8, the connecting hole 8a is formed in the interlayer insulating film 4a. As illustrated in FIG. 58, the thin conductor, film 7C1 made of W is then deposited by the sputtering method, followed by the deposition of the thick conductor film 7C2 made of W by the CVD method so as to bury it in the connecting hole 8a.

As illustrated in FIG. 59, the deposited film is then polished by, for example, the CMP method, whereby the thin conductor film 7C1 made of W and thick conductor film 7C2 made of W are buried in the connecting hole 8a.

A W film is then deposited by the PVD method, followed by patterning by etching, whereby the first-layer interconnection 6L is formed. Here, the first-layer interconnection 6L is formed from a W film by the PVD method, but it is possible to adopt various structures such as a stacked structure in which a W film is stacked by the CVD method over the W film made by a PVD method.

After deposition of a silicon oxide film by the CVD method, the silicon oxide film is polished by the CMP method, whereby the interlayer insulating film 4b having a planarized surface is formed.

The subsequent steps are carried out in a similar manner to those of the above-described first to fifth embodiment.

Figure 60:
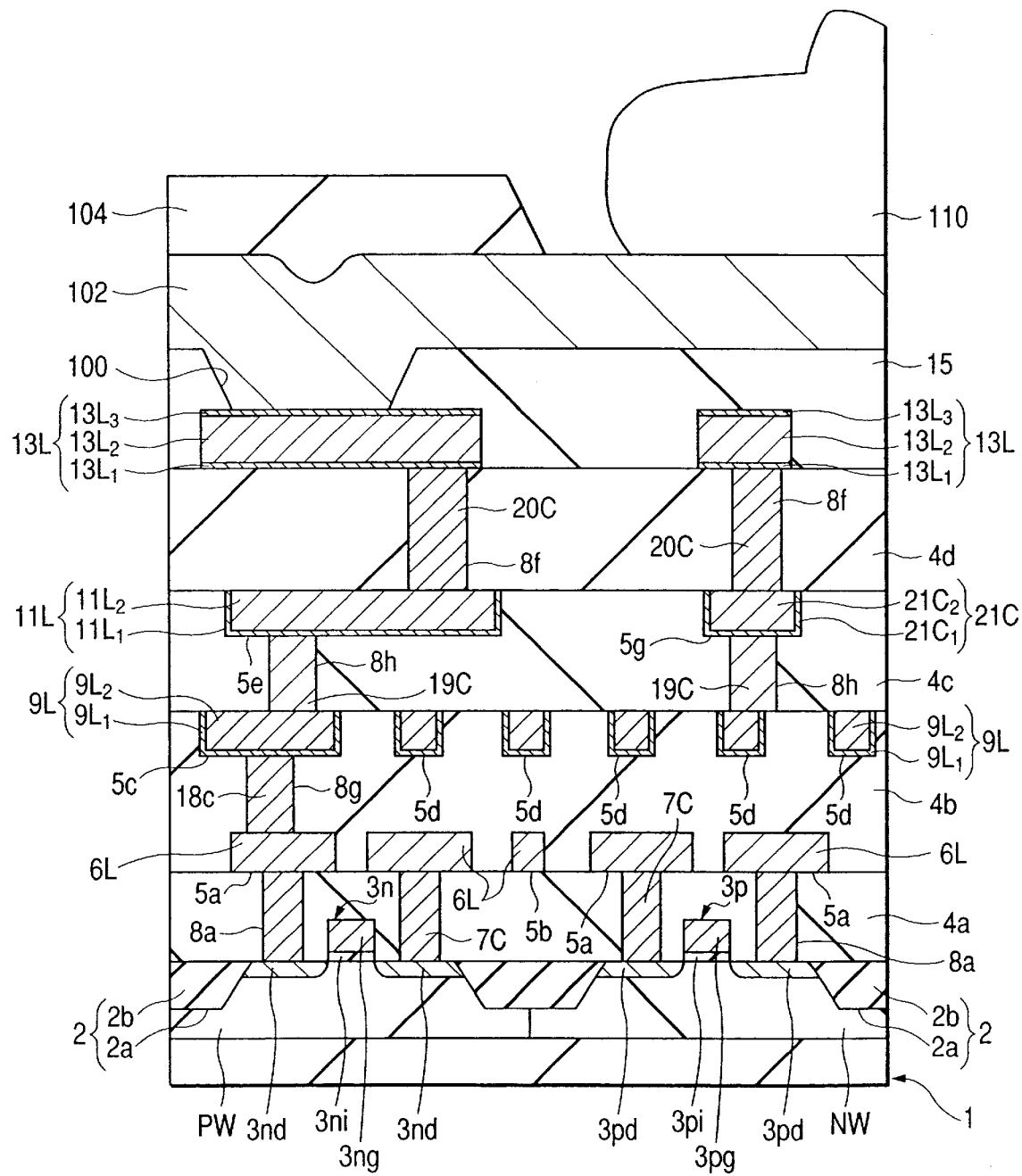
FIG. 60 is a fragmentary cross-sectional view illustrating a modification of the semiconductor integrated circuit device of FIG. 57.

The semiconductor integrated circuit device according to the sixth embodiment uses a bump electrode 108, but alternatively, a bonding wire 110 may be electrically connected with a bonding pad formed in the fifth-layer interconnection 102 as illustrated in FIG. 60.

The semiconductor integrated circuit device according-to the sixth embodiment is formed of five interconnection layers but may be formed of seven interconnection layers wherein the second to fifth-layer interconnections are made of a Cu base conductive material and the sixth to seventh-layer interconnections are made of an Al base conductive material. In this case, the second- and fourth-layer interconnections are formed to extend in the same direction, while the third- and fifth-layer interconnections are formed to extend in the same direction, whereby they are used as interconnections connecting between logic circuits. In this sixth embodiment, at the position in the third-layer interconnection where the connecting conductor portion 19C and connecting conductor portion 20C are connected, the connecting conductor portion 21c which has been formed longer in plane than the connecting conductor portions 19C and 20C along at least the lengthwise direction of the interconnection is disposed. The structure corresponding to the connecting conductor portion 21C may be disposed in the second, third, fourth or fifth-layer interconnection.

Figure 61:
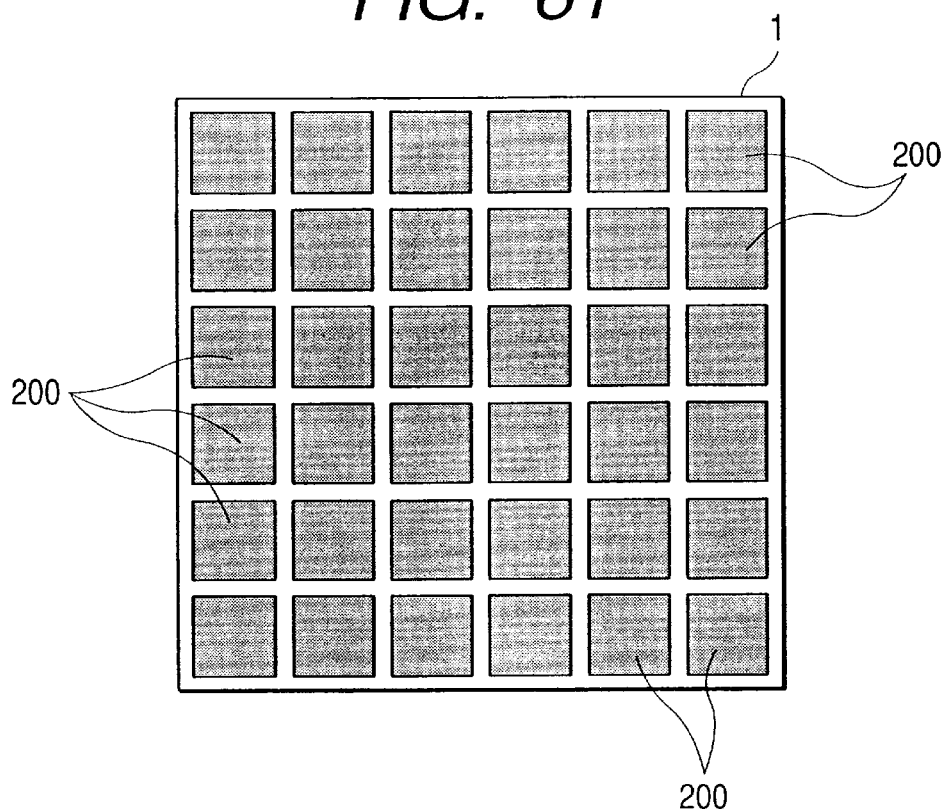
FIG. 61 is a plain view layout illustrating a semiconductor integrated circuit device according to the embodiment of the present invention.

FIG. 61 illustrates a plane layout of the semiconductor integrated circuit device as illustrated in each of the first to six embodiments. A gate array 200 is placed in repetition and in each gate array 200, integrated circuit devices such as a MISFET, a bipolar device and a resistor are disposed in combination.

By changing the interconnection pattern of the first-layer interconnection to the fifth-layer interconnection, various logic circuits are formed and a semiconductor integrated circuit device having a predetermined logic is formed.

Figure 62:
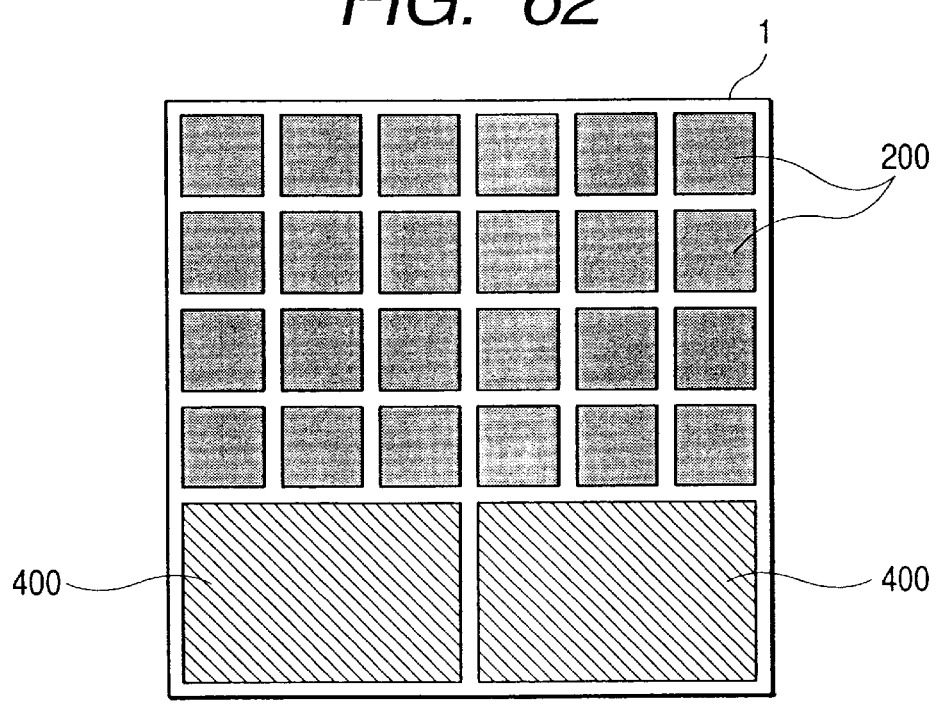
FIG. 62 is a plain view layout illustrating a modification of the semiconductor integrated circuit device of FIG. 61.

FIG. 62 illustrates a semiconductor integrated circuit device having a gate array 200 and RAM 400 as a memory.

Figure 63:
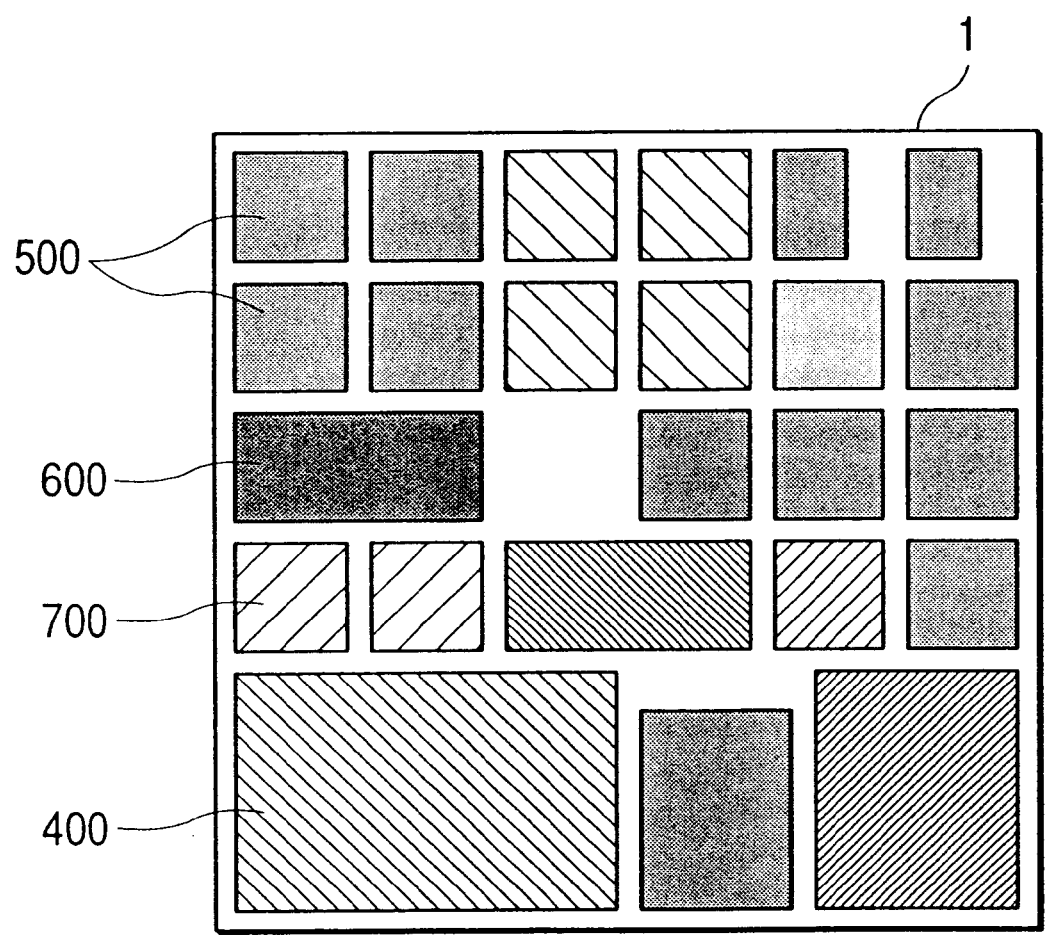
FIG. 63 is a plain view layout illustrating a modification of the semiconductor integrated circuit device of FIG. 61.

As illustrated in FIG. 63, units 400, 500, 600 and 700 having various functions may be disposed freely according to the performance of the LSI.

According to the fifth embodiment or sixth embodiment, the following advantages are available in addition to the advantages (8) to (10) obtained in the first embodiment.

(1) It becomes possible to bury a conductor film favorably in both of the interconnection grooves 5a to 5f and more minute connecting holes 8a to 8f, by filling-the conductor film in the minute connecting holes 8a to 8f by the CVD method or the like, filling the conductor film in the interconnection grooves 5a to 5f which are larger in the plain size than the connecting holes 8a to 8f, thereby forming the first-layer interconnection 6L, second-layer interconnection 9L and third-layer interconnection 11L of a buried structure. In addition, it becomes possible to bury the conductor film favorably by, upon filling the conductor film simultaneously in the minute connecting holes 8a to 8f and the interconnection grooves 5a to 5f which lie thereover by the CVD method or plating method, enlarging the plain size of the interconnection grooves 5a to 5f to greater than that of the connecting holes 8a to 8f.

(2) According to the advantage described in (1), the reliability of the connection between the interconnection layers can be improved, which makes it possible to improve the yield and reliability of the semiconductor integrated circuit device.

(3) According to the advantage described in (1), it becomes possible to promote the miniaturization of a buried interconnection, which makes it possible to promote the miniaturization or high integration of the semiconductor integrated circuit device.

(4) According to the advantage described in (1), it becomes possible to bury a conductor film favorably in the interconnection grooves 5a to 5f and connecting holes 8a to 8f without adopting a difficult technique.

(5) According to the advantage described in (1), it becomes possible to improve the buried condition even if Cu or Cu alloy is used as a wiring material to be buried.

(6) It becomes possible to prevent the device failure caused by the diffusion phenomenon of Cu atoms toward the semiconductor substrate 1 while maintaining the good buried condition of the conductor film in the connecting hole 8a, by constituting the first-layer interconnection 6L, which directly contacts the semiconductor substrate 1, from a tungsten base conductor material. In addition, the use of the tungsten base conductor material for the first-layer interconnection 6L enables a reduction in the interconnection resistance and an improvement in the EM resistance.

For example, it is possible to dispose a silicide film such as tungsten silicide or titanium silicide at the place in contact with the connecting conductor portion in the semiconductor substrate.

The number of the interconnection layers are not limited to four to seven, but can be changed. The number may be set at three or more.

Out of the features disclosed in this application, advantages available by the typical aspects will be described.

(1) According to the fabrication process of the semiconductor integrated circuit device of the present invention, it becomes possible to bury a conductor film favorably in both an interconnection groove and a more minute connecting hole, by sufficiently burying the conductor film in the connecting hole, forming the interconnection groove and then burying the groove with the conductor film.

(2) According to the fabrication process of the semiconductor integrated circuit device of the present invention, when interconnection grooves of different size exist in the same interconnection layer, it becomes possible to favorably bury a conductor film in both of the interconnection grooves, by selecting methods which are easy and are suited to bury the minute interconnection groove and a larger interconnection groove, respectively.

(3) The advantages described above in paragraphs (1) and (2) make it possible to improve the reliability of the connection between interconnection layers, leading to an improvement in the yield and reliability of the semiconductor integrated circuit device.

(4) The advantages described above in paragraphs (1) and (2) make it possible to promote the miniaturization of the buried interconnection, leading to the acceleration of the miniaturization and high integration of the semiconductor integrated circuit device.

(5) The advantages described above in paragraphs (1) and (2) make it possible to favorably bury a conductor film in each of the interconnection groove and connecting hole without adopting a difficult technique. It therefore becomes possible to promote the cost reduction of the semiconductor integrated circuit device having a buried interconnection.

(6) The advantages described above in paragraphs (1) and (2) make it possible to improve the buried condition even if Cu or a Cu alloy is used as a wiring material to be buried.

(7) According to the fabrication process of the present invention, by planarizing a Cu base conductor material formed by the sputtering method or the like over the insulating film including the interconnection groove, thereby removing a portion of the Cu base conductor material at portions other than the interconnection groove to form a buried interconnection and then subjecting the substrate to thermal treatment, it becomes possible to promote the grain growth of Cu and improve the EM resistance, and at the same time, it becomes possible to remove the damage or oxide film which has appeared on the surface of the Cu base conductor film during planarizing treatment, thereby to smoothen the surface or to remove or reduce the stains on the surface of the insulating film exposed during the CMP treatment. The reliability of the embedded interconnection made of a Cu base conductor material therefore can be improved.

(8) According to the semiconductor integrated circuit device of the present invention which has a buried interconnection in the interconnection layer over the semiconductor substrate, by constituting a wiring material, at the place where the buried interconnection and semiconductor substrate are brought into contact, from tungsten, tungsten alloy, aluminum or aluminum alloy and constituting a buried interconnection in an interconnection layer over the above-described one from copper or copper alloy, it becomes possible to prevent the diffusion of Cu atoms toward the semiconductor substrate, thereby avoiding device failure attributable to this diffusion, while maintaining a good buried condition of the conductor film in the connecting hole, and at the same time to reduce the whole interconnection resistance of the semiconductor integrated circuit device, thereby improving the propagation rate of signals.

(9) According to the semiconductor integrated circuit device of the present invention which has a buried interconnection in the interconnection layer over the semiconductor substrate, it becomes possible to follow the conventional fabrication technique such as wire bonding technique or forming technique of a bump electrode, by forming the uppermost interconnection layer from aluminum or aluminum alloy and a buried interconnection in the interconnection layer, which is disposed below the uppermost interconnection layer, from copper or copper alloy. It therefore becomes possible to easily introduce into the fabrication process a semiconductor integrated circuit device having a copper base conductor material.

(10) According to the semiconductor integrated circuit device of the present invention, when an interconnection made of aluminum or aluminum alloy is connected with an interconnection made of copper and copper alloy, it becomes possible to prevent the formation of an alloy film having a high specific resistance at the place where an aluminum base conductor material is brought into direct contact with a copper base conductor material, by disposing a plug as a barrier conductor film at their joint, whereby the connection resistance between interconnection layers can be reduced.

(11) Advantages as described above in (8) to (10) make it possible to introduce a buried interconnection composed of a copper base conductor material into the whole structure of the semiconductor integrated circuit device without causing any inconvenience.

(12) According to the semiconductor integrated circuit device of the present invention, it becomes possible to make a connecting groove relatively large, which groove forms a connection conductor portion for relay, and therefore bury a conductor film favorably in the connecting groove, because at least the length of the connecting conductor portion for relay in the interconnection extending direction of a predetermined buried interconnection is formed longer than the length of the connecting hole in the interconnection extending direction. Accordingly, the reliability of the electrical connection between the upper and lower interconnections can be improved and the yield and reliability of the semiconductor integrated circuit device can therefore be improved.

What is claimed is:

1. A semiconductor integrated circuit device, comprising:
a first insulating film formed over a semiconductor substrate;
a first interconnection serving as a wiring line, buried in a surface of said first insulating film and including a first conductor film and a second conductor film having copper as a main component, wherein said first conductor film is interposed between said second conductor film and said first insulating film and includes a function to suppress diffusion of copper;

a second insulating film formed over said first interconnection, said second insulating film including a function to suppress diffusion of copper;

a third insulating film formed over said second insulating film;

a second interconnection serving as a wiring line, including aluminum as a main component and formed over said third insulating film; and a connecting conductor buried in said second insulating film and third insulating film, wherein said connecting conductor is contacting said first interconnection and said second interconnection and includes a function to suppress diffusion of copper, and wherein said second interconnection includes a wiring line and an electrode extending portion which is electrically connected to a pad portion and has a width larger than that of said wiring line.

2. A semiconductor integrated circuit device according to claim 1, wherein said second insulating film comprises a nitride film.

3. A semiconductor integrated circuit device according to claim 1, wherein said first conductor film has a thickness smaller than that of said second conductor film.

4. A semiconductor integrated circuit device according to claim 1, wherein said first conductor film is comprised of one selected from the group consisting of tungsten, titanium nitride, titanium, tantalum, tungsten nitride, tantalum nitride, tungsten silicide nitride, titanium silicide nitride and tantalum silicide nitride.

5. A semiconductor integrated circuit device according to claim 1, wherein said connecting conductor is comprised of one selected from the group consisting of tungsten, titanium nitride, titanium, tantalum, tungsten nitride, tantalum nitride, tungsten silicide nitride, titanium silicide nitride and tantalum silicide nitride.

6. A semiconductor integrated circuit deice according to claim 1, further comprising a passivation film over said second interconnection.

7. A semiconductor integrated circuit device according to claim 6, wherein said electrode extending portion includes said pad portion and is electrically connected with a bonding wire via an opening formed in said passivation film.

8. A semiconductor integrated circuit device according to claim 6, wherein said electrode extending portion includes said pad portion and is electrically connected with a bump electrode via an opening formed in said passivation film.

9. A semiconductor integrated circuit device according to claim 1, wherein said second interconnection includes a third conductor film and a fourth conductor film having said aluminum as a main component, wherein said third conductor film is formed between said third insulating film and said fourth conductor film and includes a high-melting point metal, and wherein said third conductor film is formed between said fourth conductor film and said connecting conductor.

10. A semiconductor integrated circuit device according to claim 9, wherein said second interconnection further includes a barrier metal layer formed on said fourth conductor film such that said fourth conductor film is sandwiched between said barrier metal layer and said third conductor film.

11. A semiconductor integrated circuit device according to claim 9, wherein said electrode extending portion includes said pad portion electrically connected with a bonding wire or a bump electrode.

12. A semiconductor integrated circuit device according to claim 1, further comprising:

a fourth insulating film formed over said second interconnection; and a third interconnection serving as said pad portion, formed over said fourth insulating film and including aluminum as a main component, wherein said pad portion is electrically connected to a bonding wire or a bump electrode, and wherein said third interconnection is electrically connected with said electrode extending portion through an opening formed in said fourth insulating film.

13. A semiconductor integrated circuit device according to claim 1, wherein said second interconnection is formed of a conductive film patterned to provide said wiring line, said electrode extending portion and said pad portion.

14. A semiconductor integrated circuit device according to claim 13, wherein said first interconnection is buried in a groove of said first insulating film by using a polishing method.

15. A semiconductor integrated circuit device, comprising:

a first insulating film formed over a semiconductor substrate;

a first interconnection serving as a wiring line, including copper as a main component and buried in a surface of said first insulating film;

a second insulating film formed over said first interconnection;

a second interconnection serving as a wiring line, including aluminum as a main component and formed over said second insulating film; and a connecting conductor buried in said second insulating film and electrically connecting said first interconnection and said second interconnection, wherein said first interconnection is covered with a barrier layer to suppress diffusion of copper, and wherein said second interconnection is formed by patterning a layer to include a wiring line and an electrode extending portion which is electrically connected to a pad portion and has a width larger than that of said wiring line.

16. A semiconductor integrated circuit device according to claim 15, wherein said barrier layer comprises a first barrier film interposed between said first insulating film and said first interconnection and a second barrier film interposed between said first interconnection and said second insulating film.

17. A semiconductor integrated circuit device according to claim 16, wherein said first barrier film is comprised of one selected from the group consisting of tungsten, titanium nitride, titanium, tantalum, tungsten nitride, tantalum nitride, tungsten silicide nitride, titanium silicide nitride and tantalum silicide nitride.

18. A semiconductor integrated circuit device according to claim 16, wherein said second barrier layer is comprised of a silicon nitride film.

19. A semiconductor integrated circuit device according to claim 16, wherein said connecting conductor includes a function to suppress diffusion of copper.

20. A semiconductor integrated circuit device according to claim 19, wherein said connecting conductor is comprised of one selected from the group consisting of tungsten, titanium nitride, titanium, tantalum, tungsten nitride, tantalum nitride, tungsten silicide nitride, titanium silicide nitride and tantalum silicide nitride.

21. A semiconductor integrated circuit device according to claim 15, further comprising a passivation film over said second interconnection.

22. A semiconductor integrated circuit device according to claim 21, wherein said electrode extending portion includes said pad portion and is electrically connected with a bonding wire via an opening formed in said passivation film.

23. A semiconductor integrated circuit device according to claim 21, wherein said electrode extending portion includes said pad portion and is electrically connected with a bump electrode via an opening formed in said passivation film.

24. A semiconductor integrated circuit device according to claim 15,
    wherein said second interconnection includes a first conductor film and a second conductor film having said aluminum as a main component,
    wherein said first conductor film is formed between said second insulating film and said second conductor film and includes a high-melting point metal, and
    wherein said first conductor film is formed between said second conductor film and said connecting conductor.

25. A semiconductor integrated circuit device according to claim 24, wherein said second interconnection further includes a barrier metal layer formed on said second conductor film such that said second conductor film is sandwiched between said barrier metal layer and said first conductor film.

26. A semiconductor integrated circuit device according to claim 24, wherein said electrode extending portion includes said pad portion electrically connected with a bonding wire or a bump electrode.

27. A semiconductor integrated circuit device according to claim 15,
    wherein said second interconnection includes a first conductor film and a second conductor film having said aluminum as a main component,
    wherein said first conductor film is formed between said second insulating film and said second conductor film and includes a high-melting point metal,
    wherein said first conductor film is integrally formed with said connecting conductor, and
    wherein said first conductor film and said connecting conductor serve as a barrier layer.

28. A semiconductor integrated circuit device according to claim 27, wherein said second interconnection includes a pad portion for electrically connecting to a bonding wire or a bump electrode.

29. A semiconductor integrated circuit device according to claim 16, wherein said second barrier film is comprised of a cap conductive layer including a function to suppress diffusion of copper.

30. A semiconductor integrated circuit device according to claim 15, further comprising:
    a third insulating film formed over said second interconnection; and
    a third interconnection serving as said pad portion, formed over said third insulating film and including aluminum as a main component,
    wherein said pad portion is electrically connected to a bonding wire or a bump electrode, and
    wherein said third interconnection is electrically connected with said electrode extending portion through an opening formed in said third insulating film.

31. A semiconductor integrated circuit device according to claim 15, wherein said second interconnection is formed of a conductive film patterned to provide said wiring line, said electrode extending portion and said pad portion.

32. A semiconductor integrated circuit device according to claim 31, wherein said first interconnection is buried in a groove of said first insulating film by using a polishing method.

33. A semiconductor integrated circuit device comprising:
    a first interlayer insulating film formed over a semiconductor substrate and having a first groove;
    a first interconnection serving as a wiring line, formed in said first groove and including a first conductor film and a first barrier film,
    wherein said first conductor film includes copper as main component, and
    wherein said first barrier film is interposed between said first conductor film and said first interlayer insulating film and includes a function to suppress diffusion of copper;
    a second barrier film formed over said first interconnection and including a function to suppress diffusion of copper;
    a second interlayer insulating film formed over said second barrier film and said first interlayer insulating film;
    a second interconnection serving as a wiring line, formed over said second interlayer insulating film and including aluminum as a main component,
    wherein said second interconnection is formed by patterning a layer to include a wiring line and a bonding pad portion which has a width larger than that of said wiring line, and
    wherein a connecting conductor is buried in said second interlayer insulating film and electrically connects said first interconnection and said second interconnection; and
    a surface passivation film formed over said second interconnection.

34. A semiconductor integrated circuit device according to claim 33, wherein said second interconnection is electrically connected to said first interconnection through a second conductor film including a function to suppress diffusion of copper.

35. A semiconductor integrated circuit device according to claim 34, wherein said bonding pad portion is electrically connected to a bonding wire.

36. A semiconductor integrated circuit device according to claim 34, wherein said bonding pad portion is electrically connected to a bump electrode.

37. A semiconductor integrated circuit device according to claim 33,
    wherein said second interconnection includes a first conductor film and a second conductor film having said aluminum as a main component,
    wherein said first conductor film is formed between said second interlayer insulating film and said second conductor film and includes a high-melting point metal, and
    wherein said first conductor film is formed between said second conductor film and said connecting conductor.

38. A semiconductor integrated circuit device according to claim 37, wherein said second interconnection further includes a barrier metal layer formed on said second conductor film such that said second conductor film is sandwiched between said barrier metal layer and said first conductor film.

39. A semiconductor integrated circuit device according to claim 33,
wherein said second interconnection includes a first conductor film and a second conductor film having said aluminum as a main component,
wherein said first conductor film is formed between said second interlayer insulating film and said second conductor film and includes a high-melting point metal,
wherein said first conductor film is integrally formed with said connecting conductor, and
wherein said first conductor film and said connecting conductor serve as a barrier layer.

40. A semiconductor integrated circuit device according to claim 33, wherein said second barrier film is comprised of a cap conductive layer including a function to suppress diffusion of copper.

41. A semiconductor integrated circuit device according to claim 33, wherein said second interconnection is formed of a conductive film patterned to provide said wiring line, an electrode extending portion and said bonding pad portion.

42. A semiconductor integrated circuit device according to claim 41, wherein said first interconnection is buried in said groove by using a polishing method.

43. A semiconductor integrated circuit device comprising:
a first insulating film formed over a semiconductor substrate and having a groove;
a first interconnection serving as a wiring line, buried in said groove by using a polishing method and including a first conductor film and a first barrier film,
wherein said first conductor film includes copper as main component, and
wherein said first barrier film is interposed between said first conductor film and said first insulating film and includes a function to suppress diffusion of copper;
a second barrier film formed over said first interconnection and including a function to suppress diffusion of copper;
a second insulating film formed over said second barrier film and said first insulating film; and
a second interconnection serving as a wiring line, formed over said second insulating film and including aluminum as a main component,
wherein said second interconnection includes a pad portion for electrically connecting to a bonding wire or a bump electrode and is electrically connected to said first interconnection through a barrier metal,
wherein said second interconnection is formed by patterning a conductive film to provide said wiring line thereof, an electrode extending portion and said pad portion, and
wherein said pad portion has a width larger than that of said wiring line of said second interconnection.

44. A semiconductor integrated circuit device according to claim 43, wherein said pad portion is electrically connected to a bonding wire.

45. A semiconductor integrated circuit device according to claim 43, wherein said pad portion is electrically connected to a bump electrode.

46. A semiconductor integrated circuit device according to claim 43, wherein said second interconnection is electrically connected to said first interconnection through an opening formed in said second insulating film.

47. A semiconductor integrated circuit device according to claim 43,
wherein said second interconnection includes a second conductor film and a third conductor film having said aluminum as a main component,
wherein said second conductor film is formed between said second insulating film and said third conductor film and includes a high-melting point metal, and
wherein said second conductor film is formed between said third conductor film and said barrier metal.

48. A semiconductor integrated circuit device according to claim 47, wherein said second interconnection further includes a barrier metal layer formed on said third conductor film such that said third conductor film is sandwiched between said barrier metal layer and said second conductor film.

49. A semiconductor integrated circuit device according to claim 43,
wherein said second interconnection includes a second conductor film and a third conductor film having said aluminum as a main component,
wherein said second conductor film is formed between said second insulating film and said third conductor film and includes a high-melting point metal, and
wherein said second conductor film is integrally formed with said barrier metal.

50. A semiconductor integrated circuit device according to claim 43, wherein said second barrier film is comprised of a cap conductive layer including a function to suppress diffusion of copper.

* * * * *